United States Patent [19]
Maeda et al.

[11] Patent Number: 5,627,390
[45] Date of Patent: May 6, 1997

[54] SEMICONDUCTOR DEVICE WITH COLUMNS

[75] Inventors: Shigenobu Maeda; Yasuo Inoue; Hirotada Kuriyama; Shigeto Maegawa; Kyozo Kanamoto; Toshiaki Iwamatsu, all of Hyogo, Japan

[73] Assignee: Mitsubishi Denki Kabushiki Kaisha, Tokyo, Japan

[21] Appl. No.: 648,828

[22] Filed: May 16, 1996

Related U.S. Application Data

[63] Continuation of Ser. No. 313,472, Sep. 27, 1994, abandoned.

[30] Foreign Application Priority Data

May 26, 1994 [JP] Japan .................... 6-112997

[51] Int. Cl.$^6$ .................... H01L 27/108; H01L 29/76; H01L 29/94; H01L 31/119
[52] U.S. Cl. .................... 257/302; 257/306; 257/329
[58] Field of Search .................... 257/306, 302, 257/329, 298, 401

[56] References Cited

U.S. PATENT DOCUMENTS

| | | | |
|---|---|---|---|
| 4,630,088 | 12/1986 | Ogura et al. | 357/23.6 |
| 4,974,060 | 11/1990 | Ogasawara | 257/296 |
| 5,001,296 | 3/1991 | Gotou | 257/302 |
| 5,136,350 | 8/1992 | Itoh | 357/23.4 |
| 5,214,296 | 5/1993 | Nakata et al. | 257/71 |
| 5,243,209 | 9/1993 | Ishii | 257/263 |
| 5,281,837 | 1/1994 | Kohyama | 257/296 |
| 5,414,289 | 5/1995 | Fitch et al. | 257/328 |

FOREIGN PATENT DOCUMENTS

| | | |
|---|---|---|
| 4418352 | 11/1995 | Germany . |
| 63-211750 | 9/1988 | Japan . |
| 1-282859 | 11/1989 | Japan . |
| 2-159058 | 6/1990 | Japan . |
| 2-198170 | 8/1990 | Japan . |
| 3-114233 | 5/1991 | Japan . |
| 4-176168 | 6/1992 | Japan . |
| 4-282865 | 10/1992 | Japan . |
| 5-29573 | 2/1993 | Japan . |
| 5-160408 | 6/1993 | Japan . |
| 5-345126 | 12/1993 | Japan . |

OTHER PUBLICATIONS

"A Surrounding Gate Transistor (SGT) Cell for 64/256 MBIT DRAMS", K. Sunouchi et al., IEDM 89-23, pp. 23-26, 1989.

*Primary Examiner*—William Mintel
*Attorney, Agent, or Firm*—Lowe, Price, LeBlanc & Becker

[57] ABSTRACT

A first impurity diffusion layer forms one of source/drain regions and also forms a bit line. A first semiconductor layer, a channel semiconductor layer and a second semiconductor layer, which forms the other of source/drain regions and also forms a storage node, are disposed on the first impurity diffusion layer. A capacitor insulating film is disposed on a second conductive layer. A cell plate is disposed on a storage node with the capacitor insulating film therebetween. A capacitance of the bit line is reduced, and a dynamic random access memory thus constructed performs a high-speed operation.

8 Claims, 96 Drawing Sheets

WL VφT BL  PIXEL ELECTRODE

SEMICONDUCTOR DEVICE WITH COLUMNS

This application is a continuation of application Ser. No. 08/313,472 filed Sep. 27, 1994, now abandoned..

BACKGROUND OF THE INVENTION

1. Field of the Invention

The present invention relates in general to a semiconductor device, and in particular to a semiconductor device utilizing a vertical surround gate MOSFET (will be referred to as a "VΦT" hereinafter). The invention also relates to a method of manufacturing such a semiconductor device. The invention further relates to an improvement of VΦT.

2. Description of the Background Art

FIG. 114 shows trend of cell sizes of dynamic random access memories (DRAMs). FIG. 114 additionally shows design rules in respective generations. Conventional DRAM cells include, as components, bit lines (BL), word lines (WL), bit line contacts (BK), and storage contacts (SK). Therefore, the cell size, which is expressed with F (feature size) of the following formula, is $8F^2$.

$$F \text{ (feature size)} = r + \alpha$$

wherein

F represents a gate width, r represents a minimum line width and α represents a process margin.

In FIG. 114, the design rule (minimum line width) is simply set to F, and $8F^2$ and $4F^2$ (hollow and solid circles) are plotted in a superimposed form. As can be seen therefrom, the cells of $8F^2$ can form 256M-DRAM at the most. Meanwhile, the cell size of $4F^2$ can achieve a DRAM of G-bit generation by following the conventional reduction rule.

The cells of $4F^2$ can be formed by arranging vertical transistors at crossings of the bit lines BL and word lines Wl. Based on the above background, various kinds of vertical transistors have been proposed.

FIG. 115 is a cross section of a first prior art, which is a vertical surround gate transistor disclosed in Japanese Patent Laying-Open No. 5-160408 (1993). Referring to FIG. 115, a gate 3 is formed around a column 5 of silicon forming a channel with a gate insulating film 4 therebetween. A source 6a and a drain 6b are connected to silicon column 5.

A significant problem arises in connection with formation of gate electrode 3 forming the word line if the above transistor is applied to a DRAM.

FIG. 116 is a cross section of a semiconductor device showing a process of manufacturing the surround gate transistor shown in FIG. 115. Gate insulating film 4 is formed to cover silicon column 5. Then, polysilicon (3) is deposited to cover silicon column 5 with gate insulating film 4 therebetween. Anisotropic etching is effected on polysilicon (3) to form gate electrode 3 on a side wall of silicon column 5. According to this method, a gate length 1 depends on an anisotropic etching rate of polysilicon (3). Therefore, a variation v of the gate length 1 is large. According to this method, therefore, it is very difficult to obtain stably the cells of $4F^2$.

FIGS. 117 and 118 are cross sections showing steps in a process of manufacturing a vertical surround gate transistor disclosed in Japanese Patent Laying-Open No. 4-282865 (1992).

Referring to FIG. 117, an $SiO_2$ layer 2a, polysilicon, i.e., word line 3 and an $SiO_2$ layer 2b are formed in this order on a bit line 26. There is also provided a contact hole 8 penetrating $SiO_2$ layer 2b, polysilicon 3 and $SiO_2$ layer 2a. Gate insulating film 4 is formed on the side wall of contact hole 8.

Referring to FIGS. 117 and 118, the side wall of contact hole 8 is covered with polysilicon 5. Polysilicon 5 is divided into a source 6a, a channel 7 and a drain 6b. The transistor thus constructed has the following problem. Referring to FIG. 117, variation v of etching quantity is liable to occur when forming gate insulating film 4, and in some cases, an upper corner 3c of the gate electrode is exposed, resulting in leak between corner 3c of the gate and drain 6b.

The transistor also has the following problem in connection with its operation.

The conductivity types of the gate polysilicon and channel polysilicon are opposite to each other, and a difference in their work function is utilized for depleting the channel polysilicon, whereby the off state is achieved between the source and drain. For this purpose, a film thickness of the channel polysilicon must be smaller than the maximum width of the depletion layer which depends on concentration of impurity in the channel polysilicon.

Meanwhile, if the resistance of source/drain is high, a sufficient on-current cannot be obtained. Therefore, it is necessary to increase the content of impurity in the channel polysilicon for lowering the resistance. In an ordinary TFT, the content of impurity in the source/drain is $10^{20}$ l/cm$^3$ at the most. However, if impurity were introduced at the large content of $10^{20}$/cm$^3$, the maximum width of depletion layer would be approximately 40 Å. Therefore, due to restriction that the film thickness of the channel polysilicon must be smaller than the above value, it would probably be impossible to achieve stable manufacturing of the transistors without sacrificing characteristics.

In order to overcome the above problems, the inventors and others have proposed a vertical Φ-shaped transistor (VΦT) as shown in FIG. 119 (Japanese Patent Laying-Open No. 5-345126 (1993)).

FIG. 119 is a perspective view showing a major portion of a VΦT. FIG. 120 is a cross section of the VΦT.

Referring to these figures, a MOSFET includes a substrate 1. Source region 6a is formed at a main surface of substrate 1. First interlayer insulating film 2a is formed on substrate 1. Gate electrode 3, which has a top surface substantially parallel to the surface of substrate, is formed on first interlayer insulating film 2a. Second interlayer insulating film 2b covering gate electrode 3 is formed on first interlayer insulating film 2a. A surface of source region 6a is partially exposed through a contact hole 19 which penetrates first interlayer insulating film 2a, gate electrode 3 and second interlayer insulating film 2b. Gate insulating film 4 covers the side wall of contact hole 19. In contact hole 19, there is formed a first semiconductor layer 20 of a P-type, which is in contact with a surface 9 of source region 6a and extends from the surface of source region 6a to the same level as a lower surface of gate electrode 3. In contact hole 19, there is also formed a channel semiconductor layer 7, which is in contact with a surface of first semiconductor layer 20 and extends from the surface of first semiconductor layer 20 to the same level as an upper surface of gate electrode 3. A second semiconductor layer 5 of the P-type, which is in contact with the surface of channel semiconductor layer 7 and forms drain region 6b, is formed on channel semiconductor layer 7.

A third interlayer insulating film 2c covering drain region 6b is formed on the substrate. Third interlayer insulating film 2c is provided with a connection hole 11a exposing a portion of the surface of drain region 6b. An aluminum electrode 10a is connected to drain region 6b through connection hole 11a.

Although the structure shown in FIGS. 119 and 120 can overcome the problems of the technique shown in FIGS. 115 and 117, the capacitance of a bit line can not be reduced below a restricted extent.

SUMMARY OF THE INVENTION

Accordingly, it is an object of the invention to provide a semiconductor device which includes a bit line having a reduced capacitance, improved to enable high-speed operation and utilizes a VΦT.

Another object of the invention is to provide a DRAM of a G-bit generation.

Still another object of the invention is to provide a DRAM having a cell size of $4F^2$.

Yet another object of the invention is to provide a method of manufacturing such a DRAM.

Further another object of the invention is to improve the VΦT described above.

Also, an object of the invention to provide an AND circuit using a VΦT.

A further object of the invention to provide an OR circuit using a VΦT.

A further object of the invention to provide an inverter circuit using a VΦT.

A further object of the invention to provide a flip-flop using a VΦT.

A further object of the invention to provide a gain cell using a VΦT.

A further object of the invention to provide a matrix of a liquid crystal display using a VΦT.

A first aspect of the invention relates to a semiconductor device, in which a gate transistor is operable to store information in a capacitor formed of a storage node, which is arranged at a crossing between a bit line and a word line, a capacitor insulating film and a cell plate electrode. The semiconductor device includes a substrate on which a dielectric layer and a semiconductor layer are formed successively. A first impurity diffusion layer of a second conductivity type is disposed in the semiconductor layer. The first impurity diffusion layer contains impurity of the first conductivity type implanted thereinto, and forms one of source/drain regions and the bit line. A first interlayer insulating film covering the first impurity diffusion layer is disposed on the substrate. A gate electrode which also forms the word line and has upper and lower surfaces is disposed on the first interlayer insulating film. A second interlayer insulating film covering the gate electrode is disposed on the first interlayer insulating film. A contact hole penetrating the first interlayer insulating film, the gate electrode and the second interlayer insulating film is provided for exposing a portion of a surface of the first impurity diffusion layer. A side wall of the contact hole is covered with a gate insulating film. A first semiconductor layer of the first conductivity type is formed in the contact hole. The first semiconductor layer is in contact with the surface of the first impurity diffusion layer and extends from the surface of the first impurity diffusion layer to the substantially same level as the lower surface of the gate electrode. A channel semiconductor layer is formed in the contact hole. The channel semiconductor layer is in contact with the surface of the first semiconductor layer and extends from the surface of the first semiconductor layer to the substantially same level as the upper surface of the gate electrode. A second conductive layer of the first conductivity type is disposed on the channel semiconductor layer. The second conductive layer is in contact with a surface of the channel semiconductor layer, and forms the storage node and the other of the source/drain regions. A capacitor insulating film is disposed on the second conductive layer.

A second aspect of the invention relates to a semiconductor device in which contact is to be made at a deep position. The device of this aspect includes a substrate on which a dielectric layer and a semiconductor layer are formed successively. A first impurity diffusion layer of a first conductivity type is disposed in the semiconductor layer. The first impurity diffusion layer forms a bit line and one of source/drain regions. A first interlayer insulating film covering the first impurity diffusion layer is disposed on the substrate. A gate electrode which also forms the word line and has upper and lower surfaces is disposed on the first interlayer insulating film. A second interlayer insulating film covering the gate electrode is disposed on the first interlayer insulating film. A contact hole penetrating the first interlayer insulating film, the gate electrode and the second interlayer insulating film is provided for exposing a portion of a surface of the first impurity diffusion layer. A side wall of the contact hole is covered with a gate insulating film. A first semiconductor layer of the first conductivity type is formed in the contact hole. The first semiconductor layer is in contact with the surface of the first impurity diffusion layer and extends from the surface of the first impurity diffusion layer to the substantially same level as the lower surface of the gate electrode. A second semiconductor layer of the same first conductivity type as the first semiconductor layer is formed in the contact hole. The second semiconductor layer is in contact with a surface of the first semiconductor layer and extends from the surface of the first semiconductor layer to the substantially same level as the upper surface of the gate electrode. A third semiconductor layer of the first conductivity type is formed in the contact hole and is disposed on the second semiconductor layer. The third semiconductor layer is in contact with a surface of the second semiconductor layer. An interconnection is connected to the third semiconductor layer.

A third aspect of the invention relates to a semiconductor device, in which a gate transistor is operable to store information in a capacitor formed of a storage node, which is arranged at a crossing between a bit line and a word line, a capacitor insulating film and a cell plate electrode. The device of this aspect includes a bit line having upper and lower surfaces. A first vertical Φ-shaped transistor is disposed on the upper surface of the bit line. A capacitor is connected to the first vertical Φ-shaped transistor. A second vertical Φ-shaped transistor is disposed on the lower surface of the bit line. A second capacitor is connected to the second vertical Φ-shaped transistor.

A fourth aspect of the invention relates to a semiconductor device in which flow of a large number of carriers is controlled by a voltage applied to a gate. The semiconductor device of this aspect includes a substrate having a main surface. A first conductive layer of a first conductivity type forming one of source/drain regions is disposed at the main surface of the substrate. A first interlayer insulating film is disposed on the substrate. A gate electrode having upper and lower surfaces is disposed on the first interlayer insulating film. A second interlayer insulating film covering the gate electrode is disposed on the first interlayer insulating film. A contact hole penetrating the first interlayer insulating film, the gate electrode and the second interlayer insulating film is provided for exposing a portion of a surface of the first conductive layer. A side wall of the contact hole is covered with a first gate insulating film. The semiconductor device further includes a silicon thin film which is in contact with the first conductive layer and continuously extends to cover an inner wall of the contact hole with the first gate insulating film therebetween. The silicon thin film has a concave portion, which located in the contact hole and has a bottom surface located at a level lower than the lower surface of the first gate electrode. The silicon thin film is formed of three portions which are a cylindrical channel portion surrounded by the first gate electrode as well as a source region and a drain region located at vertically opposite sides of the channel portion. The device further includes a silicon oxide film which is disposed in the concave portion of the silicon thin film and is located at a level lower than an upper end of the channel portion. The concave portion of the silicon thin film is filled with polysilicon which is in contact with the channel portion. In this semiconductor device, the polysilicon is used as a lead electrode for fixing the potential of the channel portion.

A fifth aspect of the invention relates to a semiconductor device in which flow of a large number of carriers is controlled by a voltage applied to a gate. The semiconductor device of this aspect includes a substrate having a main surface. A first conductive layer of a first conductivity type forming one of source/drain regions is disposed at the main surface of the substrate. A first interlayer insulating film is disposed on the substrate. A gate electrode is disposed on the first interlayer insulating film. A second interlayer insulating film covering the gate electrode is disposed on the first interlayer insulating film. A contact hole penetrating the first interlayer insulating film, the gate electrode and the second interlayer insulating film is provided for exposing a portion of a surface of the first conductive layer. A side wall of the contact hole is covered with a conductive member. A surface of the conductive member is covered with a gate insulating film. A first semiconductor layer of the first conductivity type is disposed in the contact hole and is in contact with the surface of the first conductive layer. A channel semiconductor layer is disposed in the contact hole and is in contact with a surface of the first semiconductor layer. A second semiconductor layer of the first conductivity type forming the other of the source/drain regions is disposed in the contact hole and is in contact with a surface of the channel semiconductor layer.

A sixth aspect of the invention relates to a semiconductor device including an OR circuit. The semiconductor device of this aspect includes a substrate having a main surface. A first conductive layer of a first conductivity type forming one of source/drain regions is disposed at the main surface of the substrate. A first interlayer insulating film is disposed on the substrate. A first gate electrode and a second gate electrode which adjoin to each other and each have an upper surface and a lower surface are disposed on the first interlayer insulating film. A second interlayer insulating film covering the first and second gate electrodes is disposed on the first interlayer insulating film. A contact hole, which spreads over the first and second gate electrodes, and penetrates the first interlayer insulating film, the first and second gate electrodes and the second interlayer insulating film, is provided for exposing a portion of a surface of the first conductive layer. A side wall of the contact hole is covered with a gate insulating film. A first semiconductor layer of a first conductivity type is formed in the contact hole. The first semiconductor layer is in contact with the surface of the first conductive layer and extends from the surface of the first conductive layer to the substantially same level as the lower surface of the gate electrode. A channel semiconductor layer is formed in the contact hole. The channel semiconductor layer is in contact with a surface of the first semiconductor layer and extends from a surface of the first semiconductor layer to the substantially same level as the upper surface of the gate electrode. A second semiconductor layer of the first conductivity type forming the other of the source/drain regions is disposed on the channel semiconductor layer and is in contact with the surface of the channel semiconductor layer.

A seventh aspect of the invention relates to a semiconductor device including an AND circuit. The semiconductor device of this aspect includes a substrate, a first conductive layer of a first conductivity type disposed on the substrate, and a first interlayer insulating film disposed on the substrate and covering the first conductive layer. A first gate electrode having an upper surface and a lower surface is disposed on the first interlayer insulating film. A second interlayer insulating film covering the first gate electrode is disposed on the first interlayer insulating film. A second gate electrode having an upper surface and a lower surface is disposed on the second interlayer insulating film. A third interlayer insulating film covering the second gate electrode is disposed on the second interlayer insulating film. A contact hole, which penetrates the first interlayer insulating film, the first gate electrode, the second interlayer insulating film, the second gate electrode and the third interlayer insulating film, is provided for exposing a portion of a surface of the first conductive layer. Side walls of the first and second gate electrodes exposed in the contact hole are covered with a gate insulating film. A first semiconductor layer of a first conductivity type is formed in the contact hole. The first semiconductor layer is in contact with a surface of the first conductive layer and extends from the surface of the first conductive layer to the substantially same level as the lower surface of the first gate electrode. A first channel semiconductor layer is formed in the contact hole. The first channel semiconductor layer is in contact with a surface of the first semiconductor layer and extends from the surface of the first semiconductor layer to the substantially same level as the upper surface of the first gate electrode. A second channel semiconductor layer of a second conductivity type is formed in the contact hole. The second channel semiconductor layer extends from the lower surface of the second gate electrode to the substantially same level as the upper surface of the second gate electrode. A second semiconductor layer of the first conductivity type forming the other of the source/drain regions is disposed on the second channel semiconductor layer and is in contact with a surface of the second channel semiconductor layer.

An eighth aspect of the invention relates to a semiconductor device including an inverter circuit. The semiconductor device of this aspect includes a first $n^{30}$-conductive layer. A first interlayer insulating film is disposed on the $n^+$-conductive layer. A first gate electrode having an upper surface and a lower surface is disposed on the first interlayer insulating film. A second interlayer insulating film covering the first gate electrode is disposed on the first interlayer insulating film. A first contact hole, which penetrates the first interlayer insulating film, the first gate electrode and the second interlayer insulating film, is provided for exposing a portion of a surface of the first $n^+$-conductive layer. A side wall of the first contact hole is covered with a first gate insulating film. A first $n^+$-semiconductor layer is formed in the first contact hole. The first $n^+$-semiconductor layer is in contact with a surface of the first $n^+$-conductive layer and extends from the surface of the first $n^+$-conductive layer to the substantially same level as the lower surface of the first gate electrode. A $p^-$-semiconductor layer is formed in the first contact hole. The $p^-$-semiconductor layer is in contact with a surface of the first $n^+$-semiconductor layer and extends from the surface of the first $n^+$-semiconductor layer to the substantially same level as the upper surface of the first gate electrode. A second $n^+$-semiconductor layer is formed in the first contact hole and is disposed on the $p^-$-semiconductor layer. The second $n^+$-semiconductor layer is in contact with a surface of the $p^-$-semiconductor layer and forms the other of the source/drain regions. A second $n^+$-conductive layer is disposed on the second interlayer insulating film and is in contact with the second $n^+$-conductive layer. A first $p^+$-conductive layer is disposed on the second $n^+$-conductive layer. A third interlayer insulating film is disposed on the first $p^+$-conductive layer. A second gate electrode is disposed on the third interlayer insulating film. A fourth interlayer insulating film covering the second gate electrode is disposed on the third interlayer insulating film. A second contact hole penetrating the fourth interlayer insulating film, the second gate electrode and the third interlayer insulating film is provided for exposing a portion of a surface of the first $p^+$-conductive layer. A side wall of the second contact hole is covered with a second gate insulating film. A first $p^+$-semiconductor layer is formed in the second contact hole. The first $p^+$-semiconductor layer is in contact with a surface of the first $p^+$-conductive layer and extends from the surface of the first $p^+$-conductive layer to the substantially same level as the lower surface of the second gate electrode. An $n^-$-semiconductor layer is formed in the contact hole. The $n^-$-semiconductor layer is in contact with the surface of the first $p^+$-semiconductor layer and extends from the surface of the first $p^+$-semiconductor layer to the substantially same level as the upper surface of the second gate electrode. A second $p^+$-semiconductor layer forming the other of the source/drain regions is disposed in the contact hole. The second $p^+$-semiconductor layer is disposed on the $n^-$-semiconductor layer and is in contact with the surface of the $n^-$-semiconductor layer. A second $p^+$-conductive layer is disposed on the fourth interlayer insulating film and is in contact with the second $p^+$-semiconductor layer.

A ninth aspect of the invention relates to a semiconductor device including a flip-flop circuit. The semiconductor device of this aspect includes a substrate and a first conductive layer of a first conductivity type disposed on the substrate. A first interlayer insulating film covering the first conductive layer is disposed on the substrate. A first gate electrode of the first conductivity type having an upper surface and a lower surface is disposed on the first interlayer insulating film. A second interlayer insulating film covering the first gate electrode is disposed on the first interlayer insulating film. A first contact hole, which penetrates the first interlayer insulating film, the first gate electrode and the second interlayer insulating film, is provided for exposing a portion of a surface of the first conductive layer. A side wall of the first contact hole is covered with a first gate insulating film. A first semiconductor layer of a first conductivity type is formed in the first contact hole. The first semiconductor layer is in contact with the surface of the first conductive layer and extends from the surface of the first conductive layer to the substantially same level as the lower surface of the first gate electrode. A first channel semiconductor layer of a second conductivity type is formed in the first contact hole. The first channel semiconductor layer is in contact with a surface of the first semiconductor layer and extends from the surface of the first semiconductor layer to the substantially same level as the upper surface of the first gate electrode. A second semiconductor layer of the first conductivity type forming the other of the source/drain regions is formed in the first contact hole. The second semiconductor layer is disposed on the first channel semiconductor layer and is in contact with the surface of the first channel semiconductor layer. A second gate electrode of the first conductivity type is disposed on the second interlayer insulating film and is in contact with the second semiconductor layer. A third interlayer insulating film covering the second gate electrode is disposed on the second interlayer insulating film. A second contact hole, which penetrates the third interlayer insulating film, the second gate electrode and the second interlayer insulating film, is provided for exposing a portion of a surface of the first gate electrode. A side wall of the second contact hole is covered with a second gate insulating film. A third semiconductor layer of the first conductivity type is formed in the second contact hole. The third semiconductor layer is in contact with the surface of the first gate electrode and extends from the surface of the first gate electrode to the substantially same level as a lower surface of the second gate electrode. A second channel semiconductor layer of the second conductivity type is formed in the second contact hole. The second channel semiconductor layer is in contact with a surface of the third semiconductor layer and extends from the surface of the third semiconductor layer to the substantially same level as an upper surface of the second gate electrode. A fourth semiconductor layer of the first conductivity type forming the other of the source/drain regions is formed in the second contact hole. The fourth semiconductor layer is disposed on the second channel semiconductor layer and is in contact with the surface of the second channel semiconductor layer. A second conductive layer of the first conductivity type is disposed on the third interlayer insulating film and is connected to the fourth semiconductor layer.

A tenth aspect of the invention relates to a semiconductor device including a gain cell. The semiconductor device of this aspect includes a substrate, and a first gate electrode of a second conductivity type disposed on the substrate. Source/drain regions of a first conductivity type are disposed at a main surface of the substrate and are located at opposite sides of the first gate electrode. A first interlayer insulating film covering the first gate electrode is disposed on the substrate. A second gate electrode is formed on the first interlayer insulating film. A second interlayer insulating film covering the second gate electrode is formed on the first interlayer insulating film. A contact hole, which penetrates the second gate electrode and the first interlayer insulating film, is provided for exposing a portion of a surface of the first gate electrode. A side wall of the contact hole is covered with a gate insulating film. A first semiconductor layer of a second conductivity type is formed in the contact hole. The first semiconductor layer is in contact with the surface of the first gate electrode and extends from the surface of the first gate electrode to the substantially same level as a lower surface of the second gate electrode. A channel semiconductor layer of the first conductivity type is formed in the contact hole. The first channel semiconductor layer is in contact with a surface of the first semiconductor layer and extends from the surface of the first semiconductor layer to the substantially same level as the upper surface of the second gate electrode. A third semiconductor layer of the second conductivity type forming the other of the source/drain regions is formed in the contact hole. The third semiconductor layer is disposed on the channel semiconductor layer and is in contact with the surface of the channel semiconductor layer. A conductive layer of the second conductivity type is formed on the second interlayer insulating film and is in contact with the third semiconductor layer.

An eleventh aspect of the invention relates to a semiconductor device including a matrix of a liquid crystal display. The semiconductor device of this aspect includes a first conductive layer of a first conductivity type which is disposed on a substrate and forms one of source/drain regions. A first interlayer insulating film is disposed on the substrate. A gate electrode having an upper surface and a lower surface is disposed on the first interlayer insulating film. A second interlayer insulating film covering the gate electrode is formed on the first interlayer insulating film. A contact hole, which penetrates the first interlayer insulating film, the gate electrode and the second interlayer insulating film, is provided for exposing a portion of a surface of the first conductive layer. A side wall of the contact hole is covered with a gate insulating film. A first semiconductor layer of a first conductivity type is formed in the contact hole. The first semiconductor layer is in contact with the surface of the first conductive layer and extends from the surface of the first conductive layer to the substantially same level as the lower surface of the gate electrode. A channel semiconductor layer is formed in the contact hole. The channel semiconductor layer is in contact with a surface of the first semiconductor layer and extends from the surface of the first semiconductor layer to the substantially same level as the upper surface of the gate electrode. A second semiconductor layer of the first conductivity type forming the other of the source/drain regions is formed in the contact hole. The second semiconductor layer is disposed on the channel semiconductor layer and is in contact with a surface of the channel semiconductor layer. A pixel electrode is connected to the second semiconductor layer.

A twelfth aspect of the invention relates to a method of manufacturing a semiconductor device in which a gate transistor is operable to store information in a capacitor formed of a storage node, which is arranged at a crossing between a bit line and a word line, a capacitor insulating film and a cell plate electrode. The method includes the step of preparing a substrate on which a dielectric member and a semiconductor layer are formed successively. A first conductive layer containing impurity of a first conductivity type is formed at a surface of the semiconductor layer. The first conductive layer forms one of source/drain regions and also forms the bit line. A first interlayer insulating film is formed on the substrate. A gate electrode, which forms the word line and has upper and lower surfaces, is formed on the first interlayer insulating film. A second interlayer insulating film is formed on the substrate to cover the gate electrode. A contact hole is formed. The contact hole penetrates the first interlayer insulating film, the gate electrode and the second interlayer insulating film, and reaches a surface of the first conductive layer. A side wall of the contact hole is covered with a gate insulating film. A second semiconductor layer is formed on the substrate. The second semiconductor layer is in contact with the surface of the first conductive layer, and fills the contact hole. Impurity of the first conductivity type is implanted into a surface of the second semiconductor layer. The impurity implanted into the surface of the second semiconductor layer is diffused into the second semiconductor layer, and the impurity contained in the first conductive layer is diffused from the first conductive layer into the second semiconductor layer, whereby a region, which forms the other of the source/drain regions and also forms the storage node, and a channel region, which is located between the other of the source/drain regions and the one of the source/drain regions, are formed at the second semiconductor layer. A capacitor insulating film is formed on the other of the source/drain regions. A cell plate is formed on the storage node with the capacitor insulating film therebetween.

According to the semiconductor device of the first aspect of the invention, since the semiconductor layer formed on the dielectric layer is used as the bit line, the capacitance of the bit line is reduced and a dynamic random access memory can operate at a high speed.

According to the semiconductor device of the second aspect of the invention, since the dummy VΦT is used, contact of the aluminum interconnection can be made easily.

According to the semiconductor device of the third aspect of the invention, since the bit line is commonly used by the upper and lower VΦT-DRAMs, the bit line can be formed only by one step, so that the number of manufacturing steps and thus a manufacturing cost can be reduce.

According to the semiconductor device of the fourth aspect of the invention, since the polysilicon, which fills the concave portion of the silicon thin film and is in contact with the channel portion, is used as the lead electrode, the potential of the channel portion can be fixed.

According to the semiconductor device of the fifth aspect of the invention, since there is provided the conductive member covering the side wall of the contact hole, it is possible to form a VΦT having a body of which a diameter is smaller than a minimum hole diameter attainable with a lithography technique. As a result, the body can be depleted completely.

According to the semiconductor device of the sixth aspect of the invention including the OR circuit, since the contact hole of the VΦT spreads over two gates, the circuit can be formed within a very small area.

According to the semiconductor device of the seventh aspect of the invention including the AND circuit, since the VΦT is used as a component of the AND circuit, the area occupied by the device can be small.

According to the semiconductor device of the eighth aspect of the invention including the inverter circuit, since the VΦT is used, the occupied area can be small.

According to the semiconductor device of the ninth aspect of the invention including the flip-flop circuit, since the VΦT is used, the occupied area can be small.

According to the semiconductor device of the tenth aspect of the invention including the gain cell, since the VΦT is used, the occupied area can be small.

According to the semiconductor device of the eleventh aspect of the invention including the matrix of the liquid crystal, since the VΦT is used, the occupied area can be small.

According to the method of manufacturing the semiconductor device of the twelfth aspect of the invention, since the semiconductor layer formed on the dielectric member is used as the bit line, the capacitance of the bit line can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
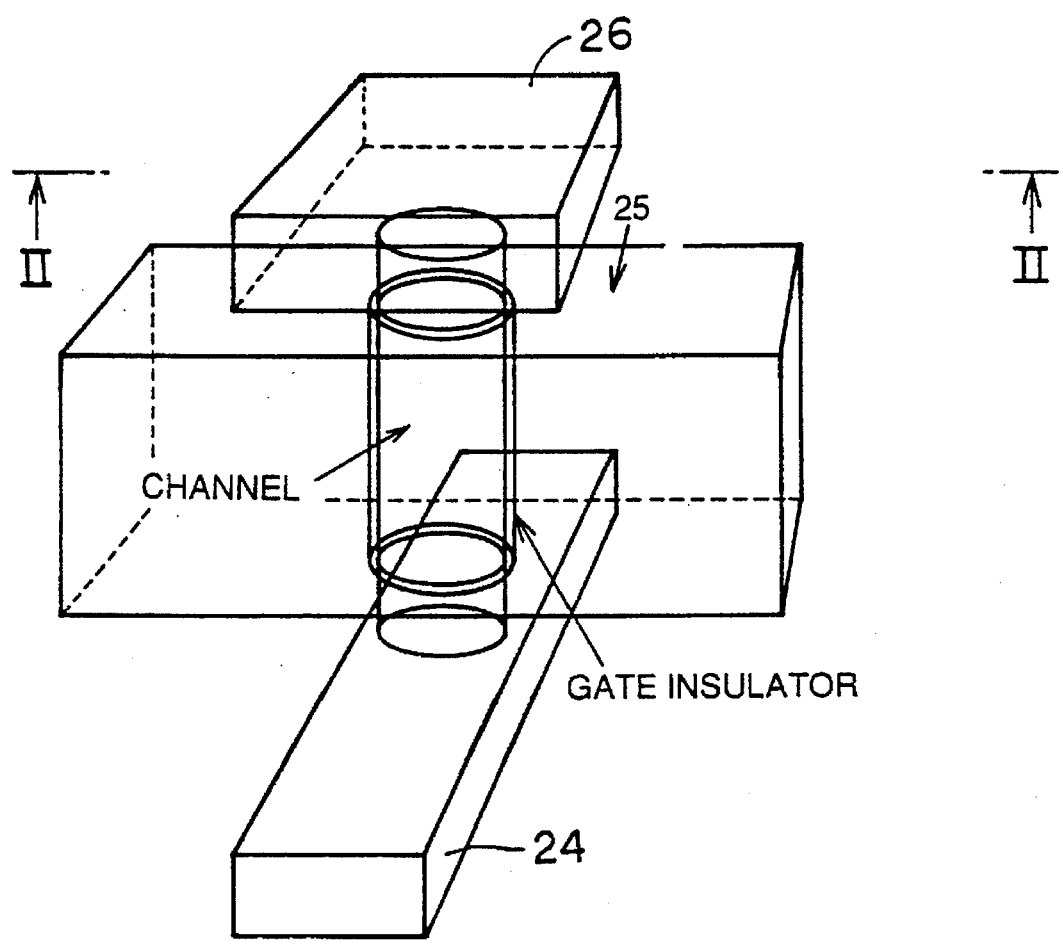
FIG. 1 is a perspective view of a VΦT of an embodiment 1 of the invention.
Figure 2:
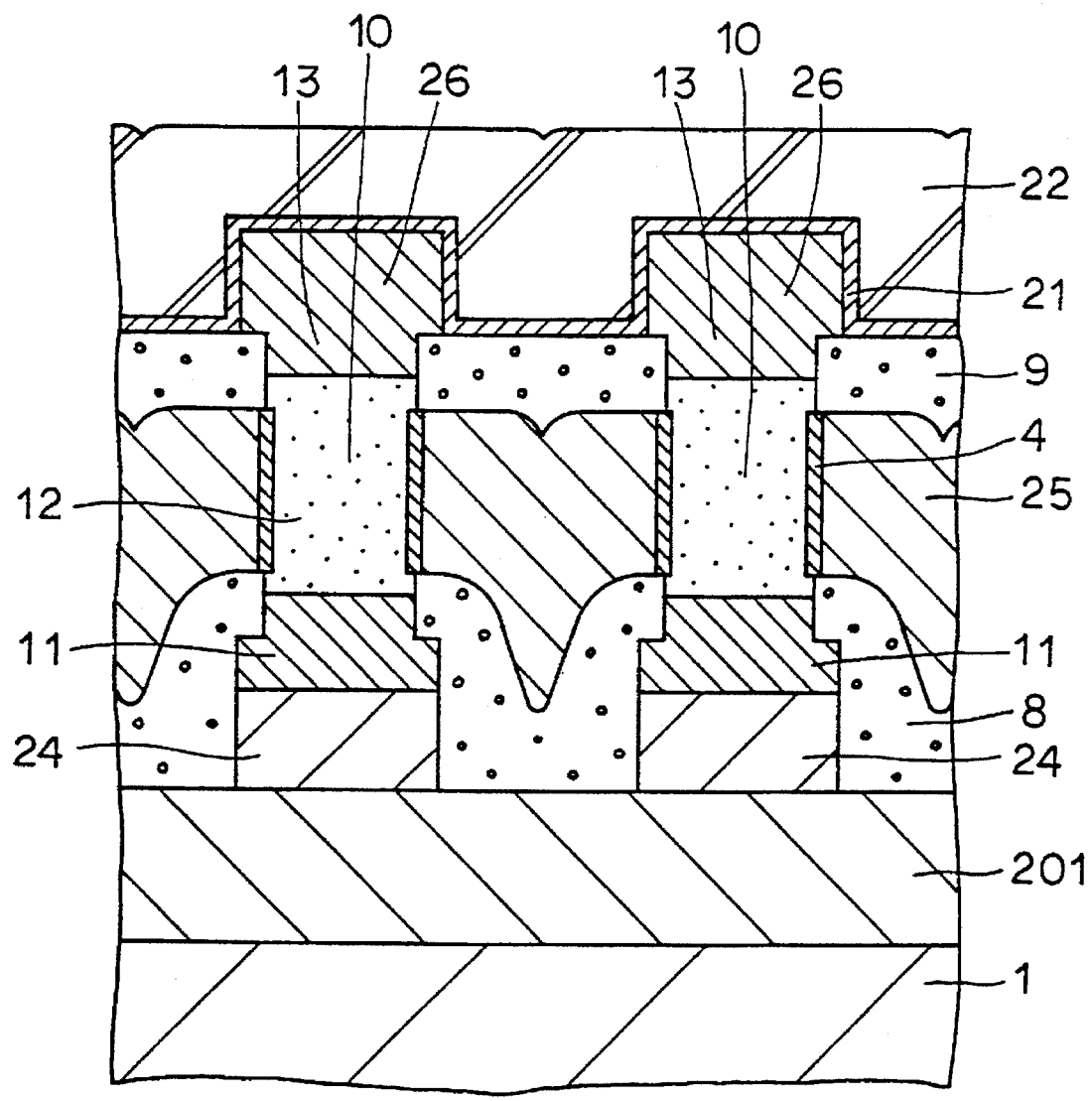
FIG. 2 is a cross section taken along line II—II in FIG. 1.
Figure 3:
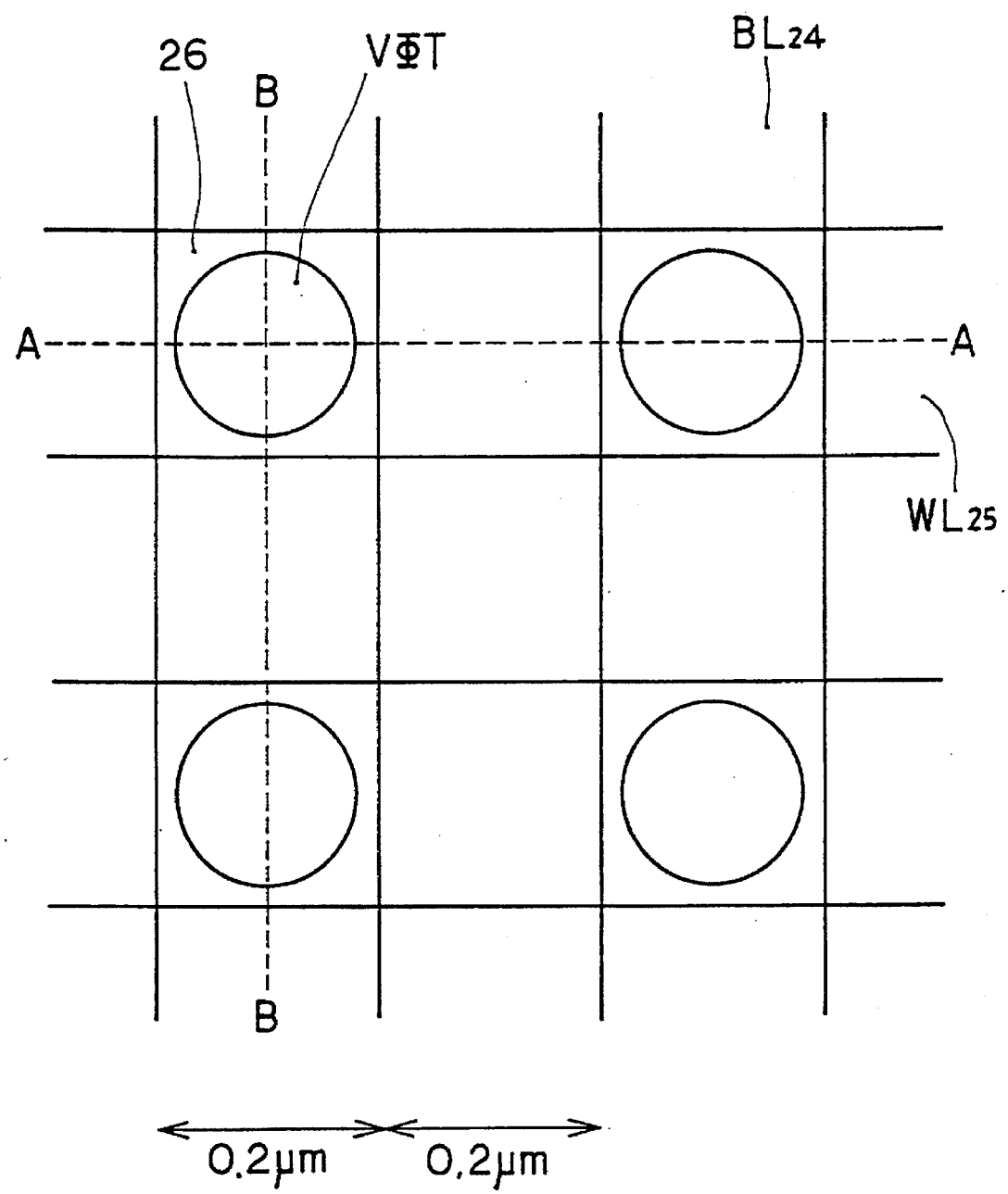
FIG. 3 shows a layout of a cell array of a DRAM using VΦTs.

FIG. 1 is a perspective view of a surround gate transistor (which will be referred to as a "vertical Φ-shaped transistor", and will be also referred to simply as a "VΦT", hereinafter) of an embodiment 1. FIG. 2 is a cross section taken along line II—II in FIG. 1. FIG. 3 shows a layout of a cell array of a DRAM using VΦTs. In the DRAM of embodiment 1 shown in these figures, a gate transistor is operable to store information in a capacitor which is disposed at a crossing of a bit line 24 and a word line 25 and is formed of a storage node 26, a capacitor insulating film 21 and a cell plate electrode 22.

On a substrate 1 of silicon, there is disposed a buried $SiO_2$ layer (dielectric layer) 201. On buried $SiO_2$ layer 201, there is disposed a first impurity diffusion layer 24 of a first conductivity type, which contains an impurity of the first conductivity type implanted thereinto and forms one of source/drain regions as well as the bit line. First impurity diffusion layer 24 is covered with a first interlayer insulating film 8 disposed on buried $SiO_2$ layer 201. On first interlayer insulating film 8, there is formed a gate electrode 25 which has upper and lower surfaces and also forms the word line. Gate electrode 25 is covered with a second interlayer insulating film 9 disposed on first interlayer insulating film 8. Contact holes 10, each of which penetrates first interlayer insulating film 8, gate electrode 25 and second interlayer insulating film 9, are provided for exposing portions of a surface of first impurity diffusion layer 24. Side walls of contact holes 10 are covered with gate insulating films 4.

In each contact hole 10, there is formed a first semiconductor layer 11 of the first conductivity type, which is in contact with the surface of first impurity diffusion layer 24 and extends from the surface of first impurity diffusion layer 24 to the substantially same level as the lower surface of gate electrode 25. In each contact hole 10, there is also formed a channel semiconductor layer 12, which is in contact with the surface of first semiconductor layer 11 and extends from the surface of first semiconductor layer 11 to the substantially same level as the upper surface of gate electrode 25. On channel semiconductor layer 12, there is provided a second conductive layer 13 of the first conductivity type, which is in contact with the surface of channel semiconductor layer 12 and forms the other of source/drain regions as well as storage node 26. The surface of second conductive layer 13 is covered with a capacitor insulating film 21 formed on second interlayer insulating film 9. On second interlayer insulating film 9, there is formed a cell plate electrode 22 which covers second conductive layer 13, i.e., storage node 26 with the capacitor insulating film 21 therebetween.

Advantages of this embodiment will be described below. Since VΦT is used, the occupied area can be small. Since silicon layer (SOI) or polysilicon layer (poly-SOI) forms bit line (24), bit line (24) is formed on a thick insulating film (201), and thus the capacitance of bit line can be small. As a result, the DRAM performing high-speed operation is obtained.

Advantageously, the use of SOI enables formation of channel semiconductor layer 12 by epitaxial growth.

Since the bit line capacitance is small, the capacitance of storage node can be small. More specifically, a sense amplifier has sensitivity of a fixed value. Therefore, if the ratio of $C_S$ (capacitance of storage node) to $C_B$ (capacitance of bit line) is constant, information can be read. Therefore, if $C_B$ is reduced, $C_S$ can be reduced.

Figure 16:
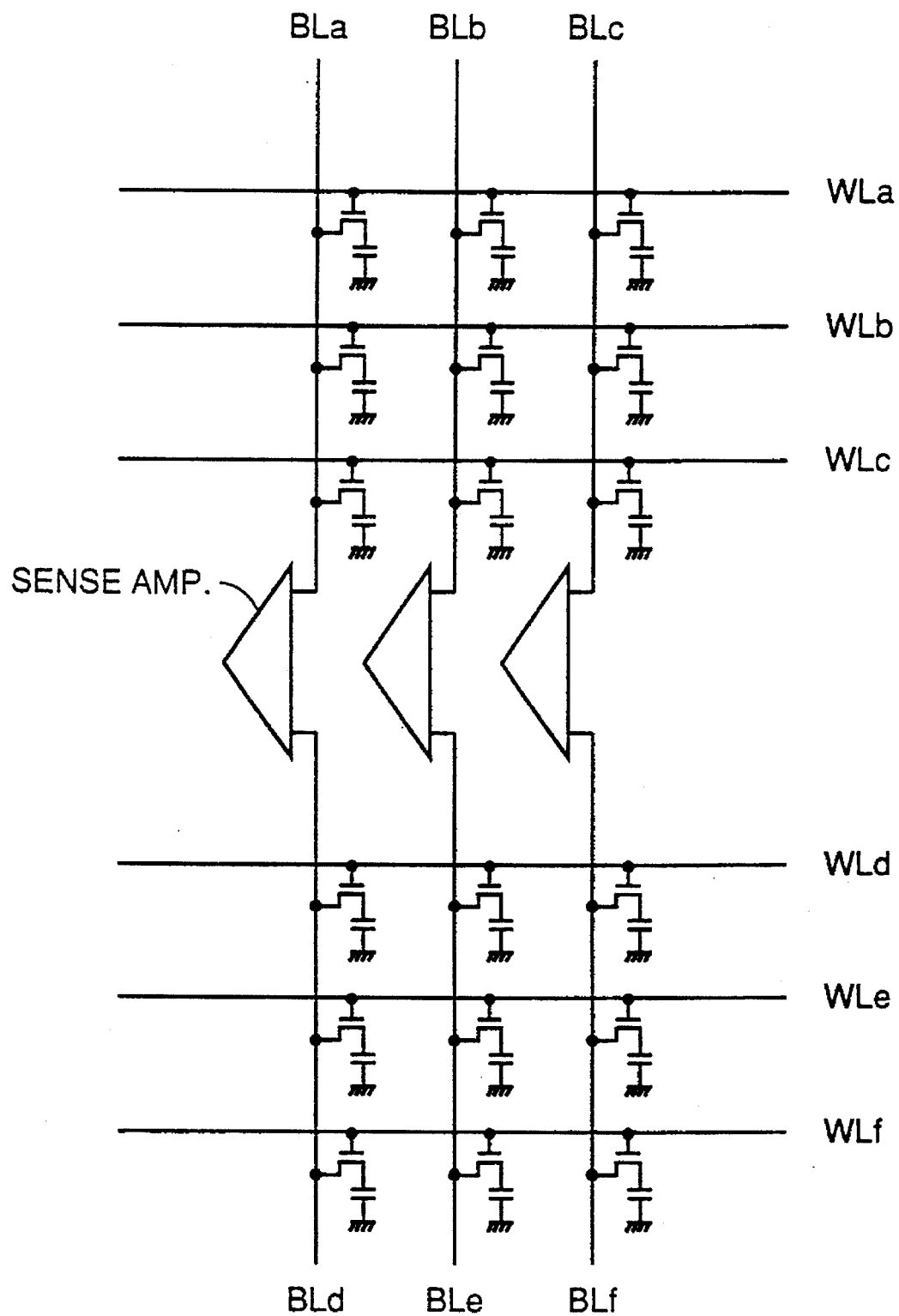
FIG. 16 is an equivalent circuit diagram of a DRAM array of embodiment 1.

Since the bit line capacitance is small, the open bit line system shown in an equivalent circuit diagram of FIG. 16 is allowed, and thus cells of $4F^2$ can be easily obtained.

If an ordinary silicon substrate were used, a well would be required to isolate a P-channel and an N-channel from each other. Owing to SOI structure or poly-SOI structure, however, a well is not required, which simplifies a manufacturing process.

If the ordinary silicon substrate were used, it would be necessary to provide an LOCOS oxide film for isolating adjacent transistors from each other. In the embodiment, however, the adjacent transistors can be isolated from each other only by formation of bit line 24 as shown in FIG. 2. This also simplifies the manufacturing process.

A leak current does not flow between adjacent bit lines 24. Owing to the fact that the leak current does not flow between the bit lines, it is possible to increase a time period between refreshing operations (rewriting operations).

Owing to the SOI structure, the DRAM can have a higher resistance against soft error as compared with the structure using the ordinary silicon substrate.

The VΦT structure of transistor can provide the following advantages.

Referring to FIG. 2, reduction of a radius of channel semiconductor layer 12 allows depletion of the entire channel. Depletion of the entire channel can suppress a sub-threshold current (leak current at a weakly inverted state), resulting in improvement of circuit characteristics. Also, a sub-threshold coefficient S has a minimum value of 60 mV/dec.

Since channel semiconductor layer 12 is surrounded by an electric field applied thereto, punch-through can be suppressed.

Owing to suppression of the punch-through, the structure has a high resistance against disturb refresh. Since there is no substrate bias effect, high-speed operation is allowed. Since the channel width can be wide, a large current can flow therethrough.

Channel semiconductor layer 12 can be monocrystallized by the epitaxial growth method. According to the process described above, since the word line is formed, and the contact holes are formed in the word line, the word line can be formed easily. Connection can be made easily between the transistor and the bit line and between the transistor and the capacitor. The film thickness of the word line equals the gate length, the gate length can be controlled easily. Since a length of offset of the source depends on the film thickness of first interlayer insulating film 8, and a length of offset of the drain depends on the film thickness of second interlayer insulating film 9, these lengths can be controlled easily.

Impurity of source/drain can be implanted by a simple ion-implanting process. Likewise, ion implantation for the channel can be performed easily. Since the gate insulating film is formed by oxidation, the gate insulating film does not have a thin portion at the edge of gate. Thus, the leak current does not generate at the edge of gate.

Description will now be given on a process of manufacturing the DRAM using VΦTs shown in FIG. 2. The manufacturing process will be described with reference to cross sections taken along line A—A in FIG. 3.

Figure 4:
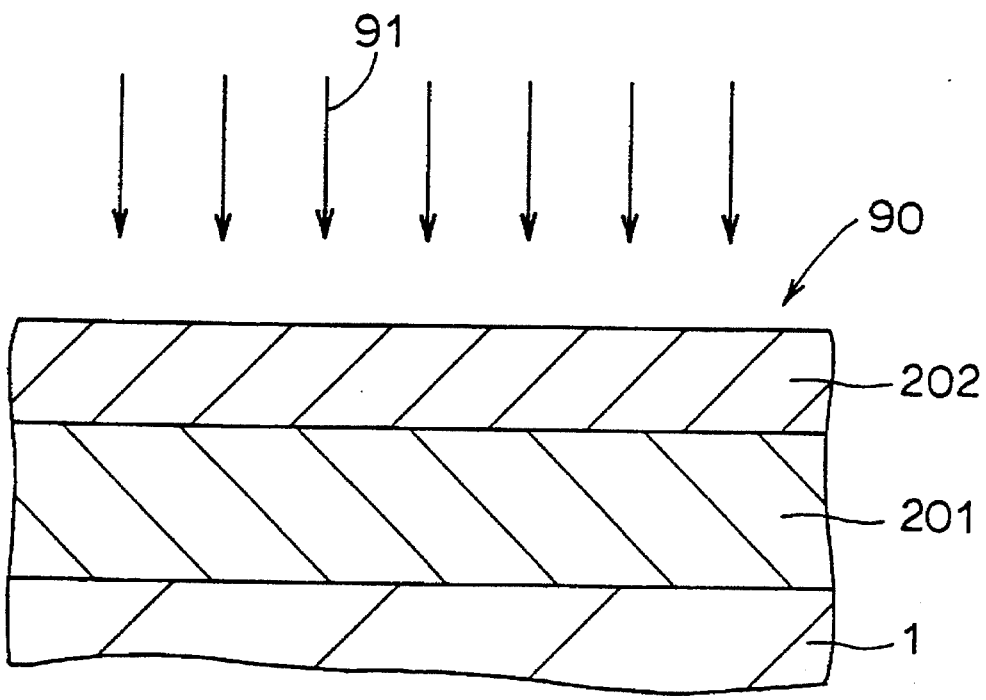
FIGS. 4 to 15 are cross sections showing 1st to 12th steps in a process of manufacturing the DRAM using the VΦT of embodiment 1, respectively.

Referring to FIG. 4, one prepares an SOI (Silicon On Insulator) substrate 90, in which buried $SiO_2$ layer 201 is formed on silicon substrate 1, and an SOI layer 202 is formed on buried $SiO_2$ layer 201.

SOI substrate 90 is formed by an appropriate method such as an SIMOX (Separation by Implanted Oxygen) method, ZMR method (Zone Melting Recrystallization) method, laser anneal method or laminating method. The SOI substrate may be replaced with a substrate such as an SOS (Silicon On Sapphire) which is separated by another dielectric member. The SOI substrate may be replaced with a poly-SOI substrate.

Buried $SiO_2$ layer 201 has a film thickness of 5000 Å, and SOI layer 202 has a film thickness of 2000 Å. Since SOI layer 202 forms the bit line, impurity 91 is implanted thereinto to reduce its resistance as shown in FIG. 4. If the VΦT is, for example, to be of the P-channel type, the P-type impurity is implanted into SOI layer 202.

Figure 5:
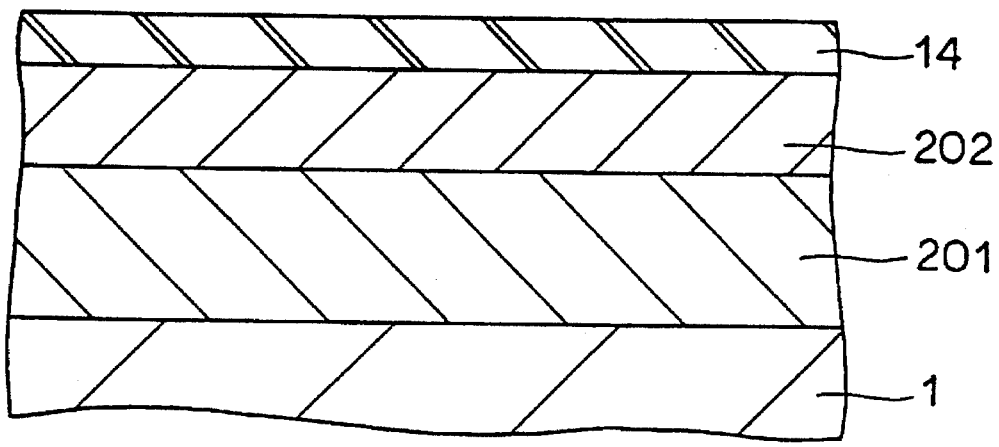

Referring to FIG. 5, an SiN layer 14 of 1000 Å in thickness is deposited on SOI layer 202. As will be described later, the purpose of SiN layer 14 is to prevent oxidation of the bottom of contact hole at the step of forming the gate insulating film of VΦT.

Figure 6:
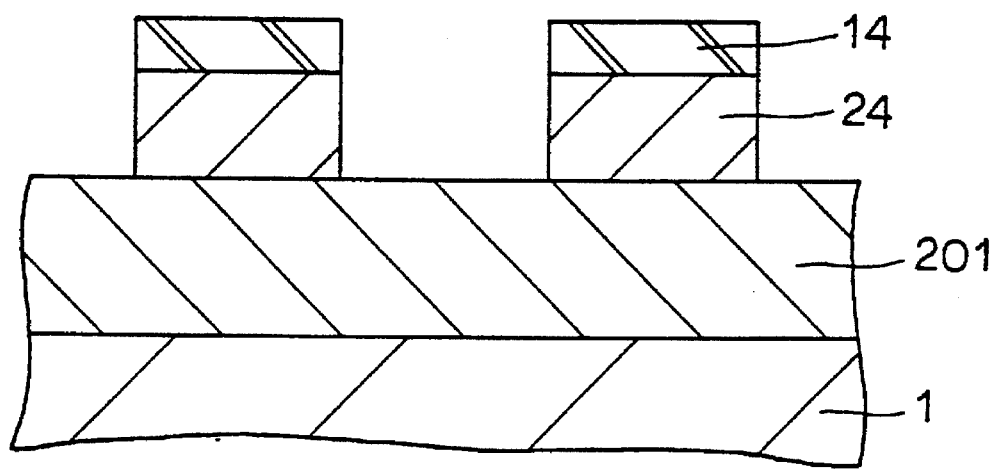

Referring to FIG. 6, SOI layer 202 is patterned to have the configuration of bit lines 24.

The step of implanting impurity shown in FIG. 4, the step of depositing SiN layer shown in FIG. 5 and the step of patterning bit lines shown in FIG. 6 may be carried out in the different orders described below.

(1) Implantation - SiN - Patterning
(2) Implantation - Patterning - SiN
(3) SiN - Implantation - Patterning
(4) SiN - Patterning - Implantation
(5) Patterning - Implantation - SiN
(6) Patterning - SiN - Implantation If the steps are performed in accordance with the order (2), (5) or (6) described above, a structure shown in FIG. 7 is obtained instead of the structure in FIG. 6. In the structure shown in FIG. 7, SiN layer 14 having a higher dielectric constant than $SiO_2$ is formed between adjacent bit lines 24, so that a capacitance between the bit lines increases. Therefore, SiN layer 14 must have a small film thickness of about 500 Å.

Figure 8:
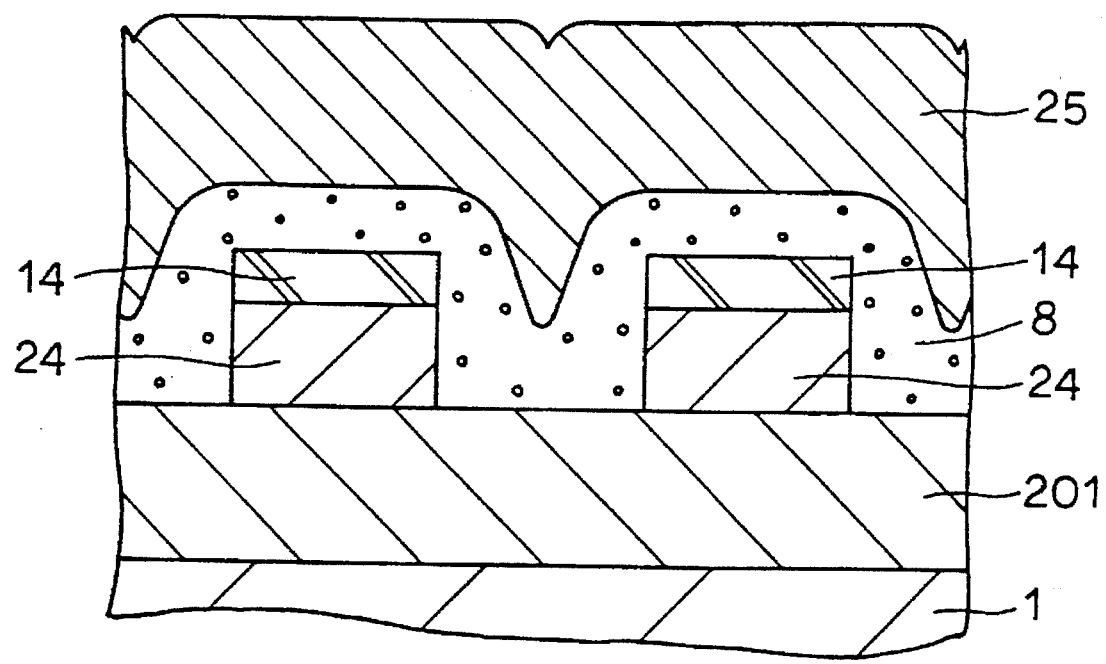

Referring to FIGS. 6 and 8, first interlayer insulating film 8 of 1000 Å in thickness is deposited on buried $SiO_2$ layer 201 to cover bit lines 24. Polysilicon of 3000 Å in thickness is deposited on first interlayer insulating film 8, and then is patterned to form word lines 25. More specifically, word lines 25 are formed by patterning the polysilicon containing impurity implanted thereinto in order to reduce the resistance. The polysilicon containing impurity may be doped polysilicon. Alternatively, impurity may be implanted into non-doped polysilicon.

Figure 9:
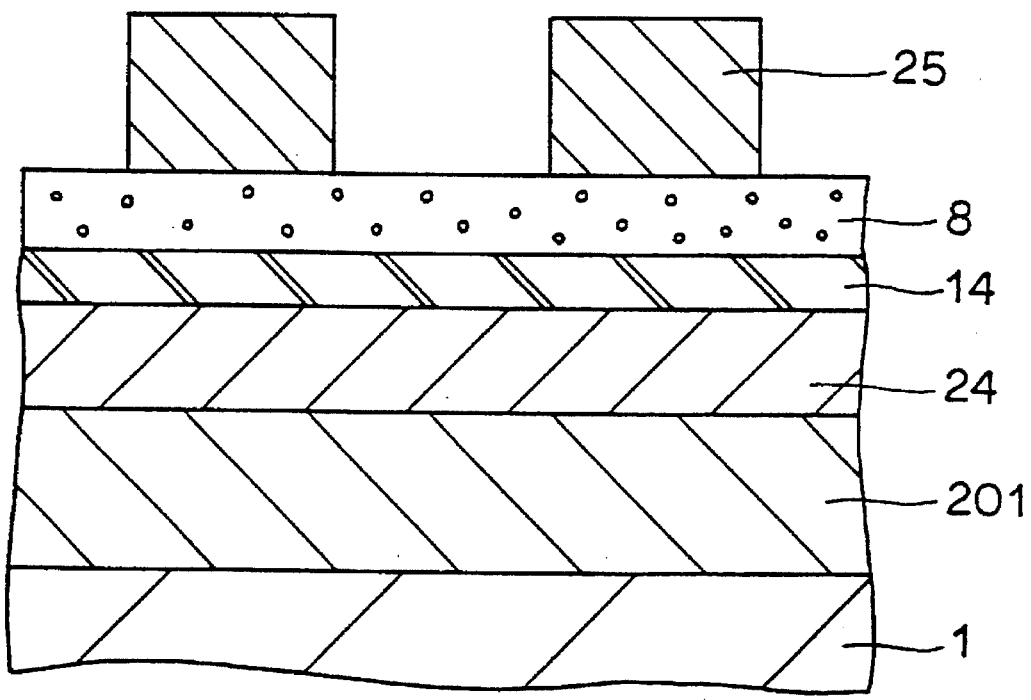

FIG. 9 is a cross section showing the semiconductor device at the same step as FIG. 8 and taken along line parallel to the bit line, i.e., taken along line B—B in FIG. 3.

Referring to FIGS. 8 and 9, the film thickness of word line 25 equals the gate length of VΦT. Since the film thickness of word line 25 can be controlled easily, good controllability of the gate length can be achieved.

Figure 10:
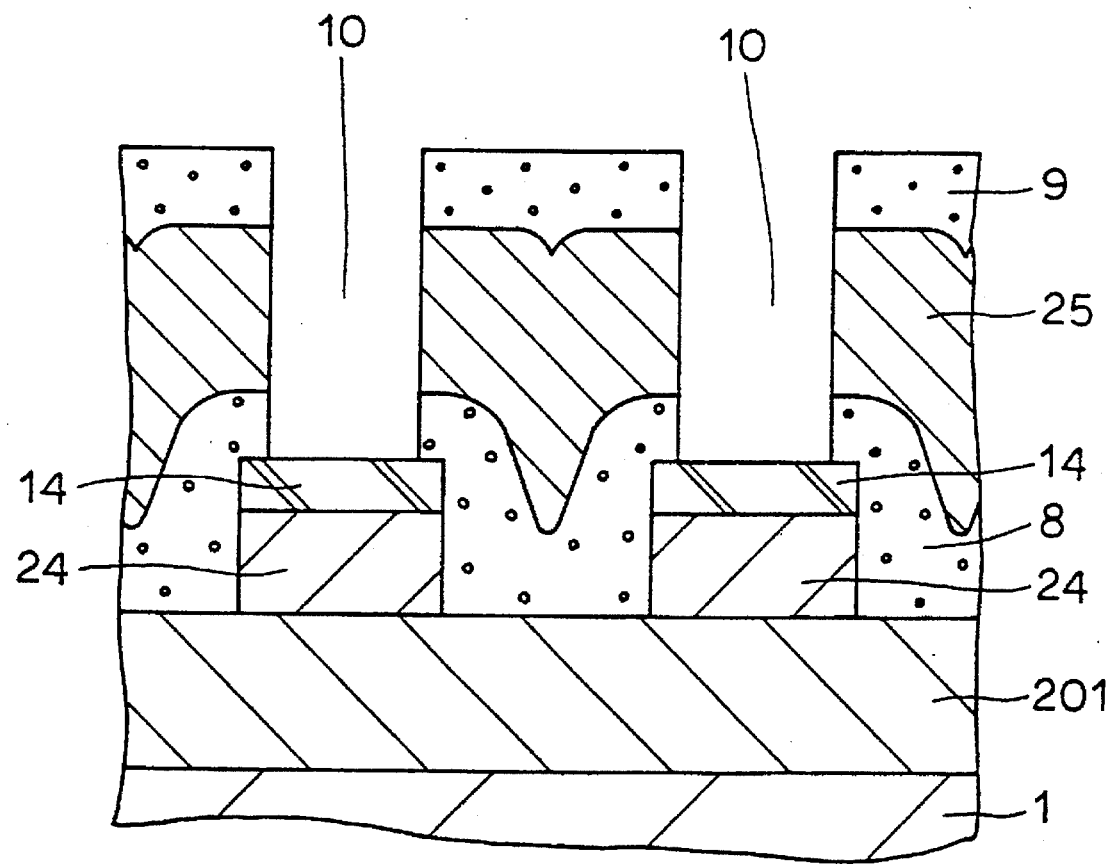

Referring to FIG. 10, second interlayer insulating film 9 is formed on first interlayer insulating film 8 to cover word lines 25.

Then, contact holes 10 penetrating second interlayer insulating film 9, word lines 25 and first interlayer insulating film 8 are formed at crossings of word lines 25 and bit lines 24.

Figure 11:
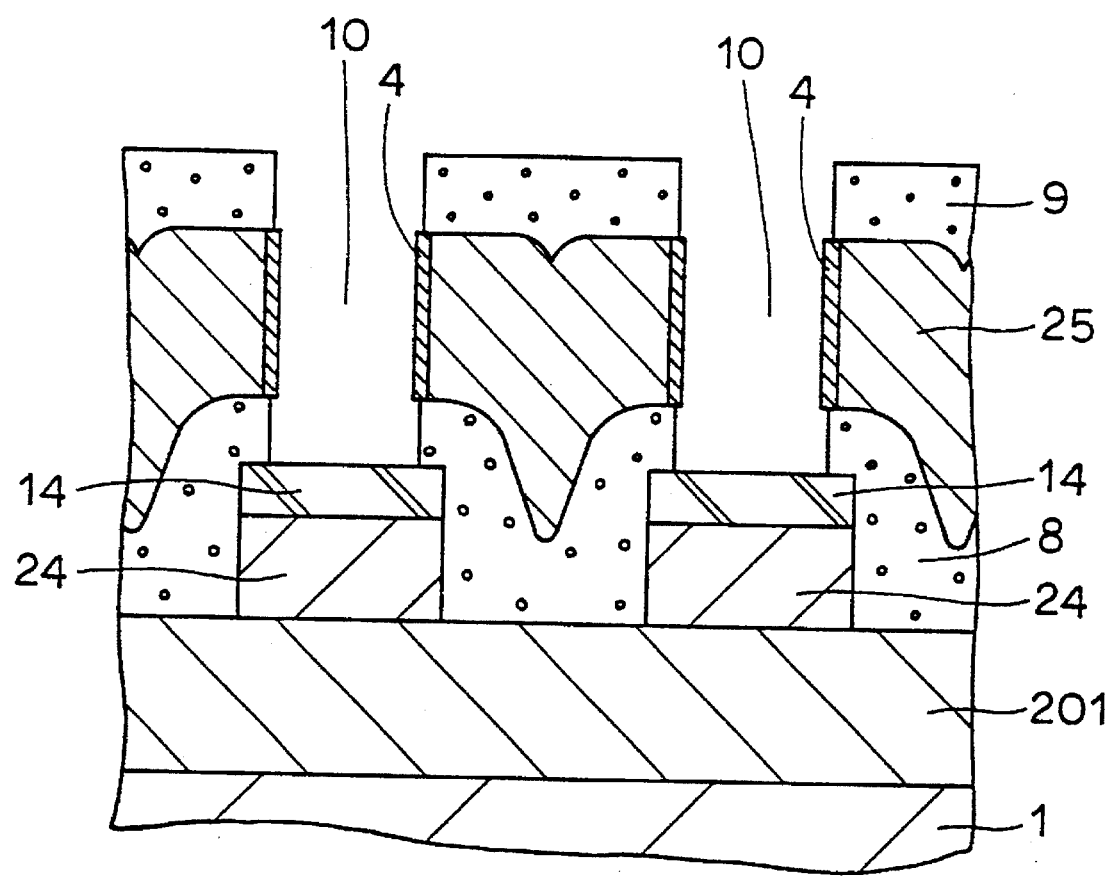

Referring to FIG. 11, oxidation is effected on the side wall of word line 25 exposed in each contact hole 10 to form gate insulating film 4 of VΦT. Since gate insulating film 4 is formed by oxidation, the gate insulating film 4 is thinned at the upper end of gate electrode (25).

Figure 12:
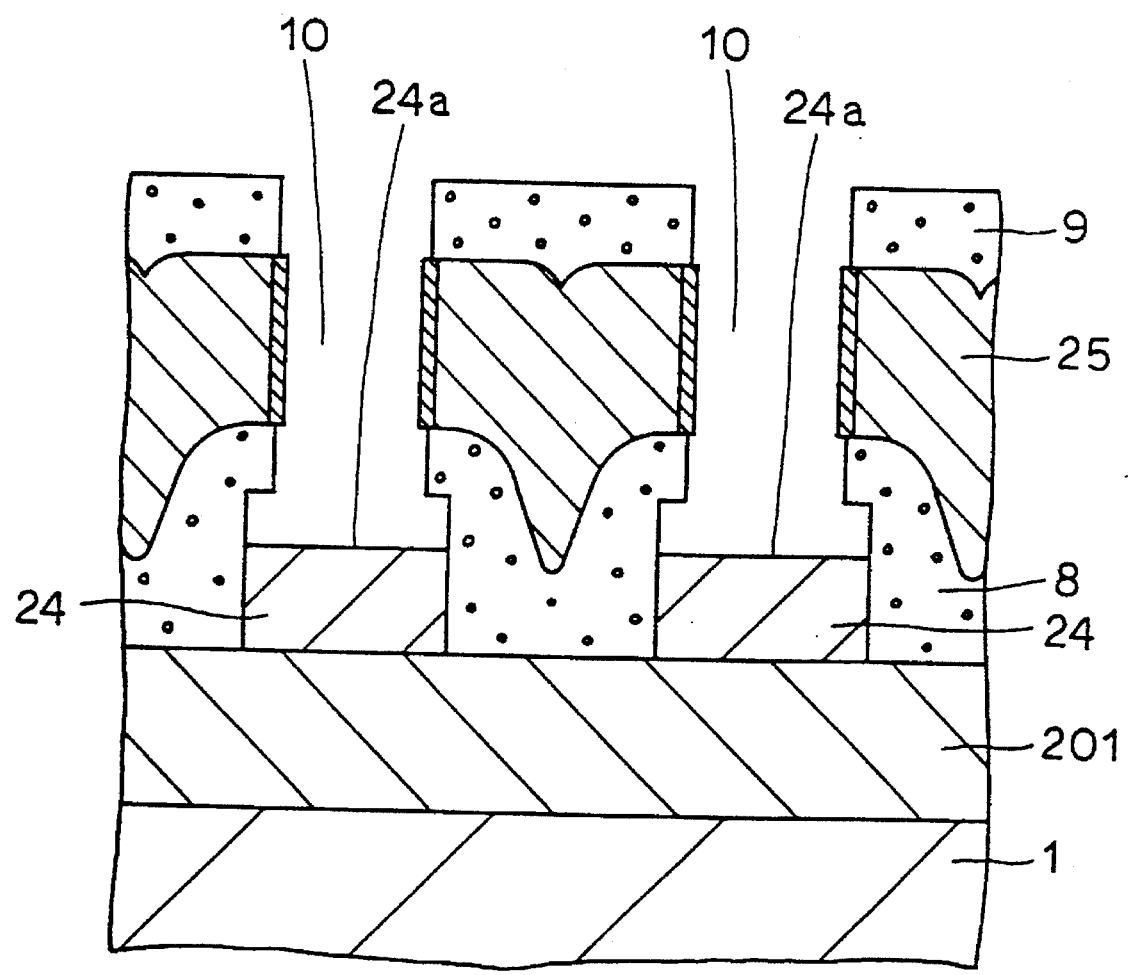

Referring to FIGS. 11 and 12, SiN layer 14 at the bottom of each contact hole 10 is removed by heat phosphoric acid to expose a surface 24a of bit line 24.

Figure 13:
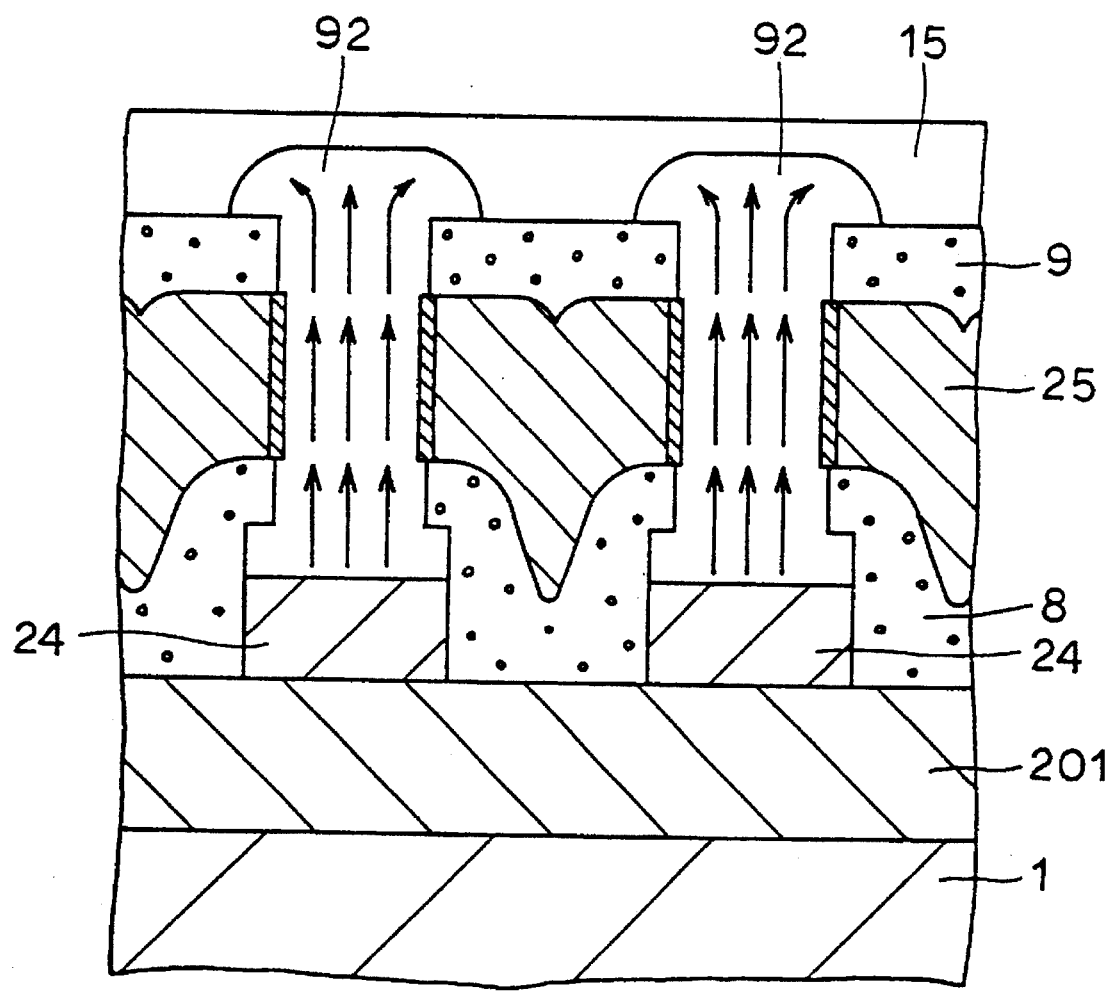
Figure 14:
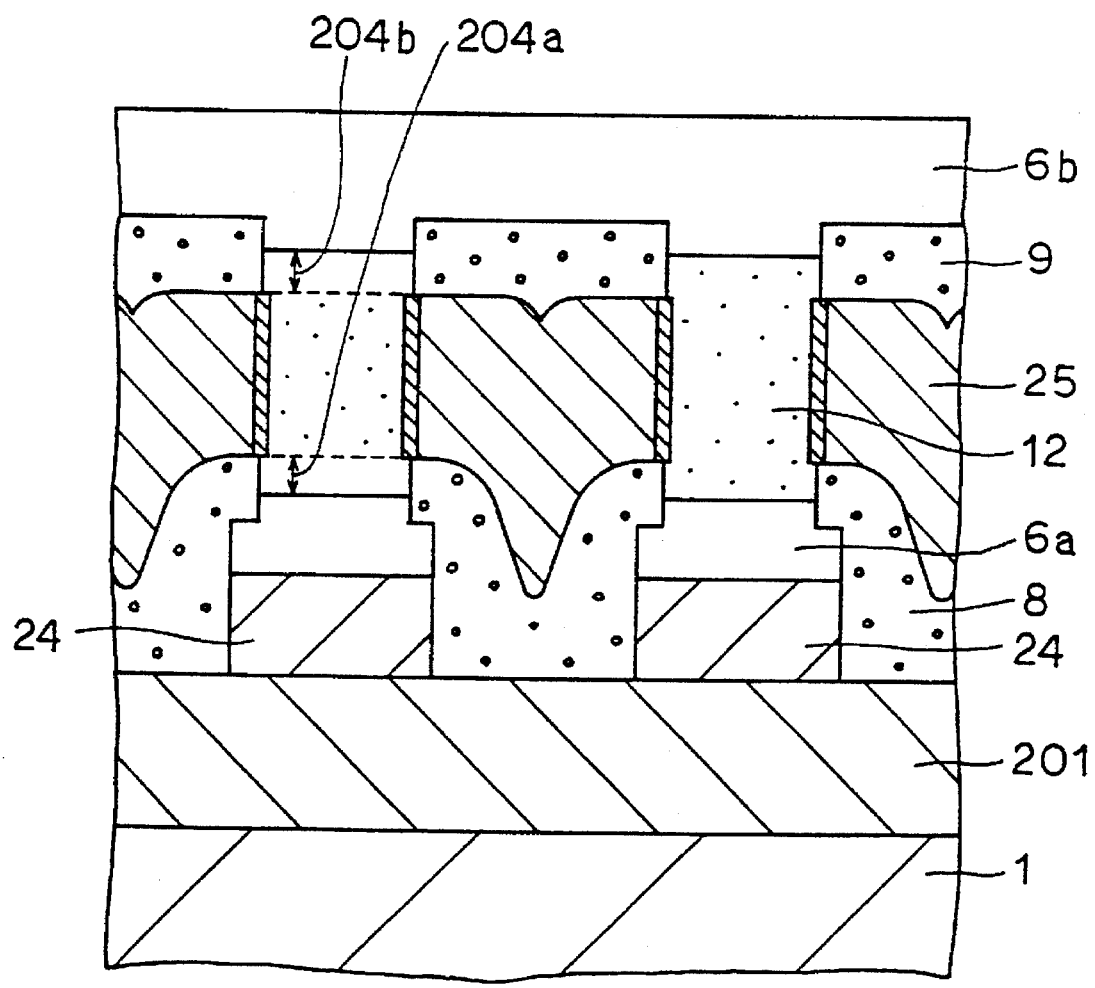

Referring to FIG. 13, contact holes 10 are filled with amorphous silicon 15. Amorphous silicon 15 is epitaxially grown from the surface of bit lines 24. Monocrystal silicon 92 obtained by this epitaxial growth forms the channel of VΦT. Since surface 24a of bit line 24 serves as a contact to the bit line, contact can be made very easily between the transistor and bit line 24.

After completion of the epitaxial growth, ion implantation is performed to form the drain and channel of VΦT. Thereafter, the implanted ion diffuses owing to heat treatment during the process, so that source 6a and drain 6b are formed. Since impurity is introduced into source 6a, drain 6b and channel 12 by the implantation method, concentration of impurity in these portions can be controlled easily. By controlling the film thicknesses of first interlayer insulating film 8 and second interlayer insulating film 9, the lengths of offset portions 204a and 204b can be controlled easily.

Figure 15:
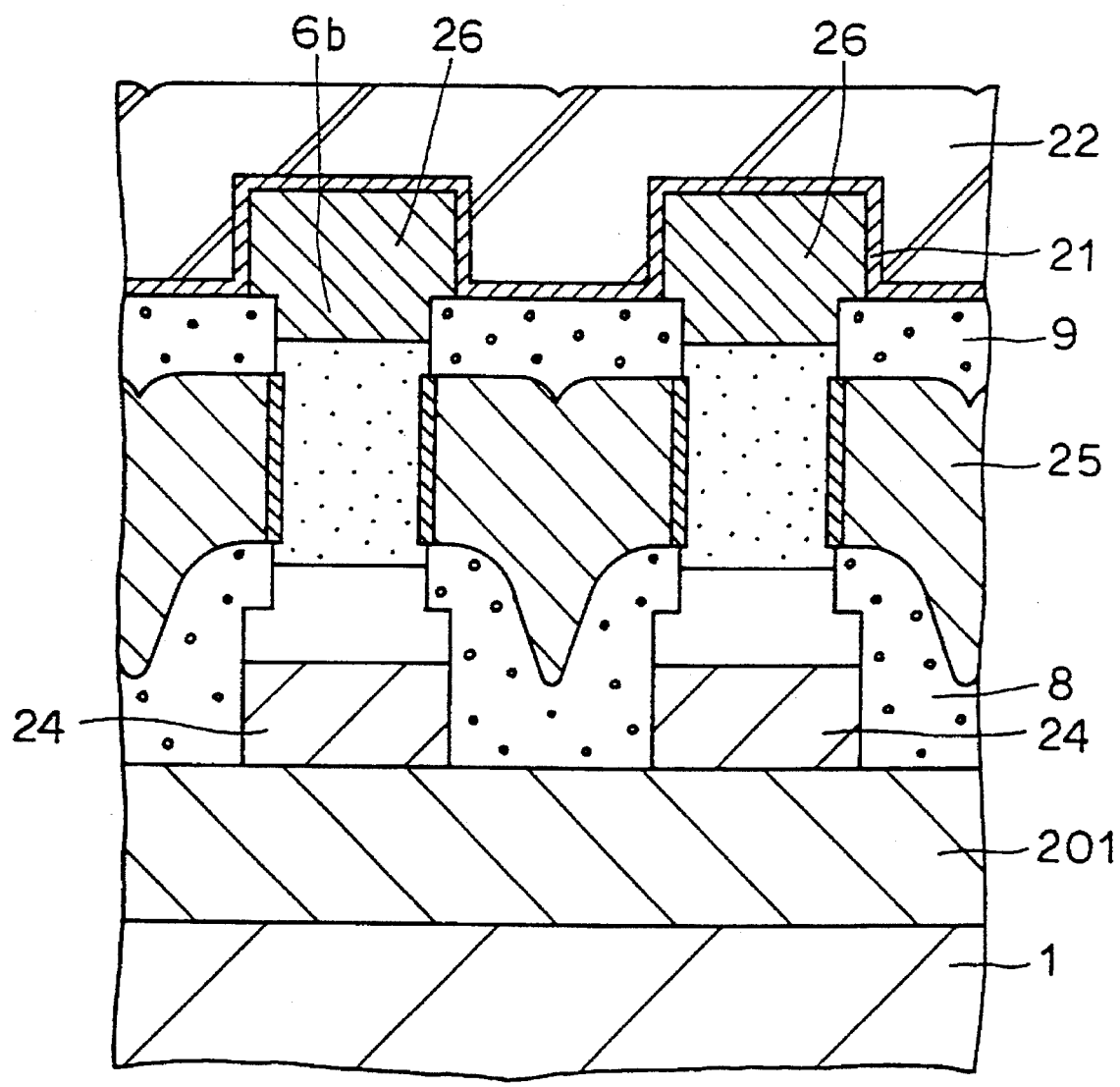

Referring to FIG. 15, the drain portion of VΦT is patterned to produce storage node 26. Capacitor insulating film 21 is formed on second interlayer insulating film 9 to cover storage node 26. Cell plate electrode 22 is formed on second interlayer insulating film 9 to cover storage node 26 with capacitor insulating film 21 therebetween. In this manner, the DRAM cells using VΦTs are completed.

Since the drain 6b of VΦT also serves as storage node 26, the transistor and capacitor can be connected very easily. The DRAM cells of $4F^2$ are obtained as described above.

Embodiments 2 to 6 which will described below relate to a method for reducing a resistance of the word line. Embodiments 7 to 12 relate to a method which reduces the resistance of bit line for enabling high-speed operation of the VΦT-DRAM.

In embodiment 1, the word line is made of doped polysilicon, and the bit line is made of the SOI layer. Therefore, if a plurality of VΦTs are continuously disposed, the word line and bit line have a high resistance. As can be seen from FIG. 3, the width of word line 25 is reduced at portions containing VΦTs, which further increases the resistance. The high resistance of the word line and bit line reduces the operation speed of DRAM. Embodiments 2 to 12 have been developed to overcome the above problem.

Embodiment 2

Figure 17:
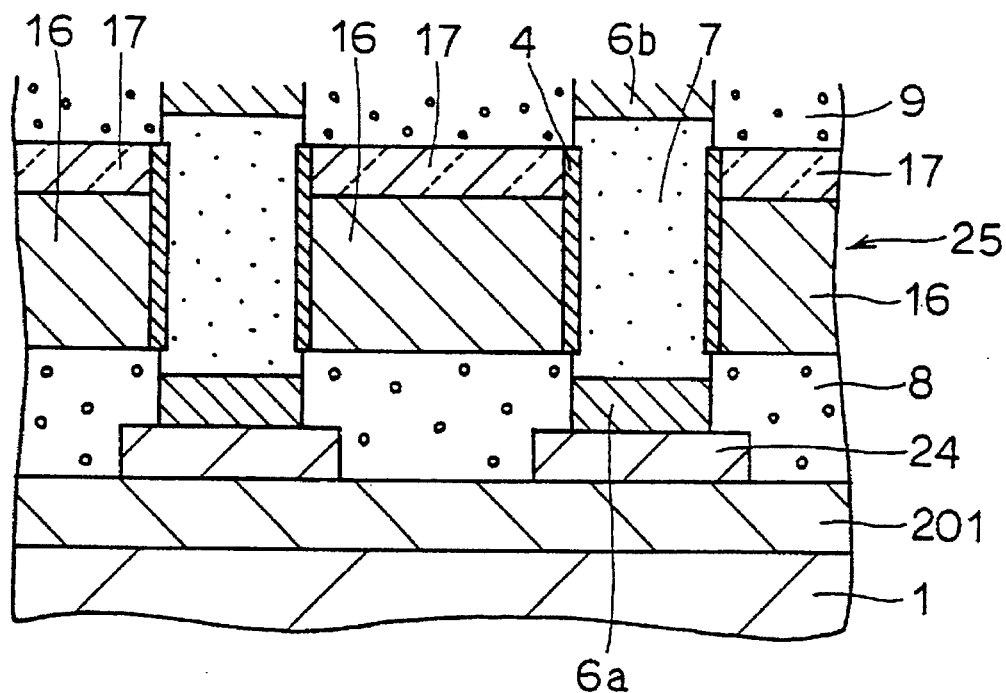
FIG. 17 is a cross section of a major portion of a DRAM cell using VΦTs of an embodiment 2.

FIG. 17 is a cross section of a major portion of a DRAM cell using VΦT of embodiment 2. The DRAM cell of embodiment 2 is the substantially same as the DRAM cell shown in FIG. 2 except for the following points. Therefore, portions equal or corresponding to those in the DRAM cell in FIG. 2 are not shown in the figure. Also, the same or corresponding portions bear the same reference numbers, and will not be described below.

In the DRAM cell shown in FIG. 17, the word line 25 has a two-layer structure formed of a polysilicon 16 and a silicide 17 disposed on polysilicon 16. The two-layer structure formed of polysilicon 16 and silicide 17 can reduce the resistance of word line 25, and thus enables the high-speed operation of DRAM. Material of silicide may be tungsten silicide, titanium silicide, cobalt silicide, platinum silicide, molybdenum silicide or others, and alternatively, material other than silicide may be used provided that it has a similar resistivity.

Embodiment 3

Figure 18:
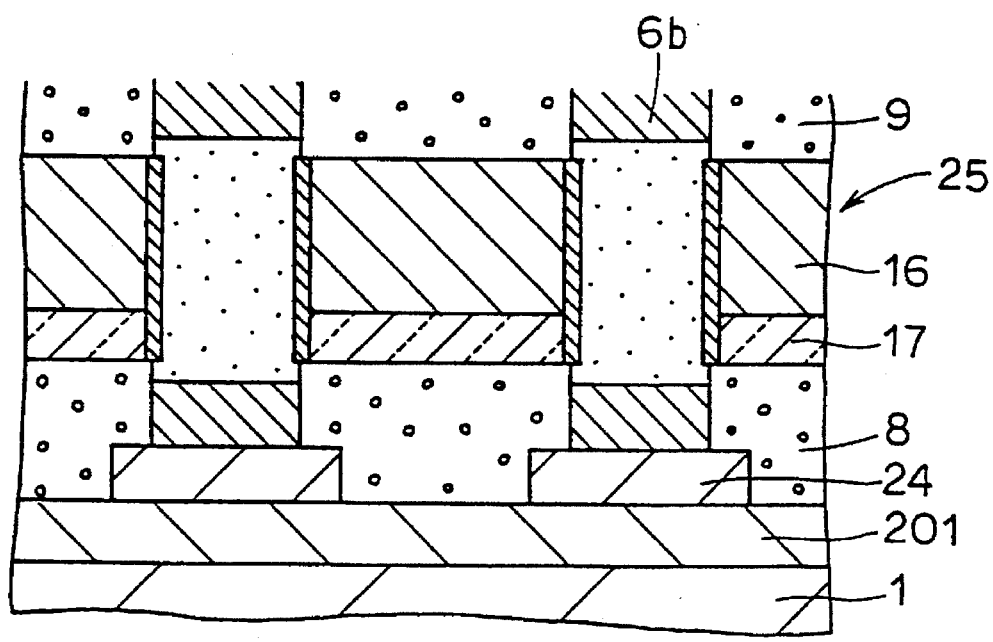
FIG. 18 is a cross section of a major portion of a DRAM cell of an embodiment 3.

FIG. 18 is a cross section of a major portion of a DRAM cell of embodiment 3. The DRAM cell of this embodiment differs from the DRAM cell shown in FIG. 17 in that silicide 17 is formed under polysilicon 16. Similarly to embodiment 2, since word line 25 has the two-layer structure formed of the polysilicon and silicide, the word line 25 has a low resistance.

Embodiment 4

Figure 19:
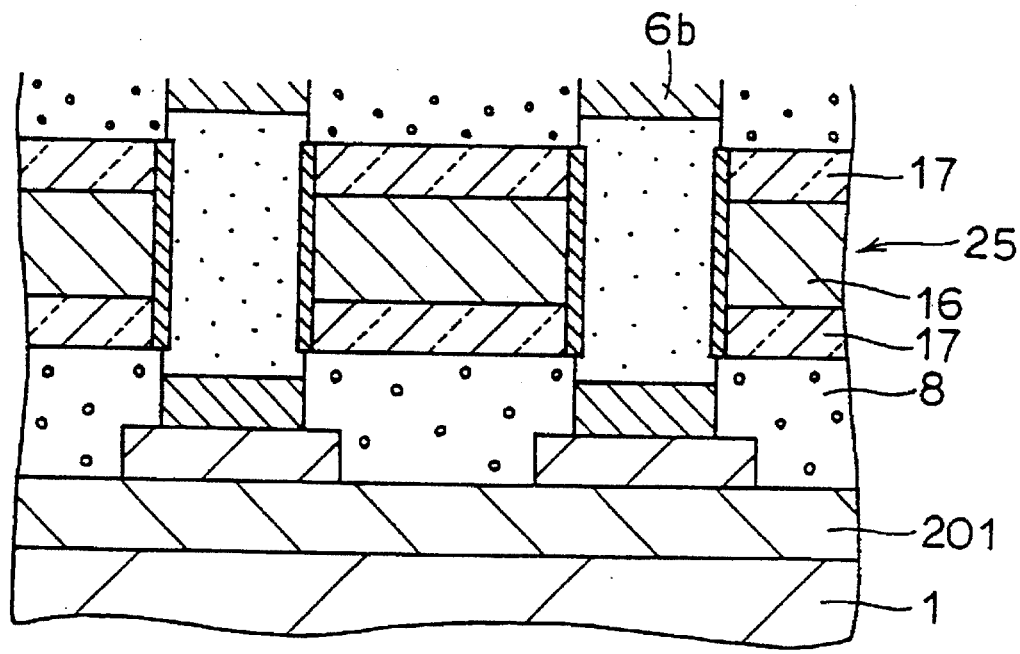
FIG. 19 is a cross section of a major portion of a DRAM cell of an embodiment 4.

FIG. 19 is a cross section of a major portion of a DRAM cell of the embodiment 4. In this embodiment, silicide 17 is disposed above and below polysilicon 16. This structure can further reduce the resistance of word line 25.

In the case of an n-channel transistor, a threshold voltage $V_{th}$ of a structure including a gate made of metal or silicide is higher than that of a structure including a gate made of polysilicon by the reason related to a work function. If word line 25 has the layered structure including silicide 17 and polysilicon 16, the threshold voltage $V_{th}$ of VΦT can be changed locally. For example, if silicide 17 is disposed at the drain side as shown in FIG. 17, the channel portion 7 surrounded by silicide 17 has a higher threshold voltage $V_{th}$ than channel portion 7 surrounded by polysilicon 25, and thus is resistive to inversion. Therefore, punch-through between source 6a and drain 6b is advantageously suppressed even if the drain voltage increases.

Figure 20:
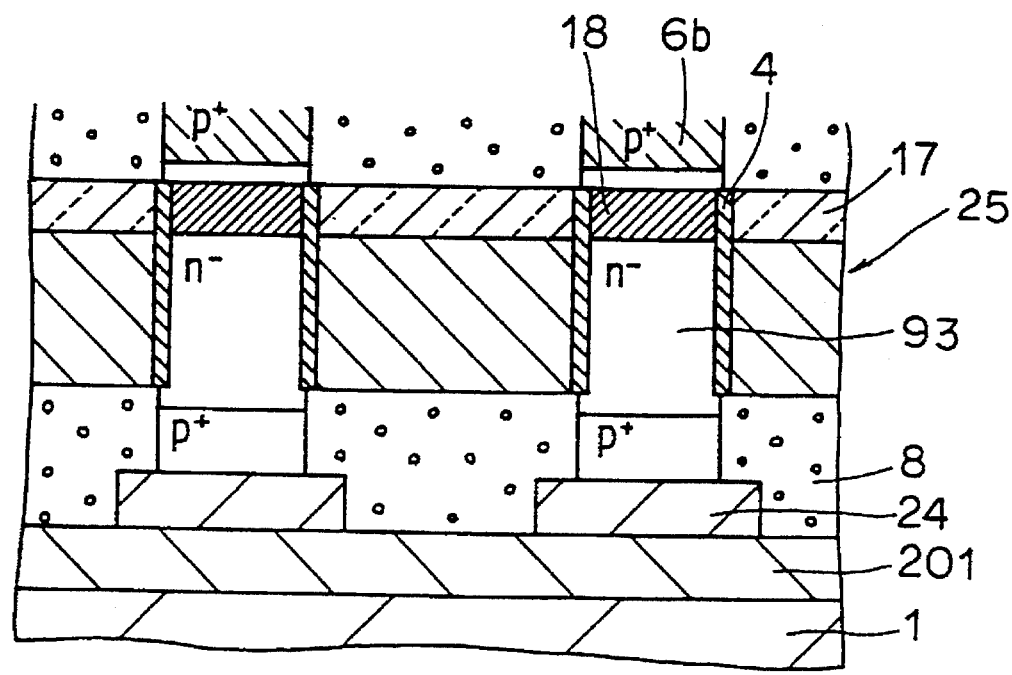
FIG. 20 is a cross section of a major portion of another DRAM cell of embodiment 4.
Figure 21:
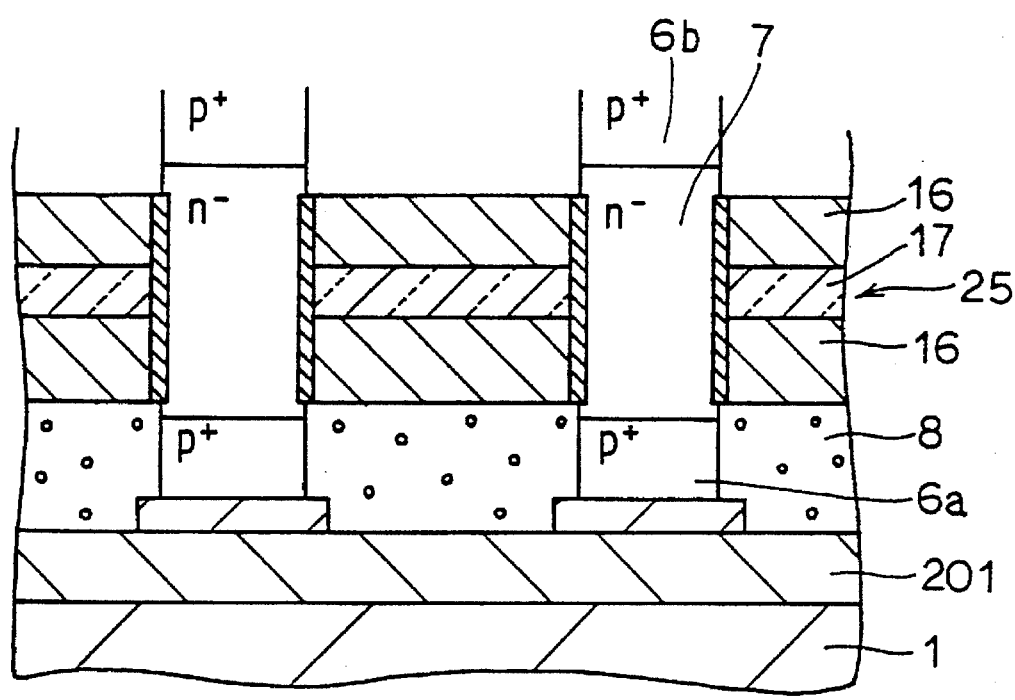
FIG. 21 is a cross section of a major portion of still another DRAM cell of embodiment 4.

Conversely, in the case of a p-channel transistor, channel portion 7 surrounded by silicide 17 is not sufficiently resistive to the punch-through because its threshold voltage $V_{th}$ is low. Therefore, as shown in FIG. 20, there is provided a region 18 containing n-type impurity, which is slightly more than that in an n-channel region 93, so that the punch-through can be prevented. As shown in FIG. 21, word line 25 can have a small resistance at the p-channel 7, and can effectively prevent the punch-through, if it includes silicide 17 disposed between upper and lower layers of polysilicon 16.

Embodiment 5

Figure 22:
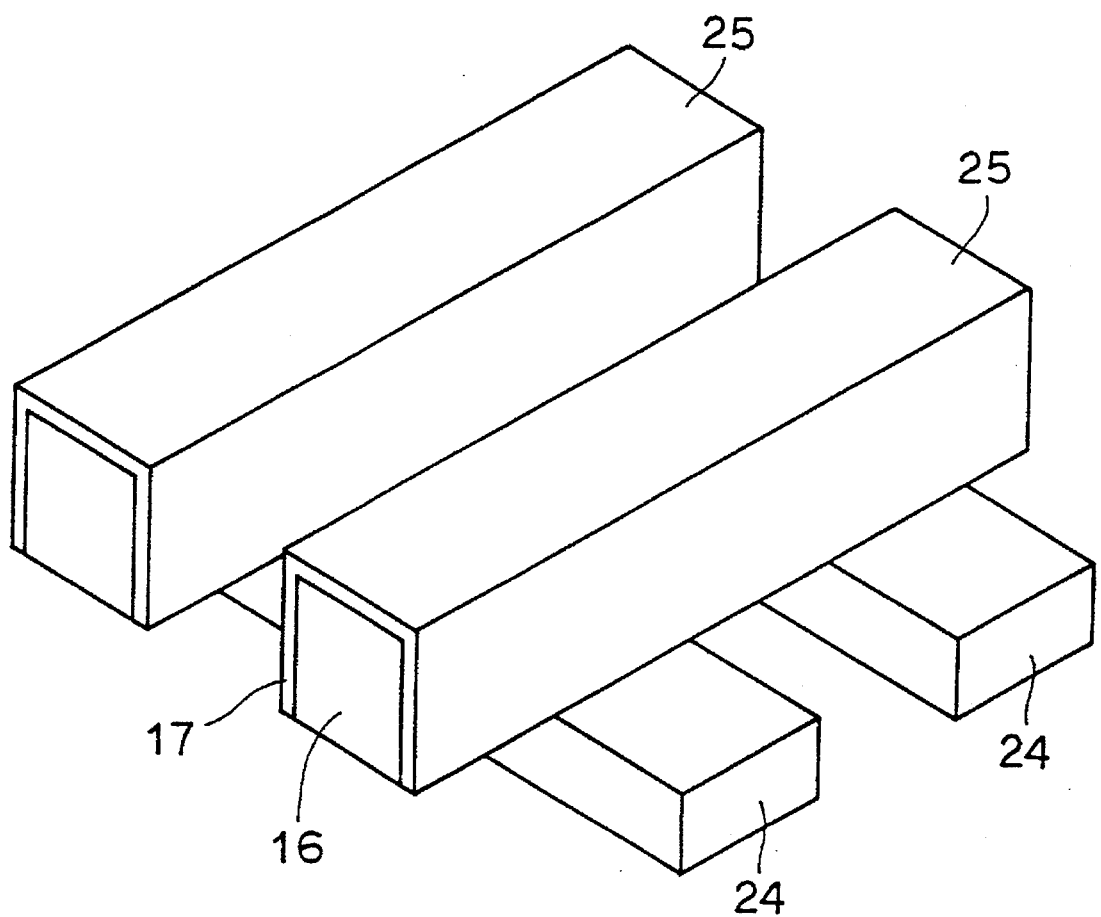
FIG. 22 is a perspective view of a major portion of a DRAM cell array of an embodiment 5.

FIG. 22 is a perspective view of a major portion of a DRAM cell array of embodiment 5, and specifically shows the structure at a step corresponding to that in FIGS. 8 and 9. Members and portions other than word lines 25 and bit lines 24 are not shown in FIG. 22 for simplicity reason. In this embodiment, silicide 17 is disposed not only on the upper surface of polysilicon 16 but also on the side surfaces thereof. Thus, three sides of word line 25 are covered with silicide 17, so that the resistance of word line 25 is further reduced.

Then, a method of manufacturing the device shown in FIG. 22 will be described below.

Figure 23:
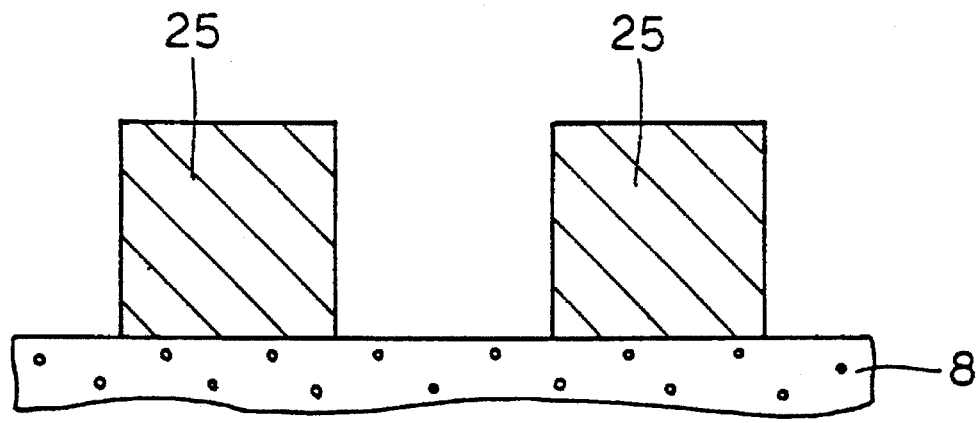
FIGS. 23 to 27 are cross sections of a semiconductor device at 1st to 5th steps in a process of manufacturing the DRAM cell array of embodiment 5, respectively.

Referring to FIG. 23, word lines 25 are formed on first interlayer insulating film 8.

Figure 24:
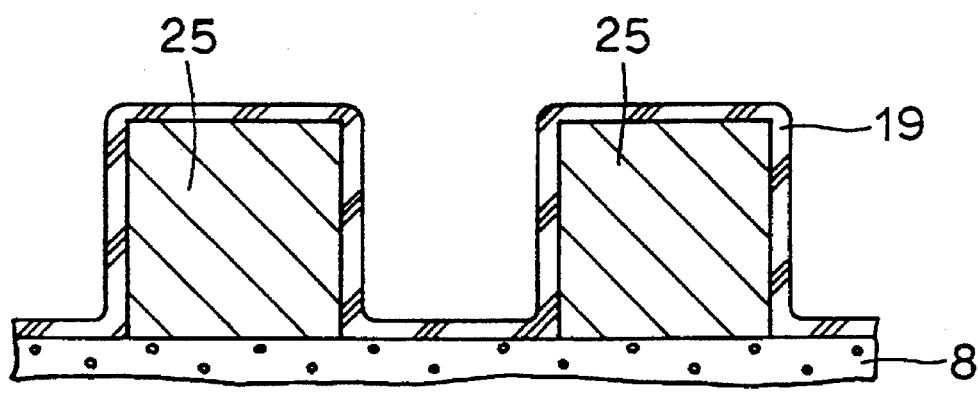

Referring to FIG. 24, a sputtering method is performed to cover the surfaces of word lines 25 with a titanium film 19 of 200 Å in thickness.

Figure 25:
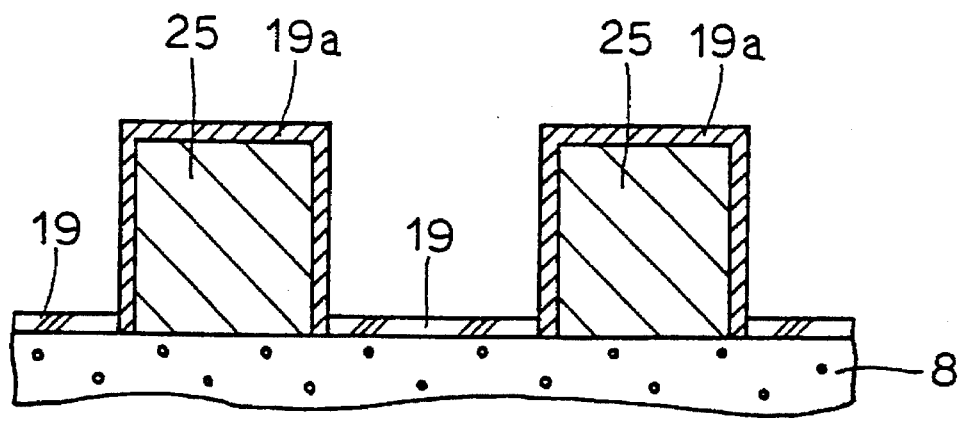
Figure 26:
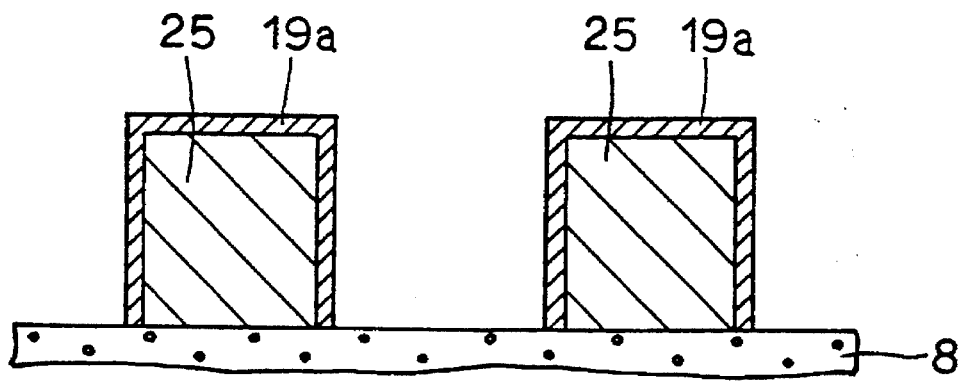

Lamp annealing is performed in the atmosphere of $N_2$ at a temperature of 600° to 700° C. for 30 seconds. Referring to FIG. 25, titanium silicide films 19a, which are compound of titanium and silicon, are produced only on portions of silicon which were in contact with titanium. Referring to FIGS. 25 and 26, unreacted titanium film 19 is removed.

In this embodiment, titanium has been described as an example. However, other material such as cobalt, platinum or nickel may be used. The manner of forming the silicide only on exposed portions of silicon has been referred to as "salicide".

Figure 27:
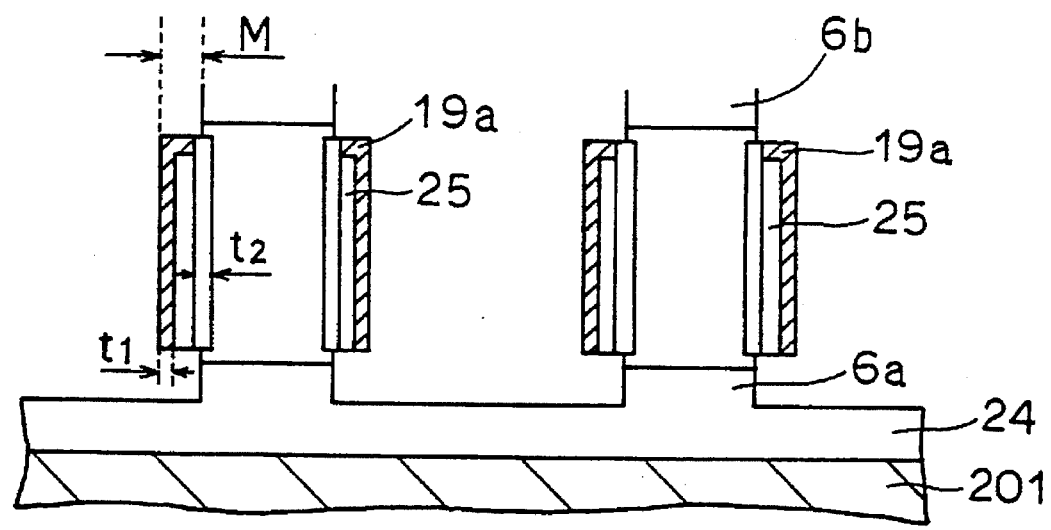

FIG. 27 is a cross section showing VΦTs in which contact holes are formed in word lines 25 covered with titanium silicide films 19a. In this structure, a margin M between the word line and the contact hole of VΦT can be expressed by the following formula.

M=overlap margin of photolithography+silicide film thickness ($t_1$)+film thickness ($t_2$) of portion to be oxidized It is necessary to form the contact hole at word line 25 taking this margin M into consideration.

Embodiment 6

This embodiment 6 relates to a method of forming silicide only on side walls of the word line.

Figure 28:
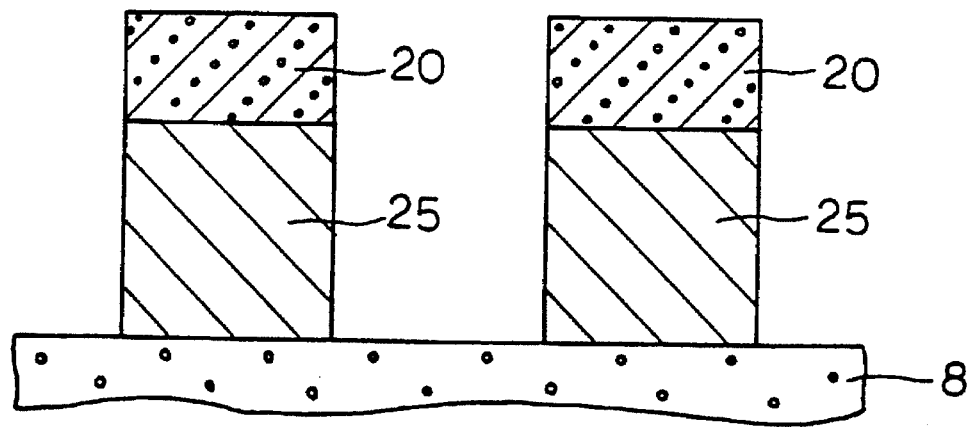
FIGS. 28 and 29 are cross sections of a semiconductor device at 1st and 2nd steps in a process of manufacturing a semiconductor device of an embodiment 6, respectively.
Figure 29:
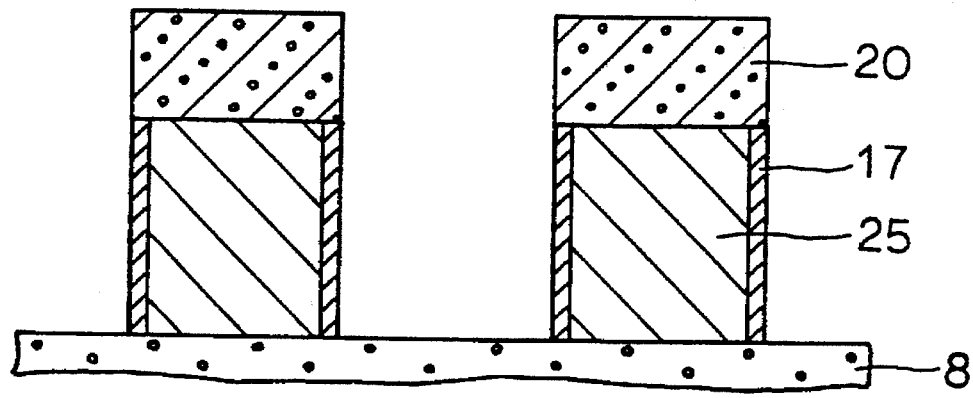

Referring to FIG. 28, SiO$_2$ layer 20 is formed on each word line 25. Referring to FIG. 29, silicide films 17 are formed on the side walls of word line 25. Since silicide films 17 are formed at the opposite side walls of word line 25, the resistance of word line 25 can be reduced.

At the step of forming the contact hole of VΦT, the silicide film does not exist on the top surface of word line 25. Therefore, it is not necessary to perform the etching for piercing the silicide film, which improves the stability of the process.

Embodiment 7

Embodiments 7 to 12 are aimed at reduction of the resistance of bit lines and thus increase of the operation speed of VΦT-DRAM.

Figure 30:
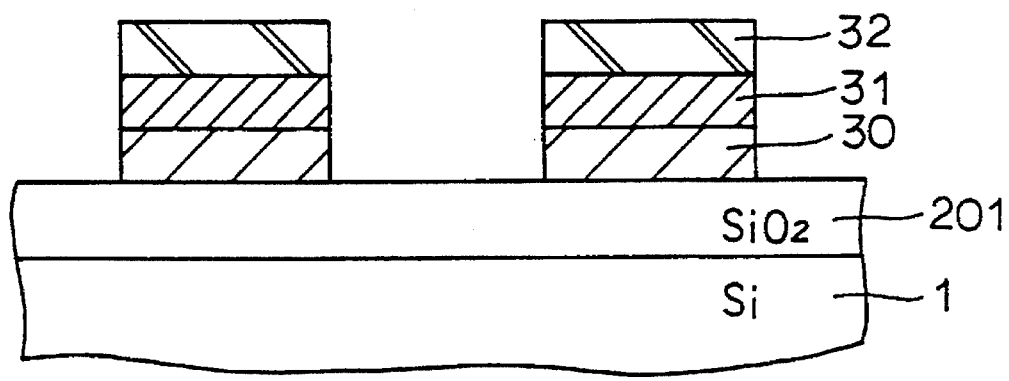
FIG. 30 is a cross section of a semiconductor device of an embodiment 7.

FIG. 30 is a cross section showing an SOI layer 30 (BL), silicide 31 and an SiN layer 32, where are layered in this order and are patterned to have configurations of the bit lines. Implantation of impurity into SOI layer 30 may be carried out at any step as already described in connection with embodiment 1.

Figure 7:
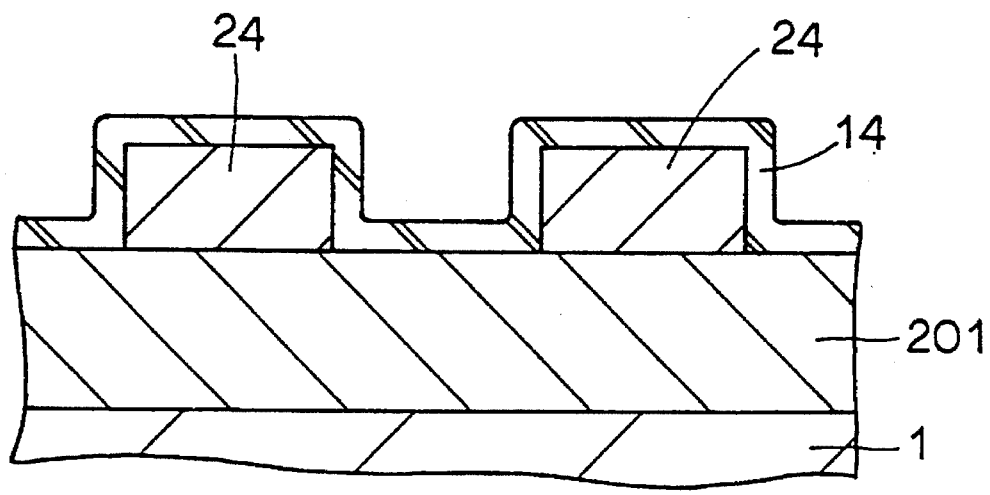
Figure 31:
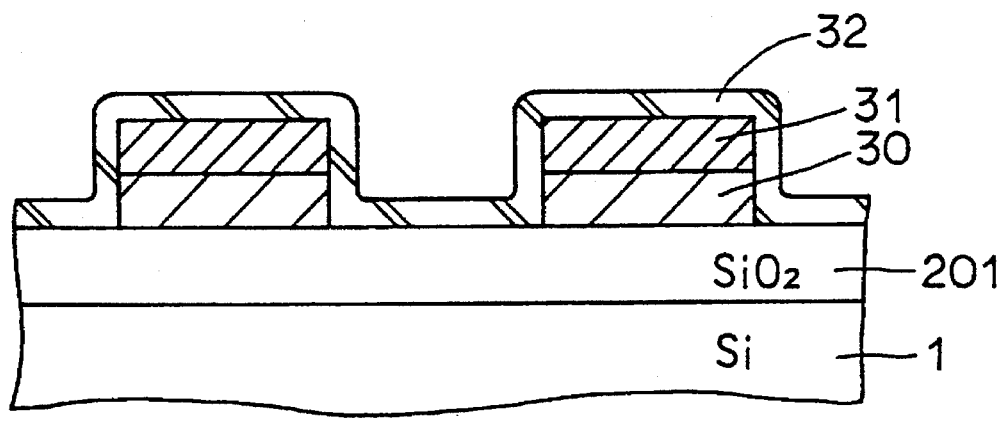
FIG. 31 is a cross section of another semiconductor device of embodiment 7.

SiN layer 32 may be deposited after patterning SOI layer 30 and silicide 31, in which case the device has a section shown in FIG. 31. FIGS. 30 and 31 correspond to FIGS. 6 and 7 showing embodiment 1, respectively.

Thereafter, steps similar to those shown in FIGS. 8 to 14 are performed to produce a VΦT-DRAM including the bit lines of a low resistance and capable of high-speed operation.

Figure 32:
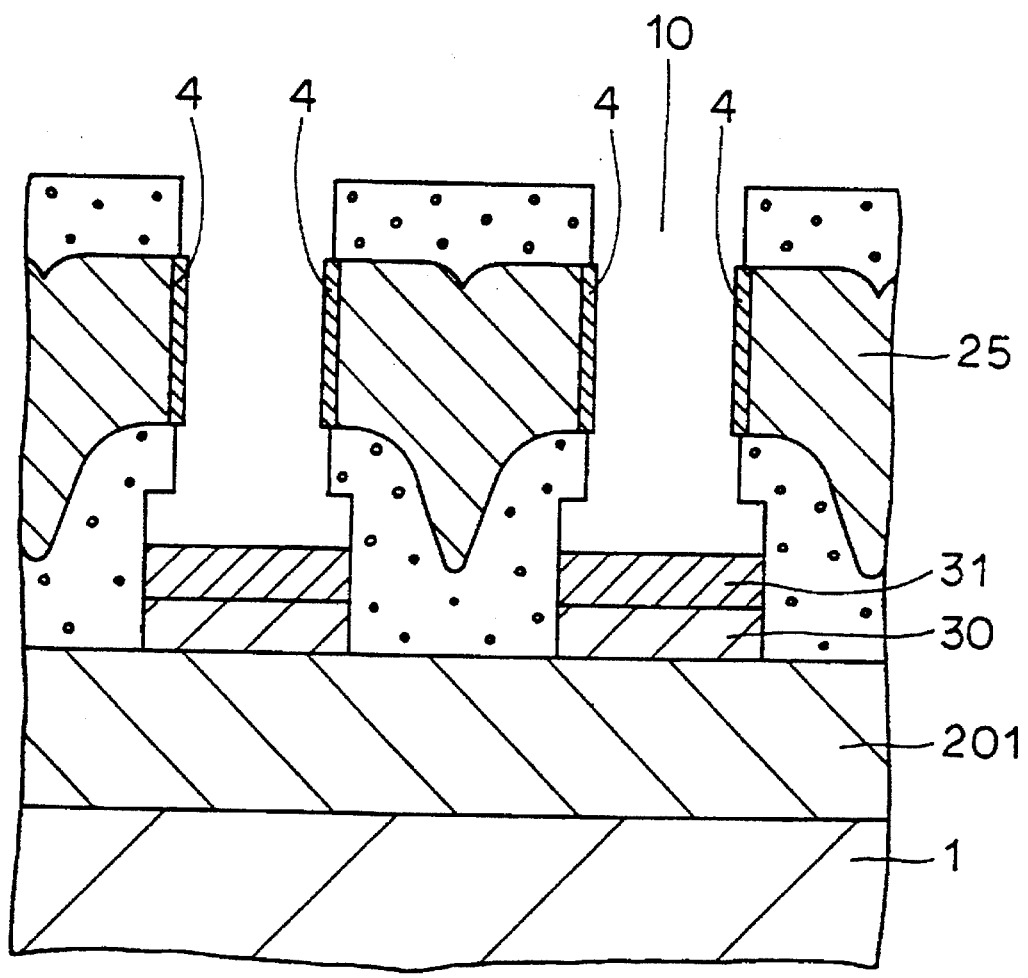
FIGS. 32 and 33 are cross sections of a semiconductor device at 1st and 2nd steps in a process of manufacturing a semiconductor device of an embodiment 8, respectively.

In this embodiment, the structure has a section shown in FIG. 32 after the steps of forming the contact holes of VΦTs, forming gate insulating films 4 by oxidation and then removing the SiN film provided for preventing oxidation of the bit lines. In this state, since the upper surface of SOI layer 30 is covered with silicide 31, the channel of VΦT will not be monocrystallized even if one performs solid phase growth of amorphous silicon filling contact hole 10 in the structure shown in FIG. 32. Embodiment 8 described below is an improvement of the above structure.

Embodiment 8

Figure 33:
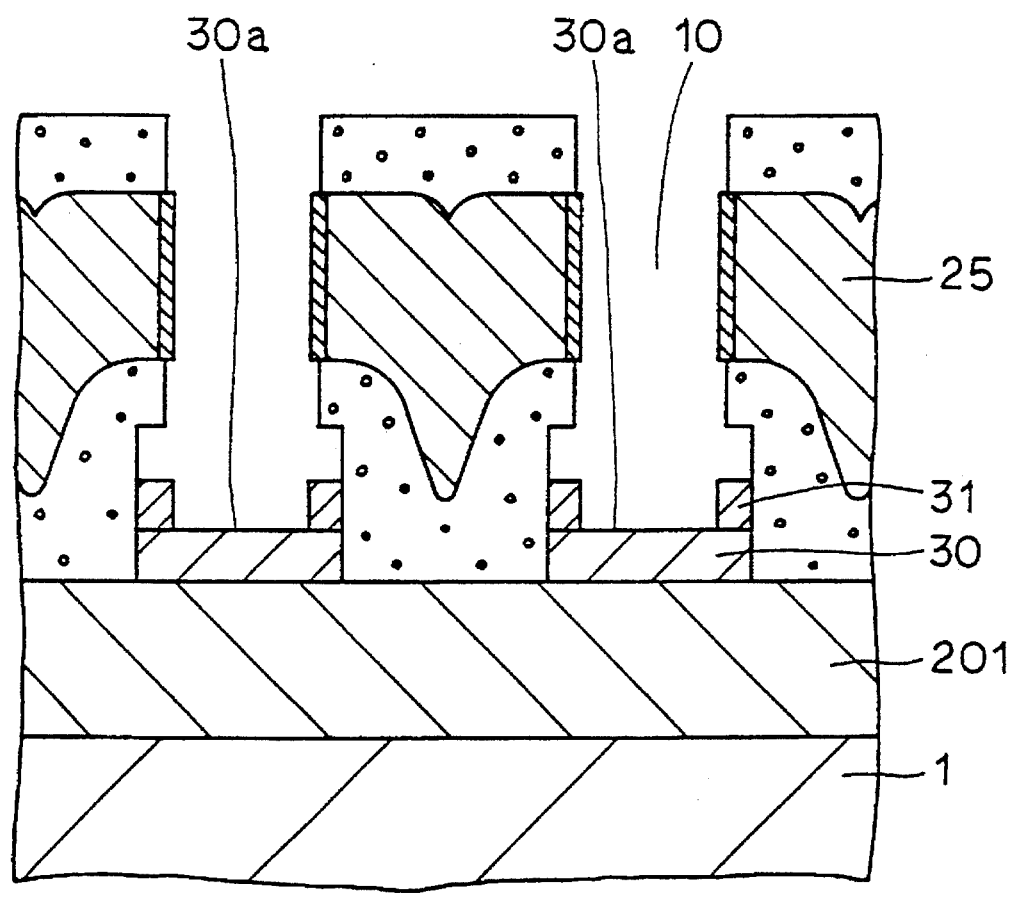

Referring to FIGS. 32 and 33, etching is effected on silicide 31 at the bottom of contact hole 10 of VΦT. Etching of silicide 31 exposes surface 30a of SOI layer 30, so that the channel of VΦT can be monocrystallized by the epitaxial growth.

Embodiment 9

This embodiment relates to a structure in which silicide is disposed under the bit line so as to reduce the resistance of bit line.

Figure 34:
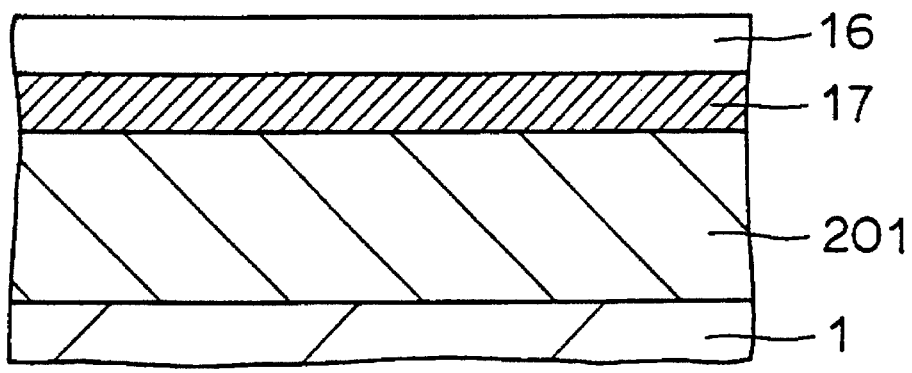
FIG. 34 shows a process of manufacturing a semiconductor device of an embodiment 9.

Referring to FIG. 34, silicide 17 is formed on SiO$_2$ layer 20. Polysilicon 16, which will form bit lines, is formed on silicide 17. This structure reduces the resistance of bit line. However, the channel of VΦT cannot be monocrystallized by the epitaxial growth if VΦT is formed on polysilicon 16 because the bit line is made of polysilicon.

In this case, a laminating method enable formation of the bit line which is provided by disposing monocrystal silicon on silicide.

Figure 35:
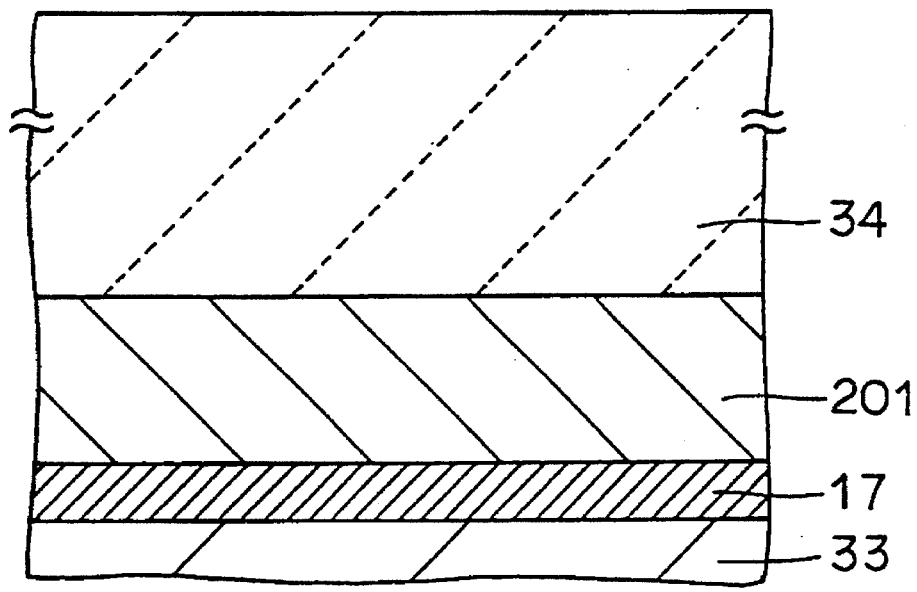
FIGS. 35 and 36 are cross sections of the semiconductor device at 1st and 2nd steps in a process of manufacturing the semiconductor device of embodiment 9, respectively.

More specifically, referring to FIG. 35, a second silicon substrate 34 is laminated to a first silicon substrate 33 on which silicide 17 and SiO$_2$ layer 201 are formed. The laminating is performed by a high temperature heat treatment causing adhesion of them. The second silicon substrate 34 is a mere support substrate, so that its material is not significantly restricted.

Figure 36:
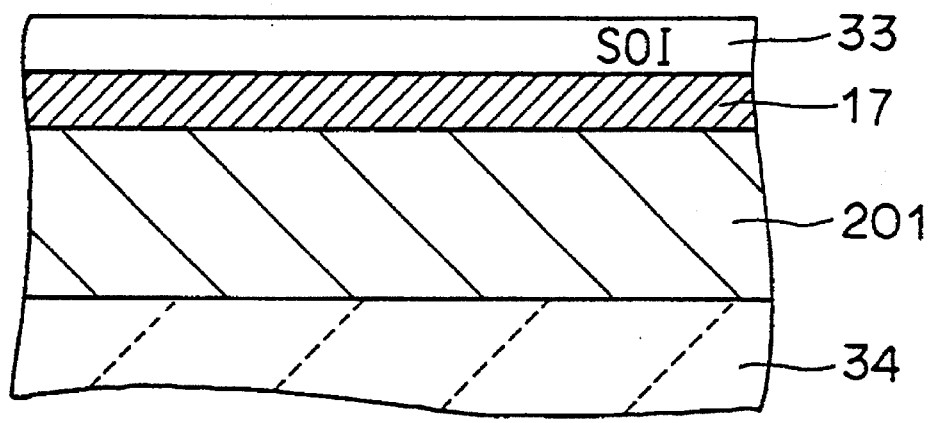

Referring to FIGS. 35 and 36, the structure is turned upside down and first silicon substrate 33 is polished by a chemical mechanical polishing (CMP) method to reduce the thickness. Thereby, a layer (33) for the bit line having the monocrystal silicon layer (SOI layer) is formed on silicide 17.

Thereafter, the same steps as those in embodiment 1 are performed, whereby VΦT-DRAM having the channel made of monocrystal is completed, and the resistance of bit line is reduced.

Embodiment 10

Figure 37:
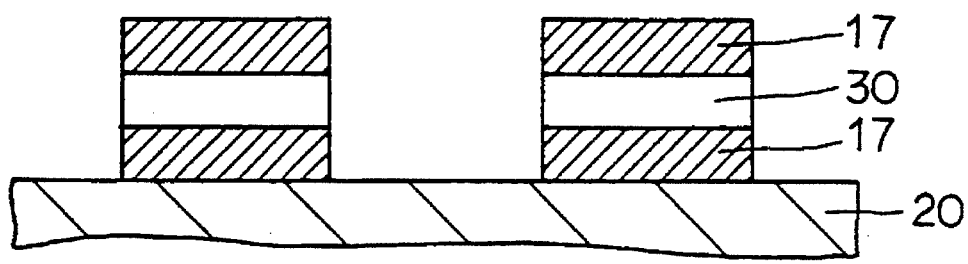
FIG. 37 is a cross section of a semiconductor device of an embodiment 10.
Figure 38:
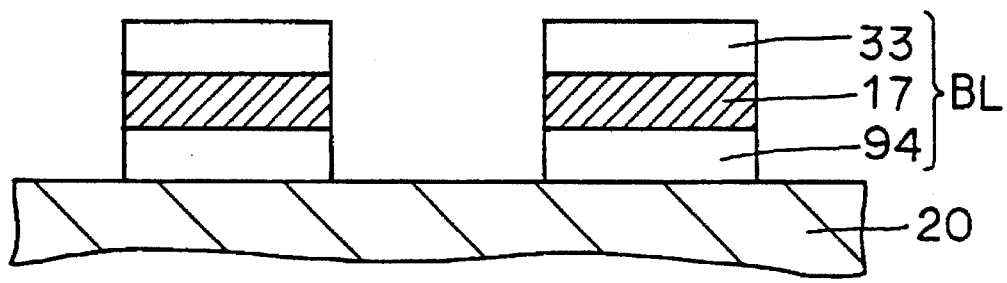
FIG. 38 is a cross section of another semiconductor device of embodiment 10.

This embodiment is aimed at further reduction of the resistance of bit line. Referring to FIGS. 36 and 37, additional silicide 17 is formed on monocrystal silicon layer 30, so that bit line includes layers of silicide 17 at upper and lower sides of monocrystal silicon layer 30 and thus has a further reduced resistance. In the device shown in FIG. 35, polysilicon 94 may be interposed between silicide 17 and SiO$_2$ layer 20, in which case the bit line can include polysilicon 30 located under silicide 17 as well as monocrystal silicon layer 33 located on silicide 17. This structure can also reduce the resistance of bit line.

Embodiment 11

This embodiment is likewise aimed at reduction of the resistance of bit line.

Figure 39:
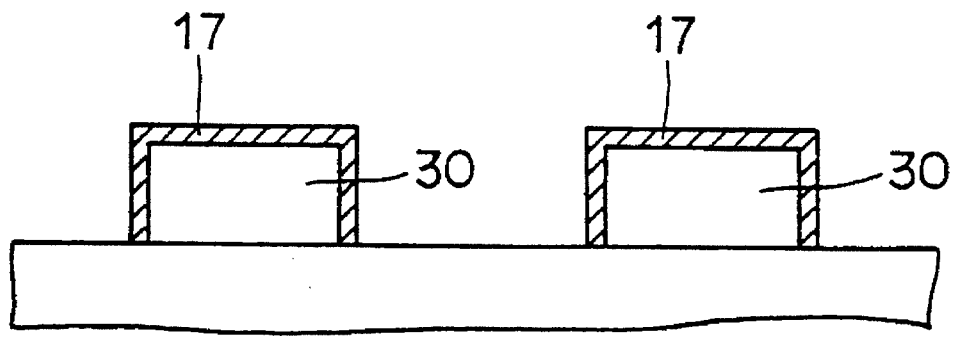
FIG. 39 is a cross section of a semiconductor device of an embodiment 11.

Referring to FIG. 39, salicide processing is effected on SOI layer 30, which will form the bit line, after patterning the same. Thereby, upper and opposite side (right and left) surfaces of bit line (30) is covered with silicide 17. Since the three surfaces of bit line (30) is covered with silicide 17, the resistance of bit line can be further reduced.

This embodiment may be combined with embodiment 9 employing the laminating method, so that four surfaces, i.e., upper, lower and opposite side surfaces of the bit line can be covered with silicide.

Embodiment 12

Figure 40:
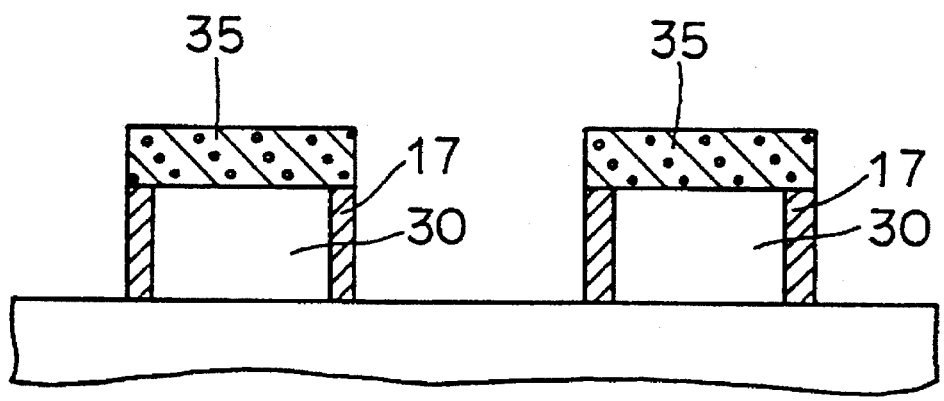
FIG. 40 is a cross section of a semiconductor device of an embodiment 12.

This embodiment is aimed at reduction of the resistance of bit line. Referring to FIG. 40, a film 35 for preventing silicidation is disposed on SOI layer 30, i.e., bit line. Owing to film 35 disposed on SOI layer 30 for preventing silicidation, silicide 17 can be formed only on the side surfaces of SOI layer 30, i.e., bit line. Although a resistance of bit line in this structure is higher than that of the structure shown in FIG. 39, the resistance of bit line in this structure can be sufficiently low because the bit line is provided at its opposite sides with silicide.

Film 35 for preventing silicidation may be an oxide film, and also may be a nitride film formed on the SOI layer similarly to that used in embodiment 1. The latter structure eliminates the step of forming a hole in the silicide similarly to embodiment 8. As a result, a VΦT-DRAM including bit lines of a low resistance can be obtained only by adding the step of silicidation to those in embodiment 1.

Embodiments 13 to 16, which will be described below, are aimed at reduction of a capacitance of the bit line.

Embodiment 13

The embodiment 13 is aimed at reduction of the capacitance of bit line for attaining high-speed operation of VΦT-DRAM.

Figure 41:
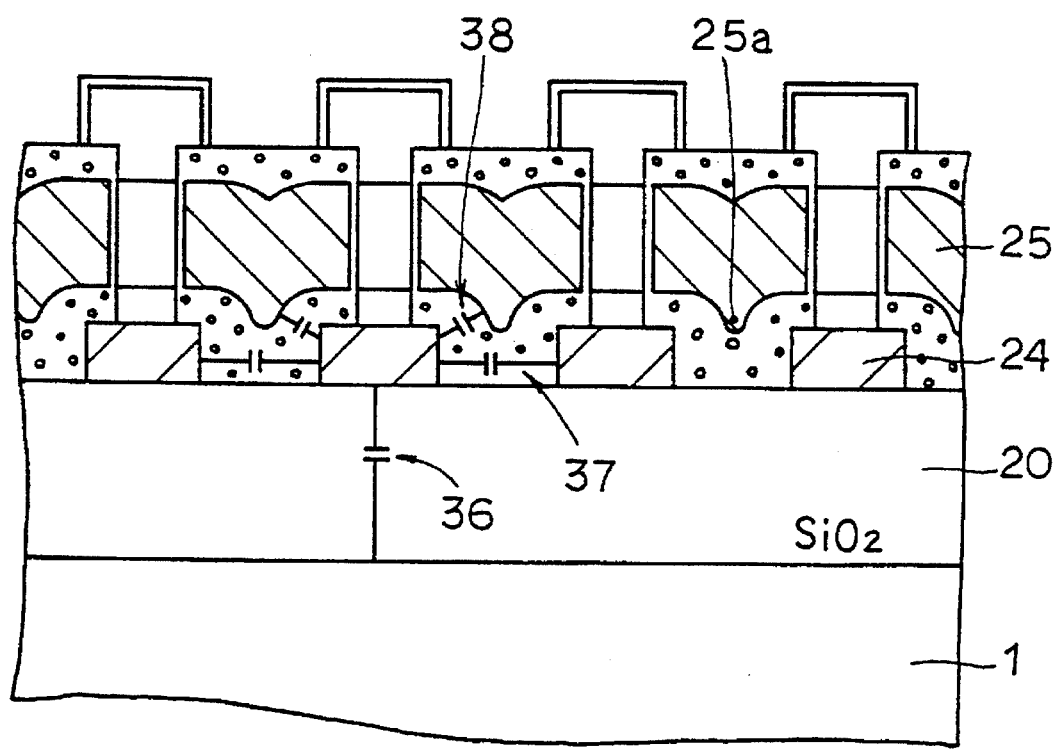
FIG. 41 shows purposes of embodiments 13 to 16.

Referring to FIG. 41, the bit line capacitance of VΦT-DRAM is nearly equal to a sum of a capacitance 361 between bit line and silicon substrate, a capacitance 371 between bit line and bit line, and a capacitance 381 between bit line and word line.

Figure 42:
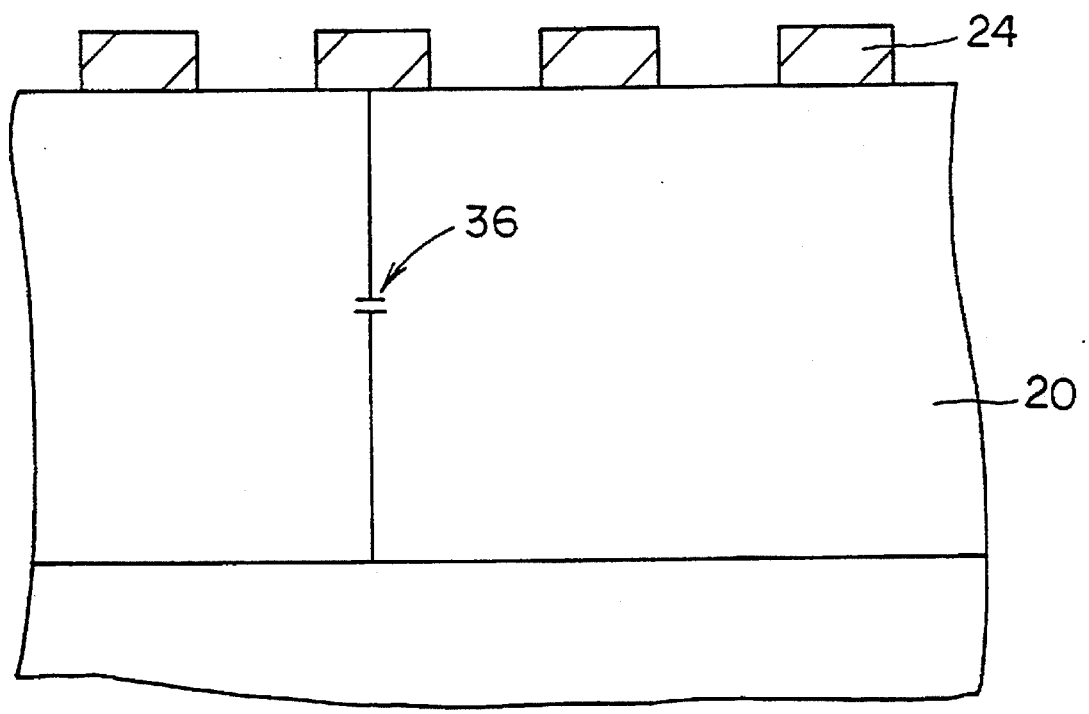
FIG. 42 is a cross section of a semiconductor device of an embodiment 13.

At the SOI substrate shown in FIG. 41, buried $SiO_2$ layer 20 is located under bit lines 24, i.e., SOI layer, so that capacitance 36 between bit line 24 and substrate 1 is very small. However, if SIMOX method is used to form the SOI substrate, the film thickness of buried $SiO_2$ layer 20 cannot be determined freely due to the manufacturing method. The film thickness of buried $SiO_2$ layer 20 is about 4000 Å. However, if the SOI substrate of the laminated structure is used, the film thickness of the buried $SiO_2$ layer can be determined freely. Referring to FIG. 42, VΦT-DRAM includes the SOI substrate having buried $SiO_2$ layer 20 of 0.5 µm or more in thickness, in which case capacitance 36 between bit line 24 and substrate 1 is sufficiently small, so that the operation speed of VΦT-DRAM can be increased further.

Embodiment 14

This embodiment is aimed at reduction of the capacitance between bit line and word line.

Referring to FIG. 41, a portion 25a of word line 25 is located in a groove between adjacent bit lines 24, so that capacitance 38 between word line 25 and bit line 24 is large.

Figure 43:
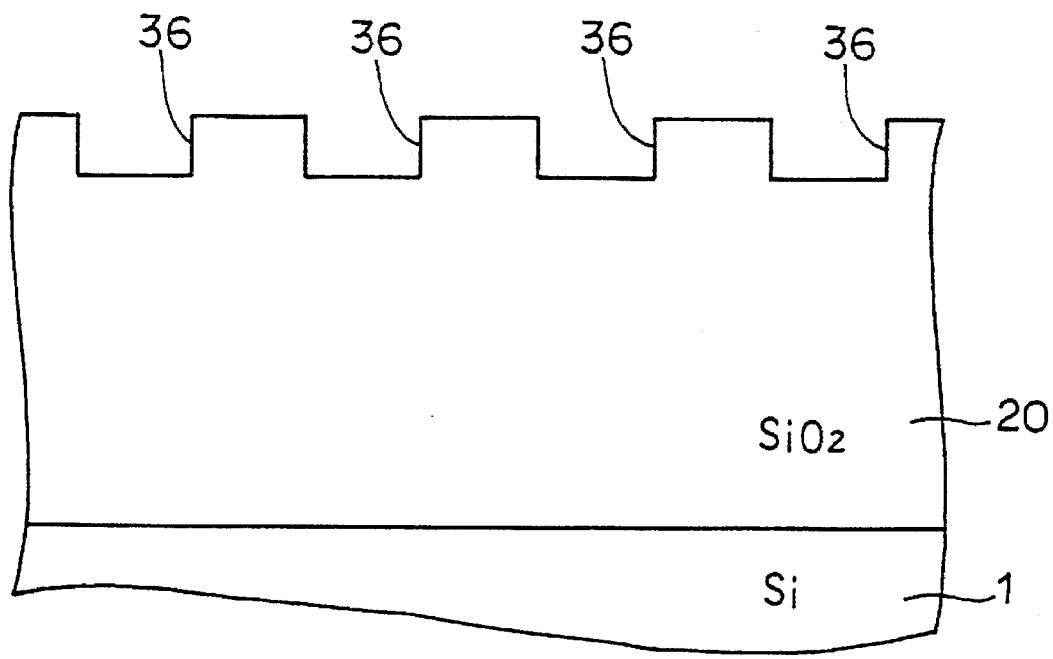
FIGS. 43 to 45 are cross sections of a semiconductor device at 1st to 3rd steps in a process of manufacturing the semiconductor device of an embodiment 14, respectively.
Figure 44:
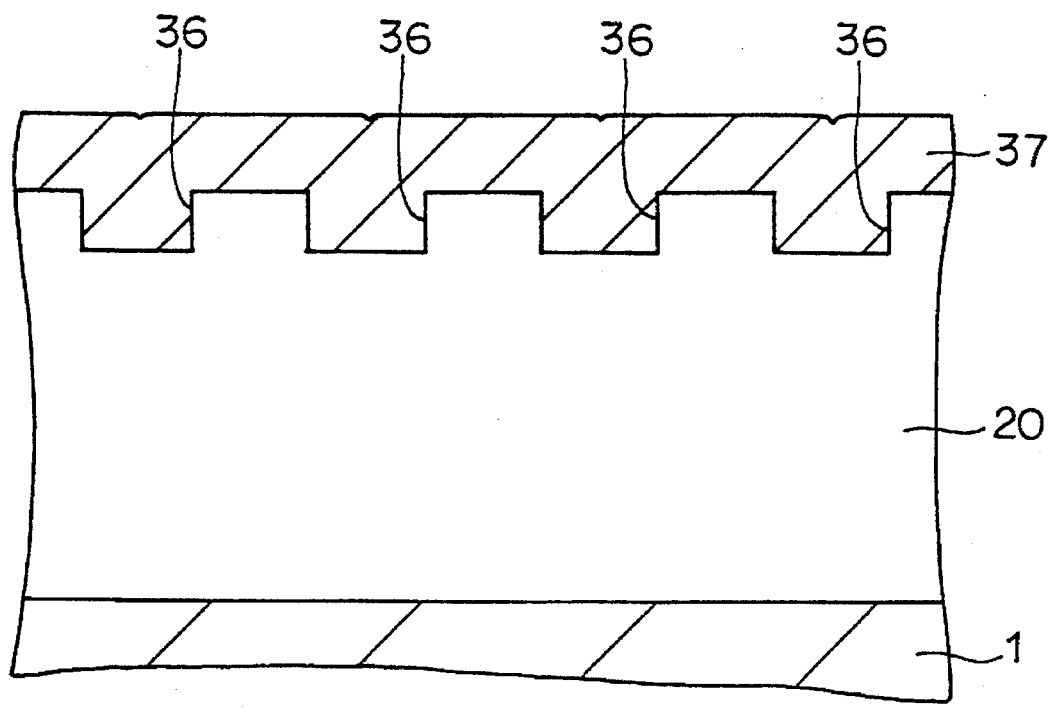
Figure 45:
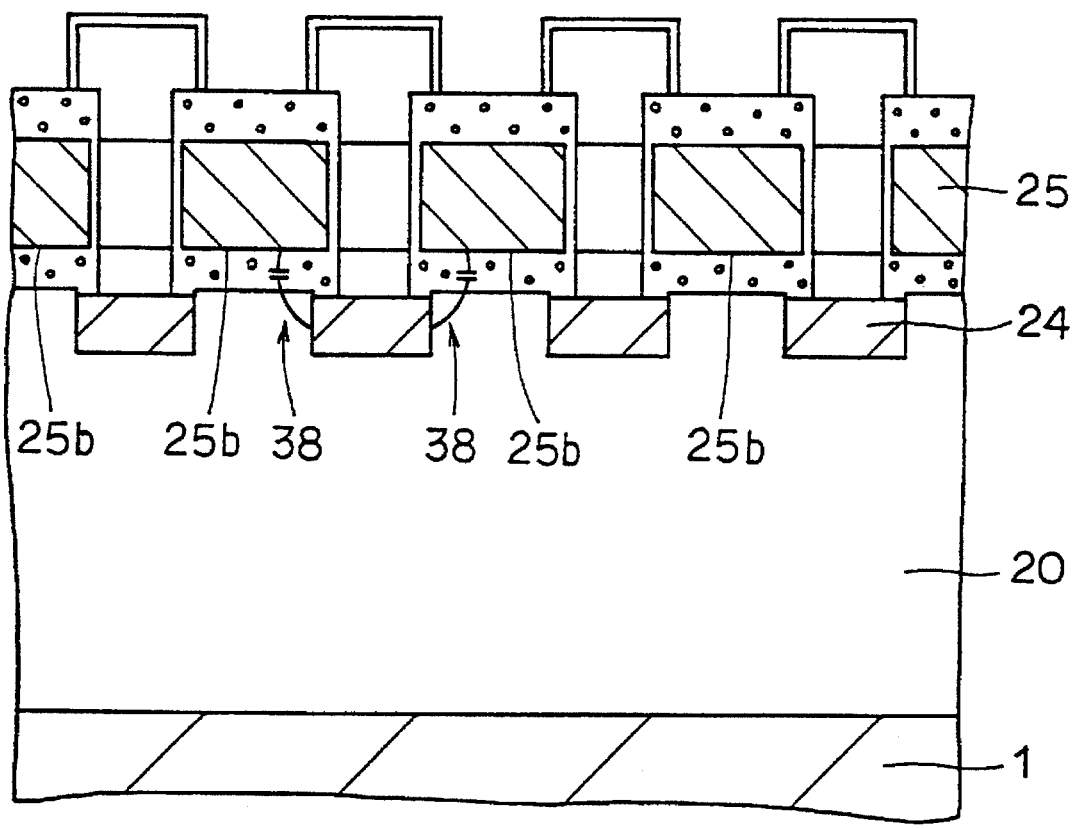

FIGS. 43 to 45 relate to an improved method of manufacturing a VΦT-DRAM which can reduce the capacitance between bit line and word line.

Referring to FIG. 43, grooves 36, each of which is complementary in sectional shape to the bit line, are formed at the surface of buried $SiO_2$ layer 20. Referring to FIG. 44, a polysilicon layer 37 filling grooves 36 is formed on buried $SiO_2$ layer 20. Referring to FIGS. 44 and 45, etch-back is effected on polysilicon layer 37 to form bit lines 24 filling grooves 36. By forming VΦT-DRAM on bit lines 24, word lines 25 having flat lower surfaces 25b are formed, whereby capacitance 38 between bit line 24 and word line 25 can be reduced.

Embodiment 15

This embodiment is likewise aimed at reduction of the capacitance between bit line and word line.

Figure 46:
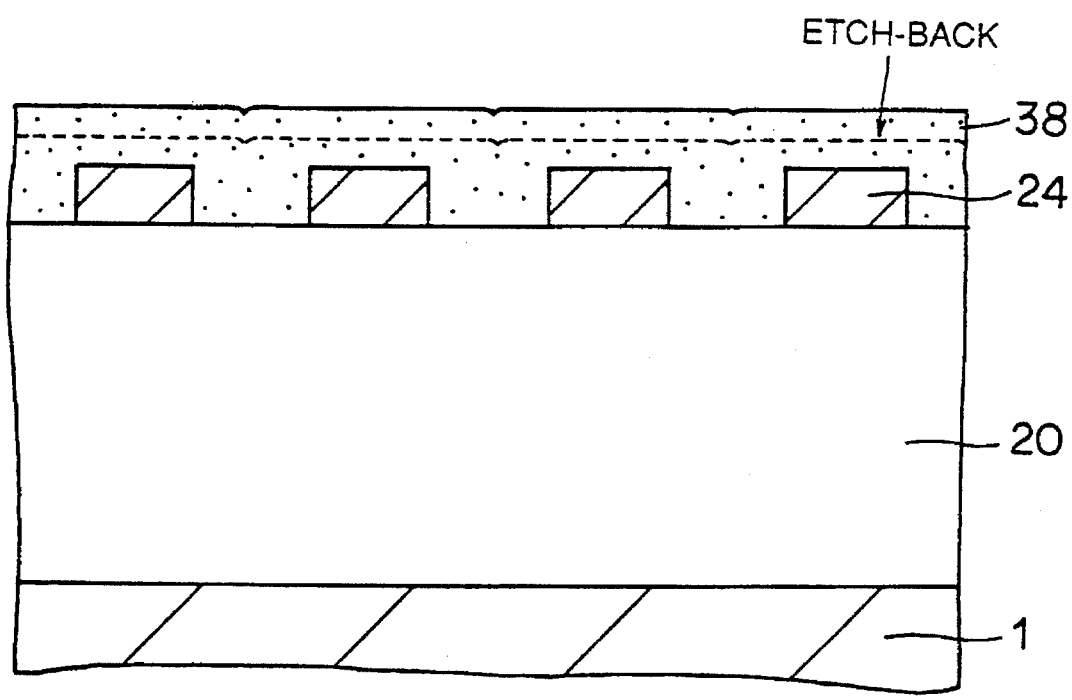
FIGS. 46 and 47 are cross sections of a semiconductor device at 1st and 2nd steps in a process of manufacturing the semiconductor device of an embodiment 15, respectively.
Figure 47:
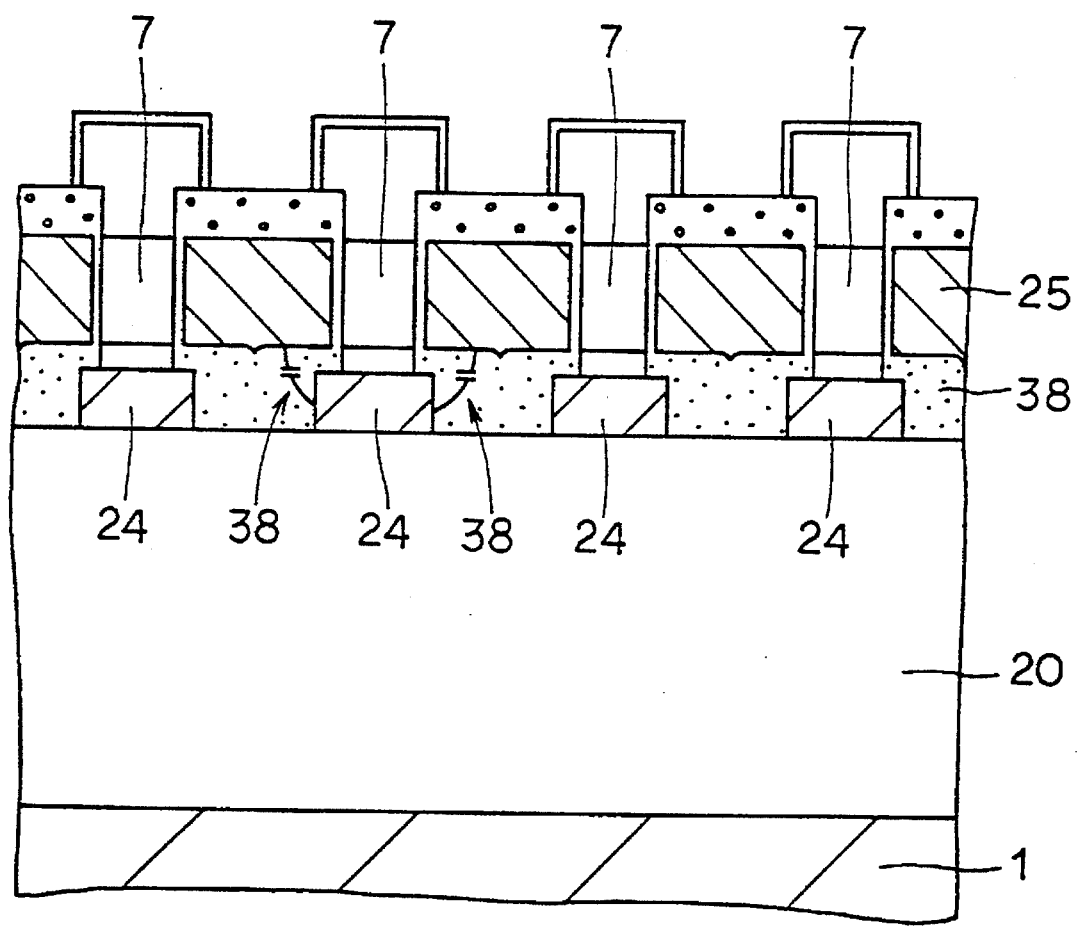

Referring to FIG. 46, bit lines 24 are formed on buried $SiO_2$ layer 20. Interlayer $SiO_2$ film 38 is deposited on buried $SiO_2$ layer 20 to cover bit lines 24. Interlayer $SiO_2$ film 38 is etched back to attain an intended height, and VΦT-DRAM is formed on interlayer $SiO_2$ film 38 as shown in FIG. 37. Since spaces between bit lines 24 are filled with interlayer $SiO_2$ film 38, VΦT-DRAM have a small capacitance between bit line 24 and word line 25. If bit line 24 in this structure is made of monocrystal, the channel 7 of VΦT is made of monocrystal.

Embodiment 16

This embodiment is likewise aimed at reduction of capacitance between bit line and word line.

Figure 48:
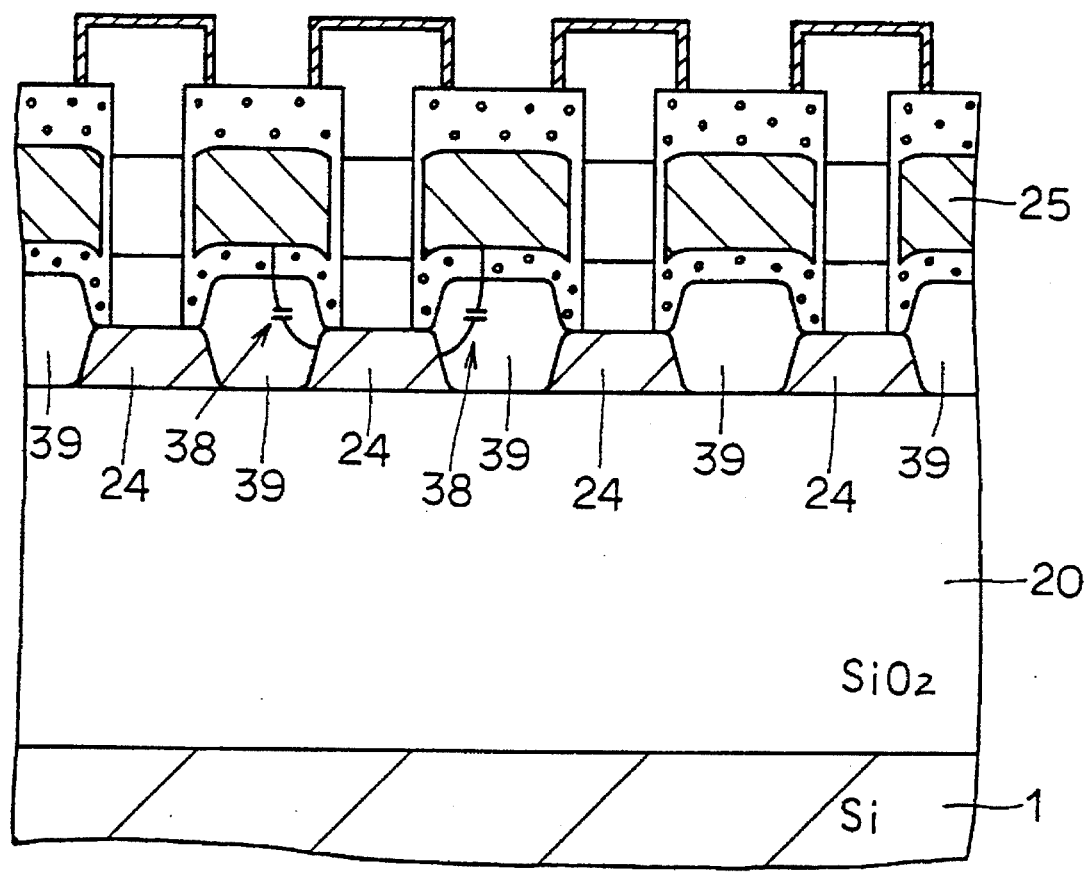
FIG. 48 is a cross section of a semiconductor device of an embodiment 16.

FIG. 48 is a cross section of a VΦT-DRAM of embodiment 16. Referring to FIG. 48, this embodiment includes bit lines 24 which are isolated from each other by LOCOS oxide films 391. Since word line 25 is further isolated from bit line 24 by LOCOS oxide film 391, capacitance 38 between bit line 24 and word line 25 can be reduced. Bit lines 24 isolated by LOCOS oxide films 391 can be formed by the following steps. LOCOS oxide films 391 are formed by oxidizing the surface of SOI layer (24) with a mask formed of a silicon nitride film (not shown) which is patterned into a predetermined configuration. Then, impurity is implanted through the silicon nitride film to form bit lines 24. The silicon nitride film used in the LOCOS step will be used again in the step of forming the VΦT gate insulating film by oxidation.

Figure 49:
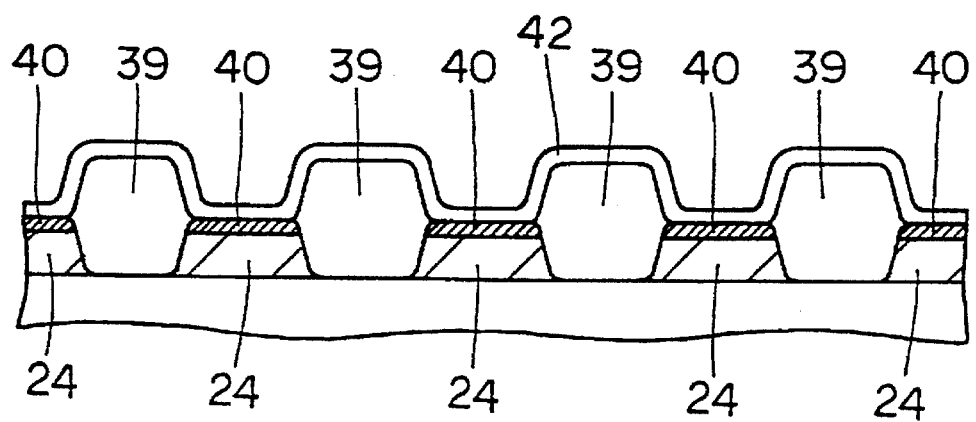
FIG. 49 is a cross section of another semiconductor device of embodiment 16.

If this embodiment is combined with the structure which includes the bit lines provided with silicide as employed in embodiment 11, it is necessary to deposit an SiN film 42 again, which is required for forming the gate insulating film of VΦT, after forming silicide layers 40 (TiSi, WSi) on the surface of bit lines 24 as shown in FIG. 49.

Embodiment 17

This embodiment relates to a margin between bit line and VΦT contact as well as a margin between word line and VΦT contact.

Figure 50:
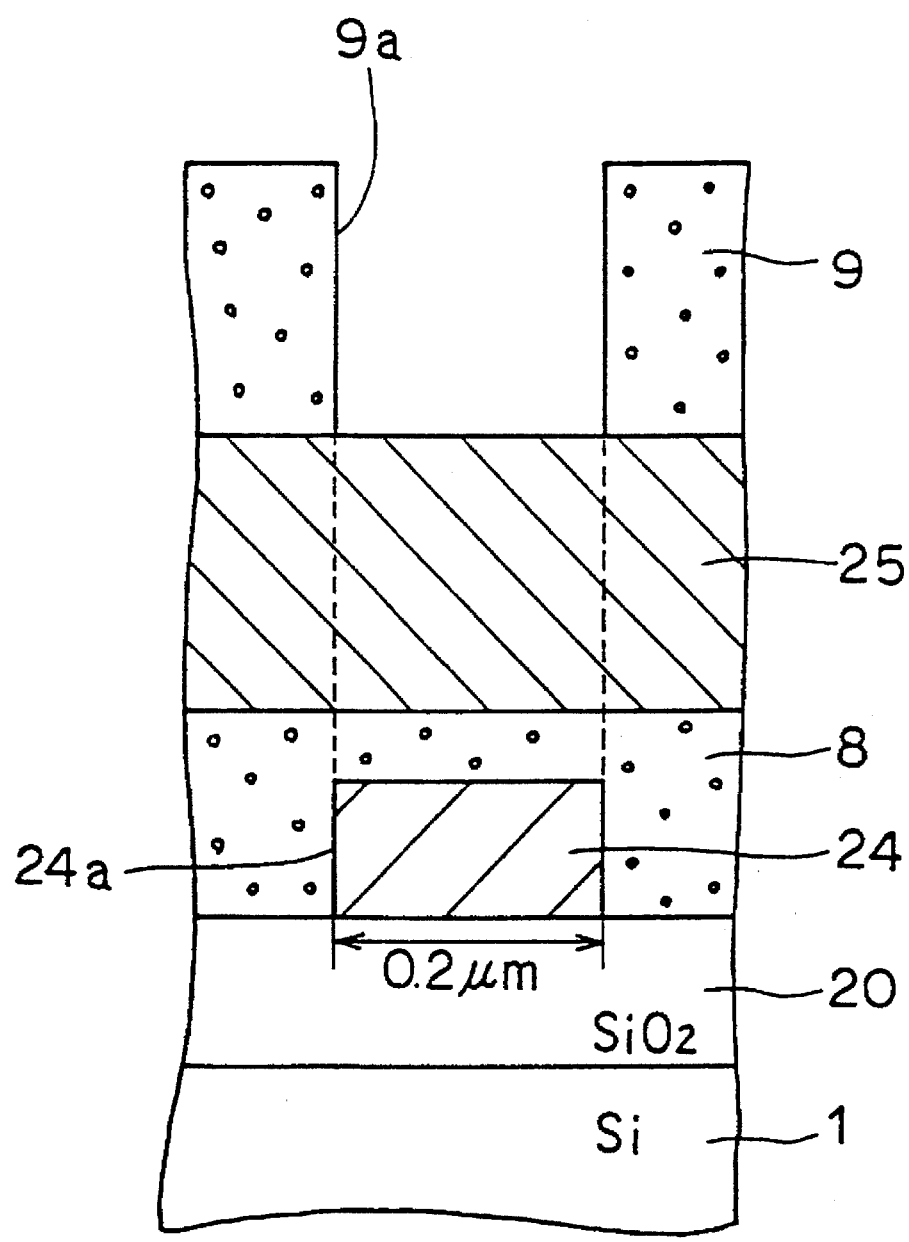
FIGS. 50 to 52 are cross sections of a semiconductor device at 1st to 3rd steps in a process of manufacturing the semiconductor device of an embodiment 17, respectively.

Referring to FIG. 50, bit line 24 is formed on buried $SiO_2$ layer 20. First interlayer insulating film 8 is formed on buried $SiO_2$ layer to cover bit line 24. Word line 25 is formed on first interlayer insulating film 8. Second interlayer insulating film 9 is formed on first interlayer insulating film 8 to cover word line 25. An opening 9a is formed at a position in second interlayer insulating film 9, where the contact hole of VΦT is to be formed. Although FIG. 50 shows a structure in which an edge 24a of bit line 24 is coincident with an edge (9a) of the contact hole of VΦT, they may be slightly shifted from each other due to shift of a mask. However, this shift causes no problem as will be described below.

This embodiment will be described below in connection with an example including bit line 24 having a width of 0.2 µm which corresponds to the minimum allowable line width.

Figure 51:
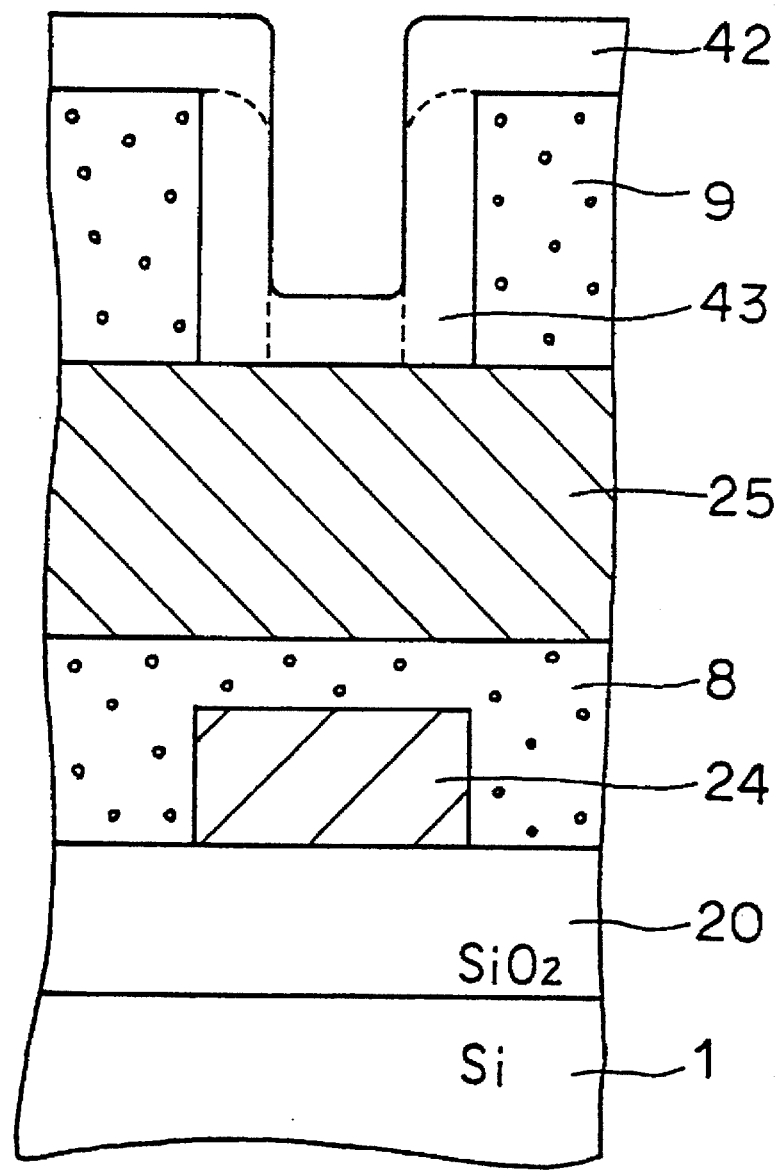

Referring to FIGS. 50 and 51, an $SiO_2$ film 42 of 500 Å in thickness is deposited such that it uniformly covers opening 9a in second interlayer insulating film 9. Dry etching is effected on $SiO_2$ film 42 to leave an $SiO_2$ film 43 in a side wall form as indicated by dotted line.

Figure 52:
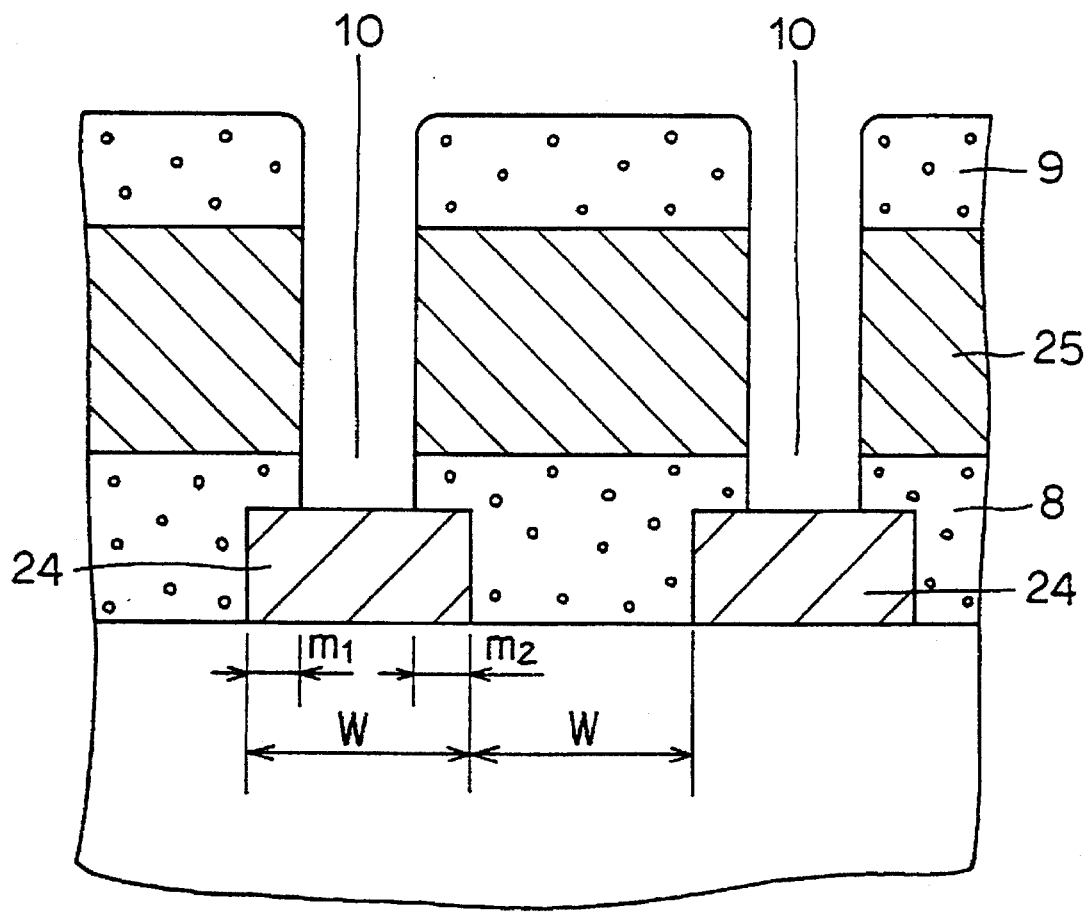
Figure 53:
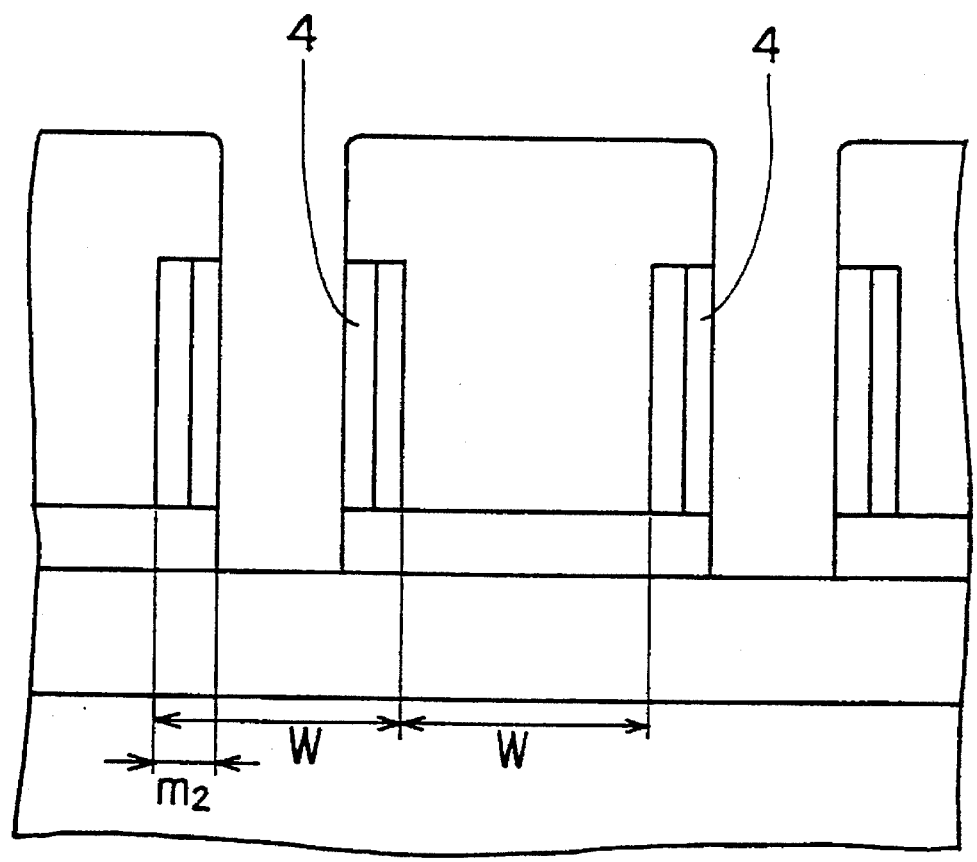
FIG. 53 is another cross section of the semiconductor device at the 3rd step in a process of manufacturing the semiconductor device of embodiment 17.

Thereafter, the contact hole of VΦT is formed with a mask formed of $SiO_2$ film 43 in the side wall form. FIG. 52 shows a section of contact hole 10 thus formed taken along line parallel to the word line, and FIG. 53 shows a section of the same taken along line parallel to the bit line. According to this method, as shown in FIG. 52, a margin $m_1$ between VΦT contact and bit line can be ensured within the minimum line width w. Referring to FIG. 53, a margin $m_2$ between VΦT contact and word line can be ensured within the minimum line width w. As a result, the cell size of $4F^2$ can be further reduced to $4r^2$. Here, r represents the minimum line width, and satisfies the relationship of F (feature size)=r+α (process margin).

This method can further reduce the diameter of channel of VΦT, and thus can produce the VΦT-DRAM which operate stably at a high speed and occupies a small area.

Embodiment 18

Embodiment 18A

This embodiment relates to a method of producing a VΦT-DRAM having a cell size of $4r^2$.

Figure 54:
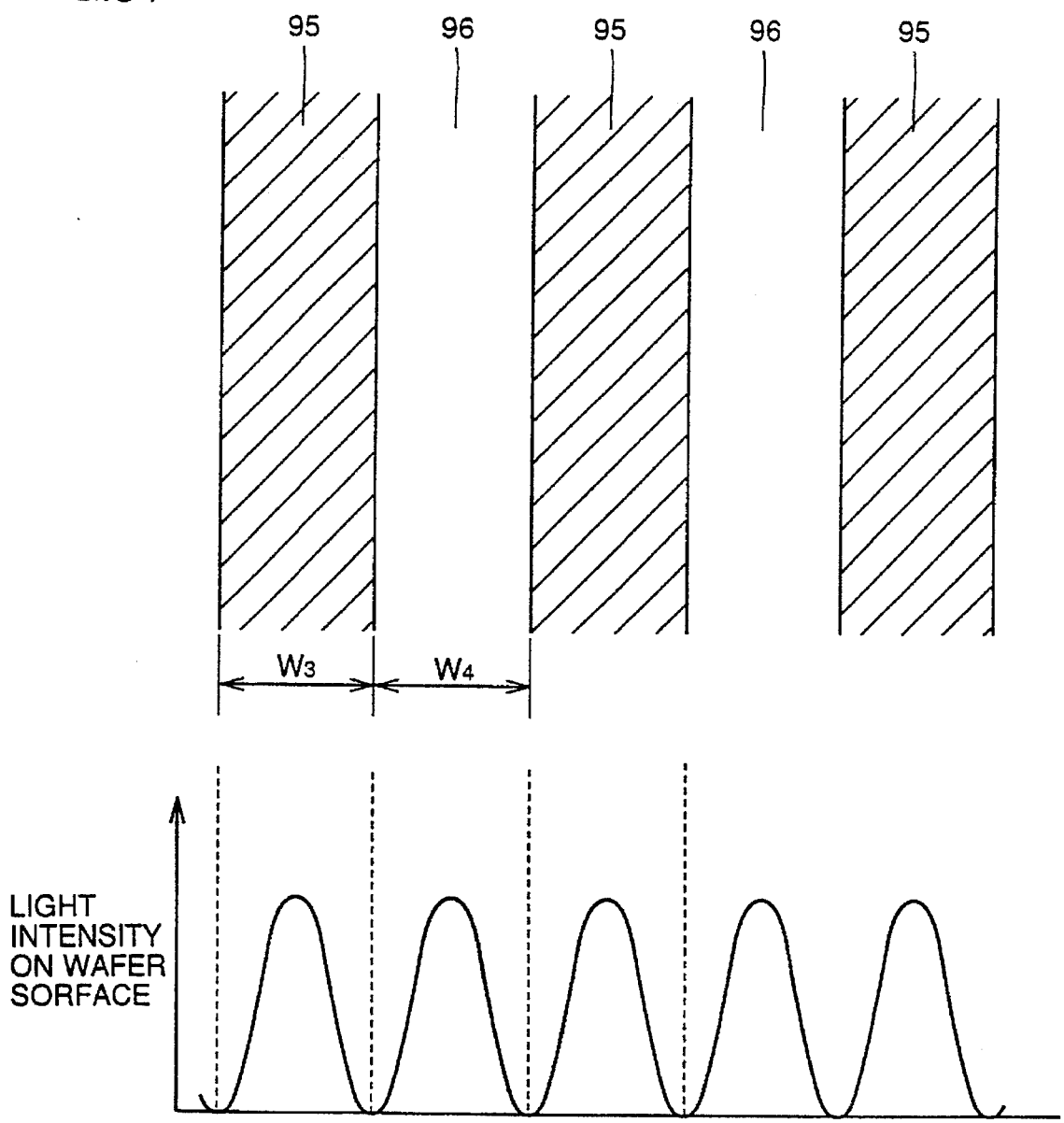
FIG. 54 is a plan of a photomask used in an embodiment 18A.
Figure 55:
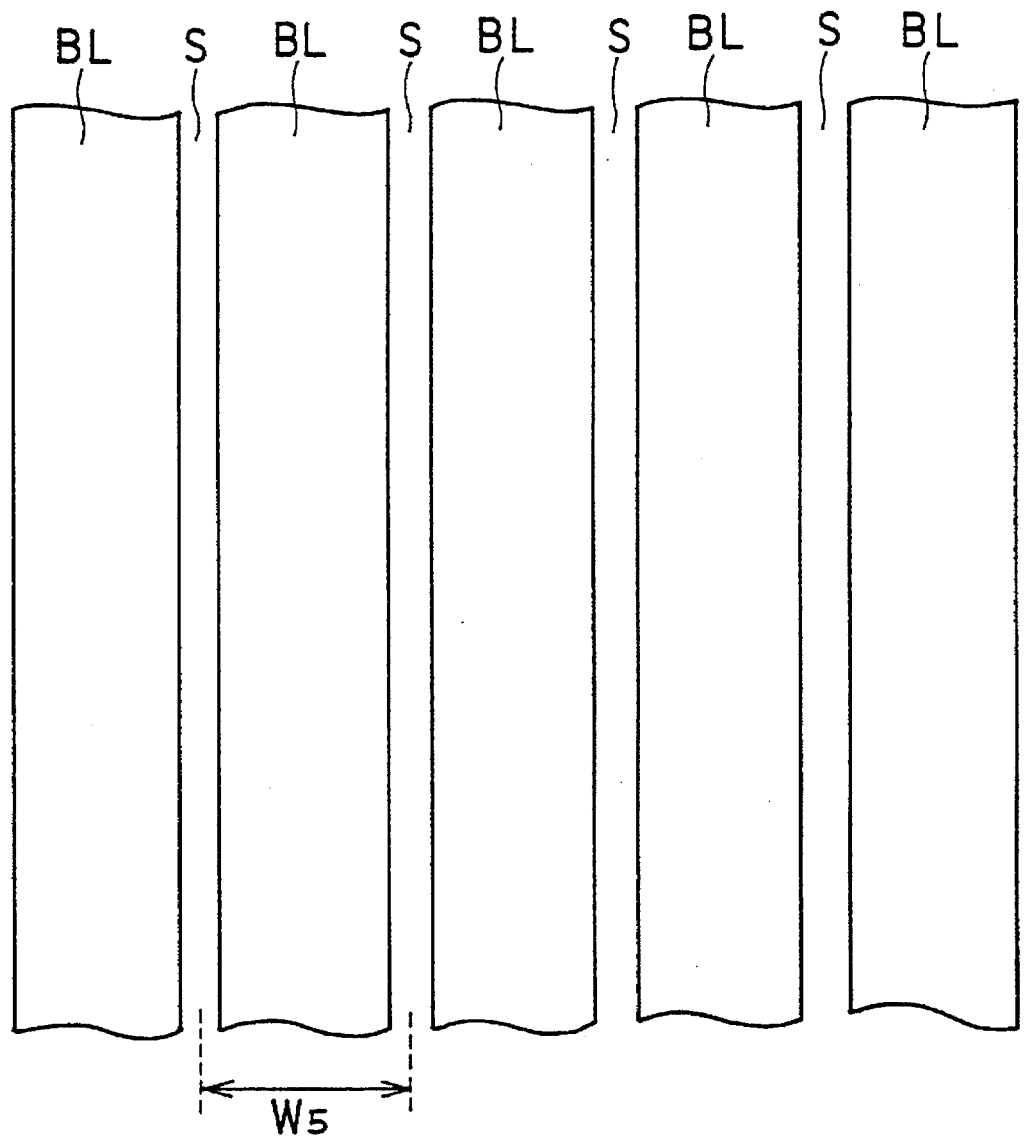
FIG. 55 is a plan of a VΦT-DRAM cell of embodiment 18A.

FIG. 54 is a plan of a photomask used for forming bit lines or word lines with a phase-shift mask. In FIG. 54, hatched portions 95 represent portions or shifters at which a phase of light shifts by 180°. A phase shift of light is 0° at portions 96 between adjacent hatched portions 95. A width $W_3$ of the shifter and a width $W_4$ between the shifters each are double the minimum line width. FIG. 54 shows intensity of light, which is irradiated to the above photomask, on a wafer surface. When the processing is performed with the above photoresist and a negative resist, portions exposed to the light beams will be left after development. Therefore, an exposure time can be appropriately adjusted to form a wide bit line (BL) and a narrow space S defined between bit lines BL within a width ($W_5$) of double the minimum line width.

The word lines may be formed in a similar manner, whereby contact holes of VΦTs of the minimum line width (minimum size) can be formed at the crossings of word lines and bit lines, and thus VΦT-DRAM of the cell size of $4r^2$ can be formed.

In this specification, "$4F^2$" contains "$4r^2$" unless otherwise noted.

Embodiment 18B

Figure 56:
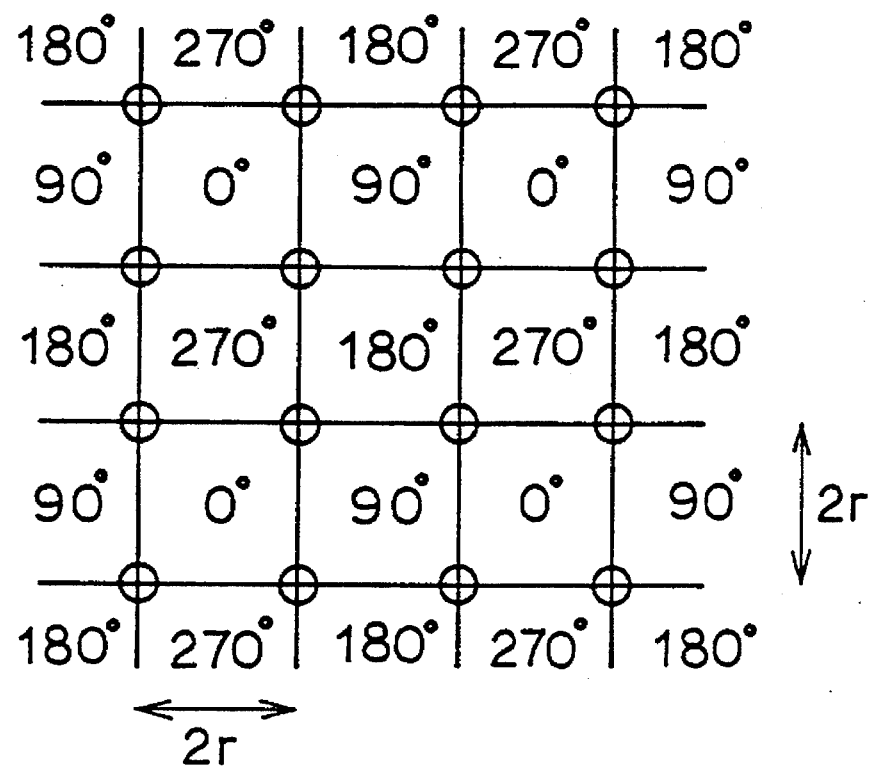
FIG. 56 is a plan of a photomask used in an embodiment 18B.

FIG. 56 is a plan showing a photomask used in this embodiment. The photomask consists of 0°-phase shifters, 90°-phase shifters, 180°-phase shifters and 270°-phase shifters. 0°, 90°, 180° and 270° represent phases of light shifted by the phase shifters. Since the intensity of light is 0 at a position where the light beams applied from the four kinds of shifters overlap each other. Therefore, small openings are formed only at vicinities of the crossings of boundaries between the shifters.

Figure 57:
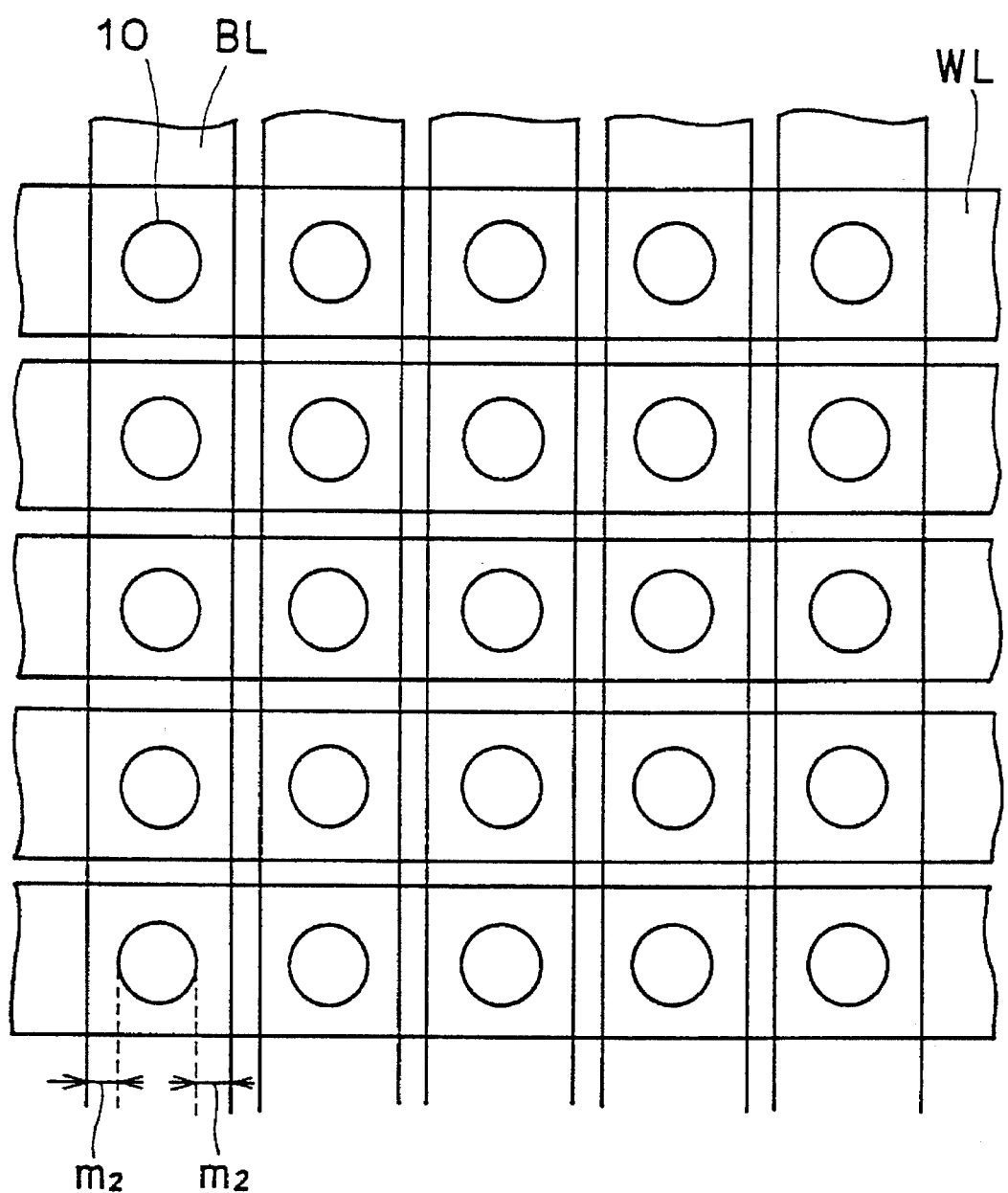
FIG. 57 is a plan of contact holes of VΦTs of embodiment 18B.

If the contact holes of VΦTs are formed with the photomask shown in FIG. 56 and the negative, contact holes 10 can have a size smaller than the minimum size as shown in FIG. 57. In FIG. 57, m2 represents a process margin.

A method of manufacturing the photoresist shown in FIG. 56 will be described below. Referring to FIG. 57, first SiN film 90a, first SiO$_2$ film 90b, second SiN film 90c, second SiO$_2$ film 90d, third SiN film 90e, third SiO$_2$ film 90f and fourth SiN film 90g are deposited on a crystal substrate 90 in this order. A sum of film thicknesses of the SiN films and SiO$_2$ films are determined to correspond to the phase of light of 90°.

Figure 121:
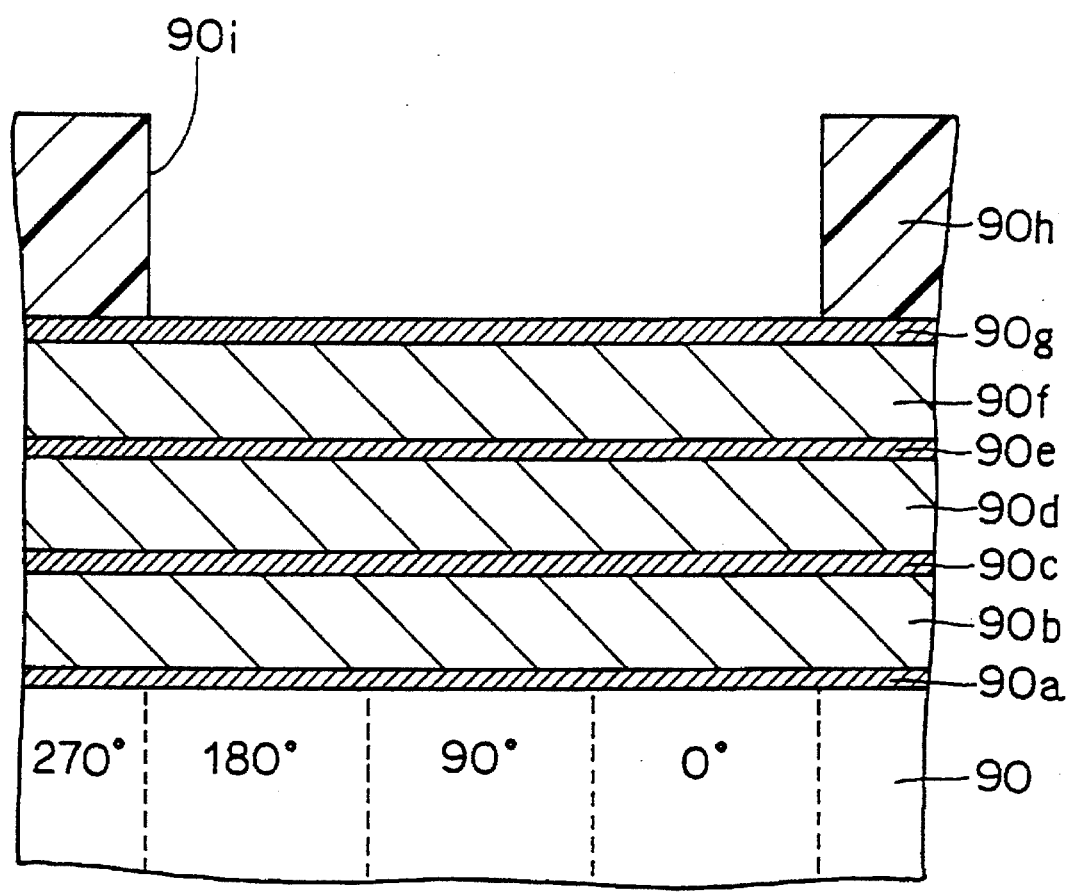
FIGS. 121 to 126 are cross sections of a substrate at 1st to 6th steps in a process of manufacturing a photomask shown in FIG. 56, respectively.

Then, a resist 90h is formed on fourth SiN film 90g. Resist 90h is patterned to form openings 90i only at portions at which phase shifts of 0°, 90° and 180° are to be set. In FIG. 121, the shifters of 0°, 90°, 180° and 270° are shown as if they are aligned laterally for sake of illustration, the shifters are actually disposed in a matrix form as shown in FIG. 56.

Figure 122:
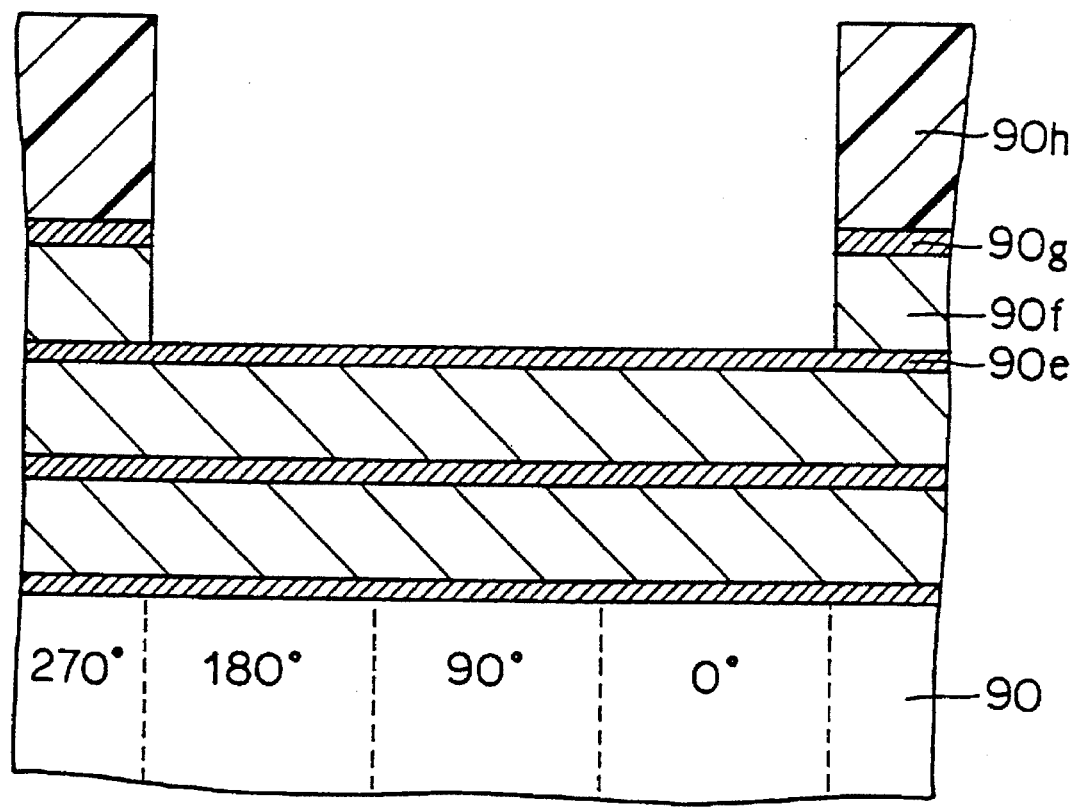

Referring to FIG. 122, fourth SiN film 90g and third SiO$_2$ film 90f are etched using resist 90h as a mask. In this step, third SiN film 90e serves as an etching stopper. Therefore, the etching is effected through a constant thickness. After the etching, resist 90h is removed.

Figure 123:
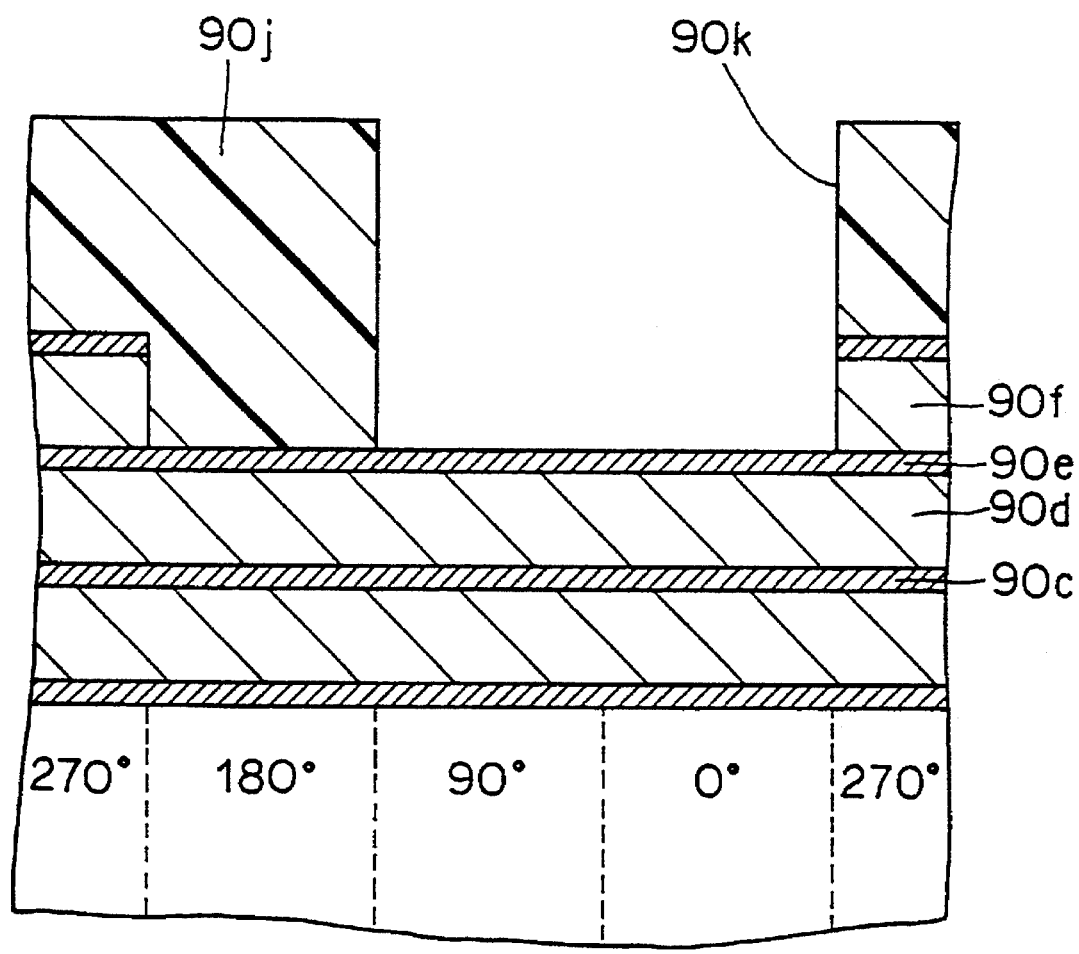
Figure 124:
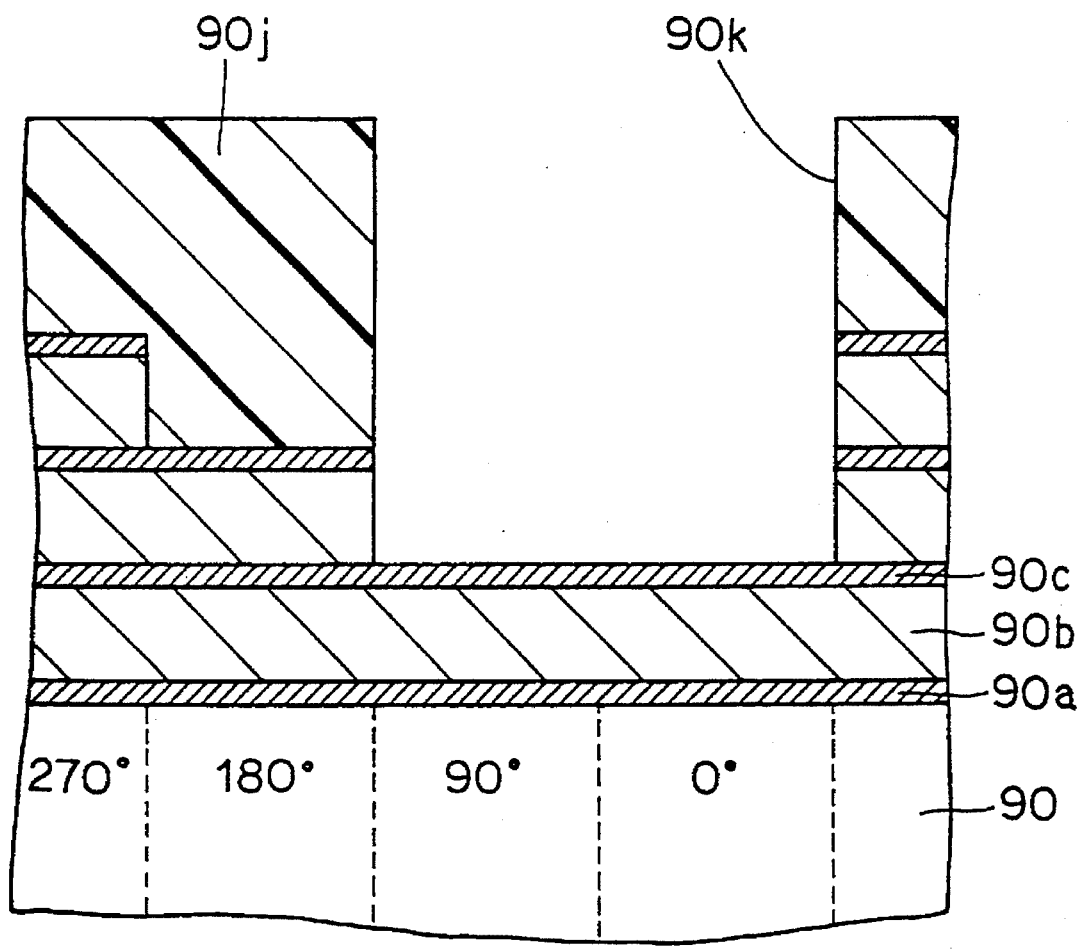

Referring to FIG. 123, a resist 90j is formed on crystal substrate 90. Openings 90k are formed only at portions in resist 90j where phase shifts of 0° and 90° are to be set. Referring to FIG. 124, third SiN film 90e and second SiO$_2$ film 90d are etched with a mask formed of resist 90j. In this step, second SiN film 90c serves as an etching stopper. After the etching, resist 90j is removed.

Figure 125:
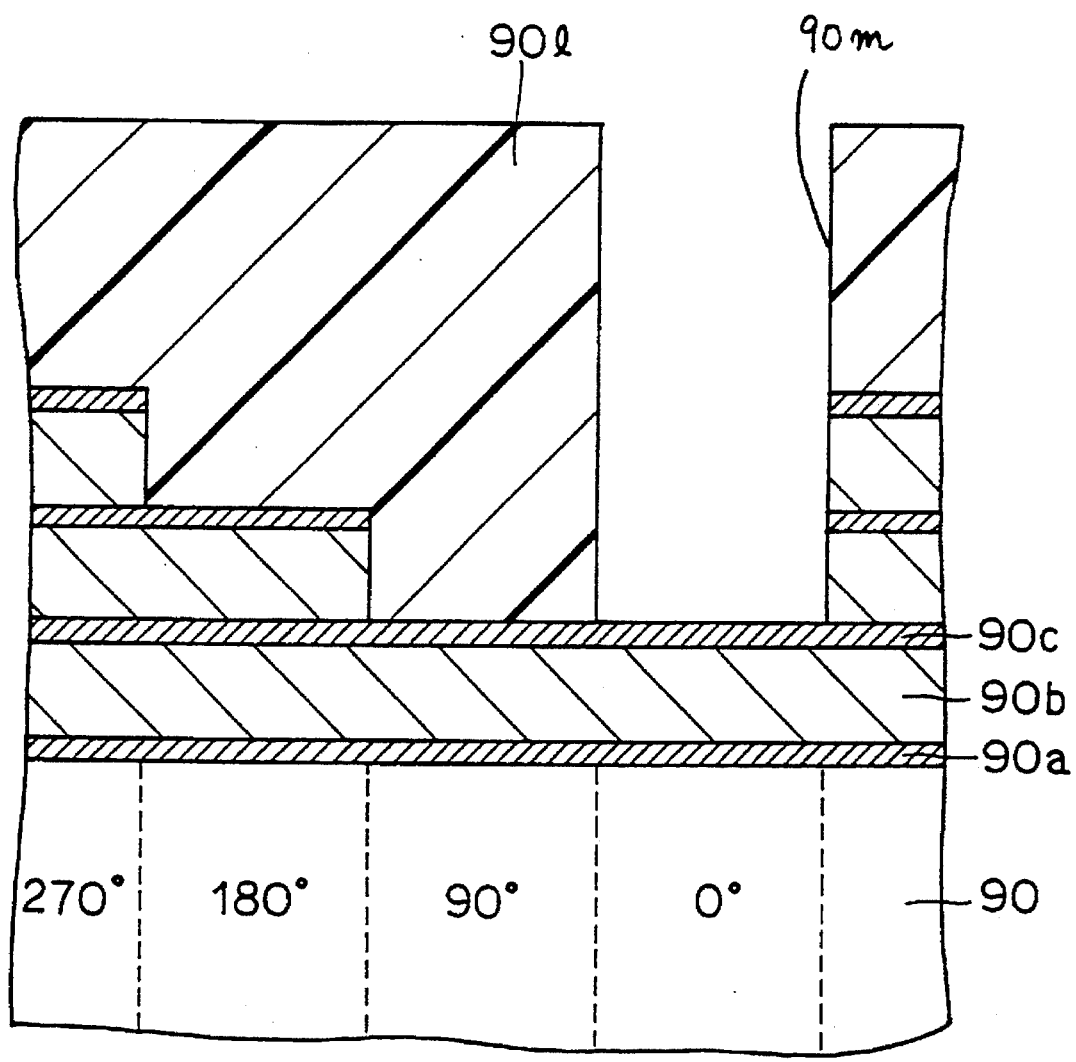
Figure 126:
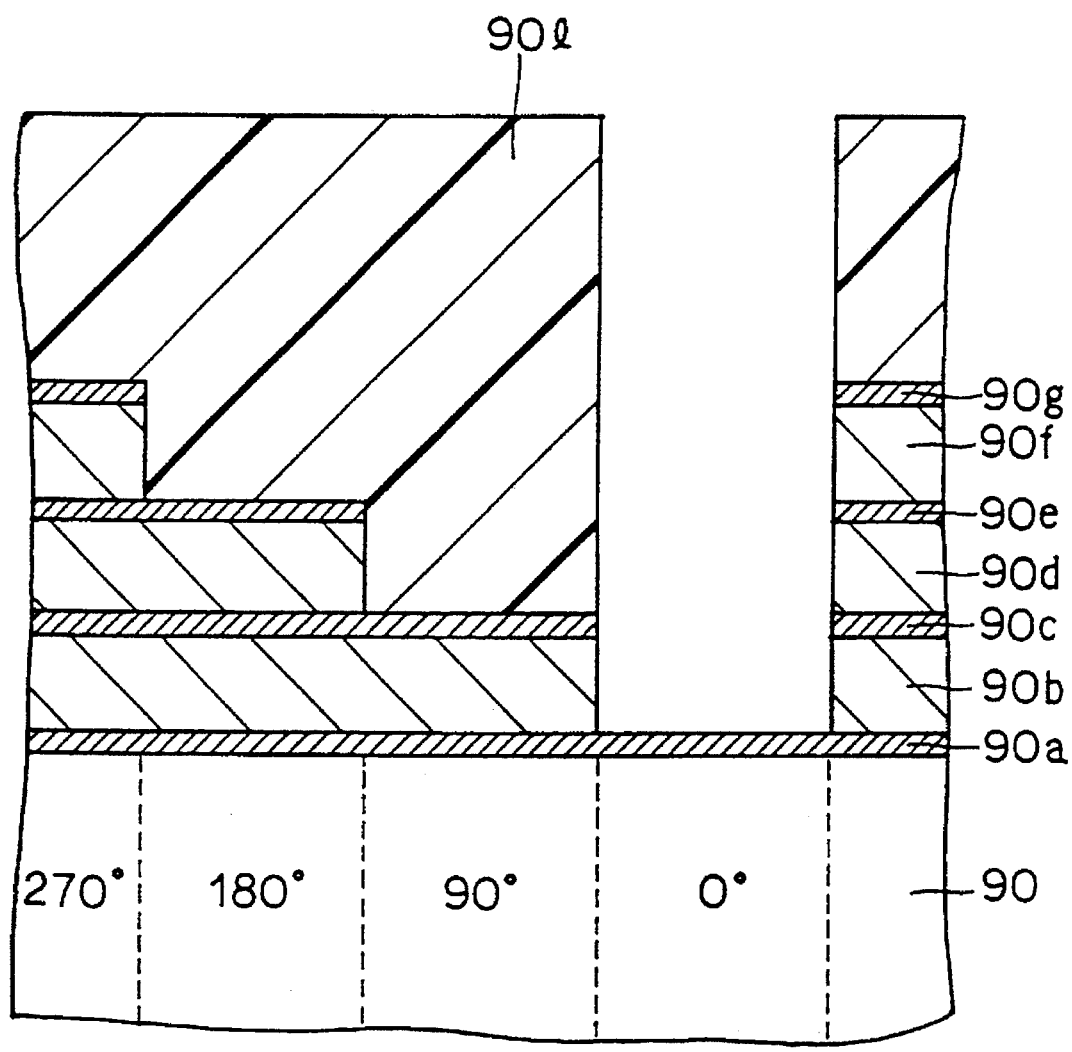

Referring to FIG. 125, a resist 90l is formed on crystal substrate 90. Resist pattern 90l is patterned so that openings 90m may be formed only at portions in resist 90l where phase shift of 0° is to be set. Referring to FIG. 126, second SiN film 90c and first SiO$_2$ film 90b are etched with a mask formed of resist 90l. In this step, first SiN film 90c serves as an etching stopper. After the etching, resist 90 is removed, whereby the photomask is completed.

Except for first SiN film 90a, nothing exists at the portion of the phase shift of 0° on crystal substrate 90. First SiN film 90a, first SiO$_2$ film 90b and second SiN film 90c exist on the portions of the phase shift of 90°, and the sum of thicknesses of these films corresponds to the phase shift of light equal to 90°.

Therefore, the light beams passed through the portions of phase of 90° have the phase difference of 90° with respect to the portion of the phase of 0°.

Likewise, the light beams passed through the portions of phases of 180° and 270° have the phase differences of 180° and 270° with respect to the portion of the phase of 0°, respectively.

Figure 127:
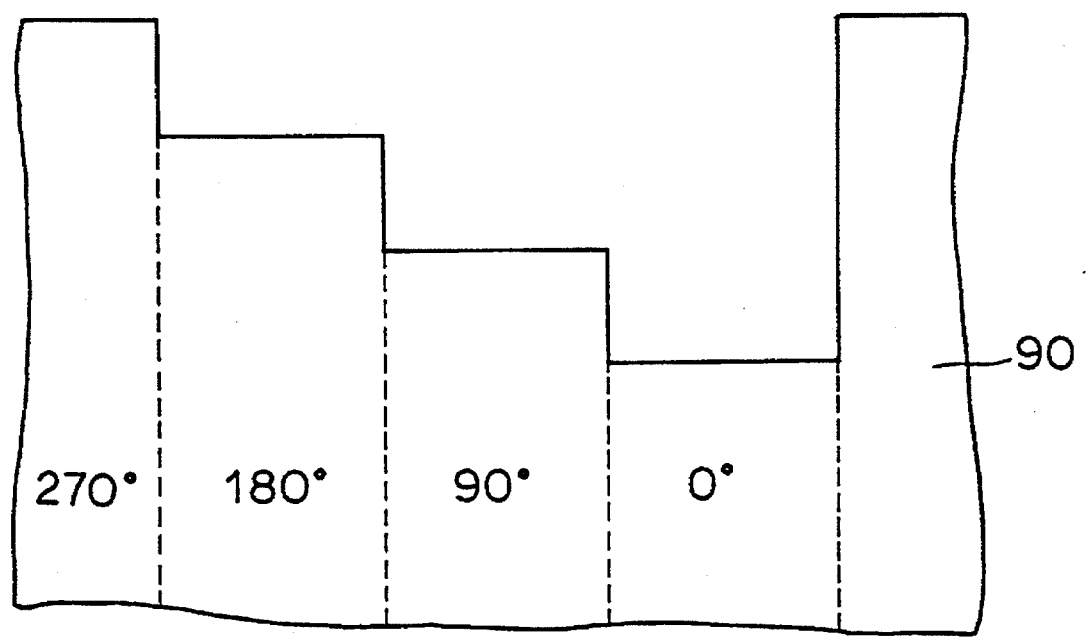
FIG. 127 shows another process of manufacturing the photomask shown in FIG. 56.

Referring to FIG. 127, the photomask shown in FIG. 56 may be obtained also by a method in which the surface of crystal substrate 90 is shaved by amounts corresponding to respective phase differences by FIB.

Embodiments 19 to 21 which will be described below are aimed at improvement of the voltage resistance of gate of VΦT.

Embodiment 19

Embodiment 19 is aimed at improvement of the voltage resistance of gate of VΦT.

Figure 58:
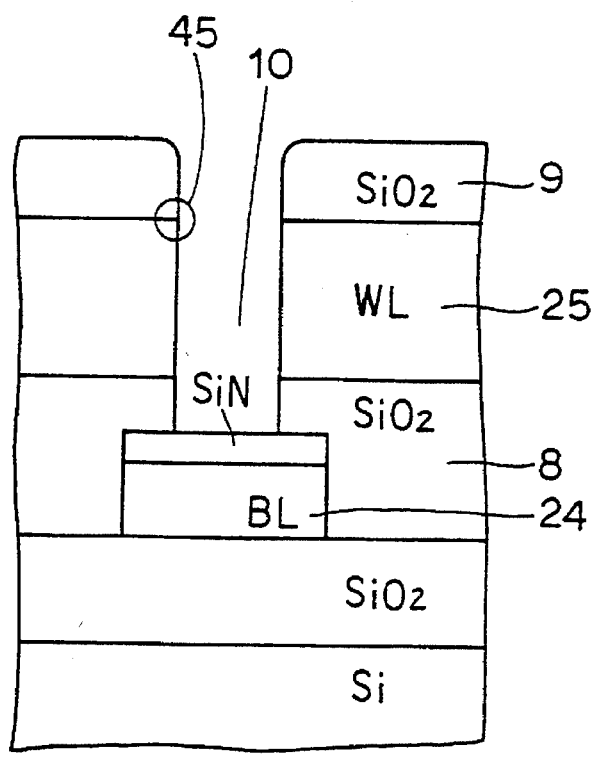
FIGS. 58 and 59 are cross sections of a semiconductor device at 1st and 2nd steps in a process of manufacturing the semiconductor device of an embodiment 19, respectively.

FIG. 58 is a cross section of the device at a stage after formation of contact hole 10 which penetrates second interlayer insulating film (SiO$_2$) 9, word line (WL) 3 and first interlayer insulating film (SiO$_2$) film 8 and is provided for exposing the surface of bit line (BL). On the surface of bit line (BL), there is formed a silicon nitride film (SIN) for preventing oxidation of the surface of bit line.

Figure 59:
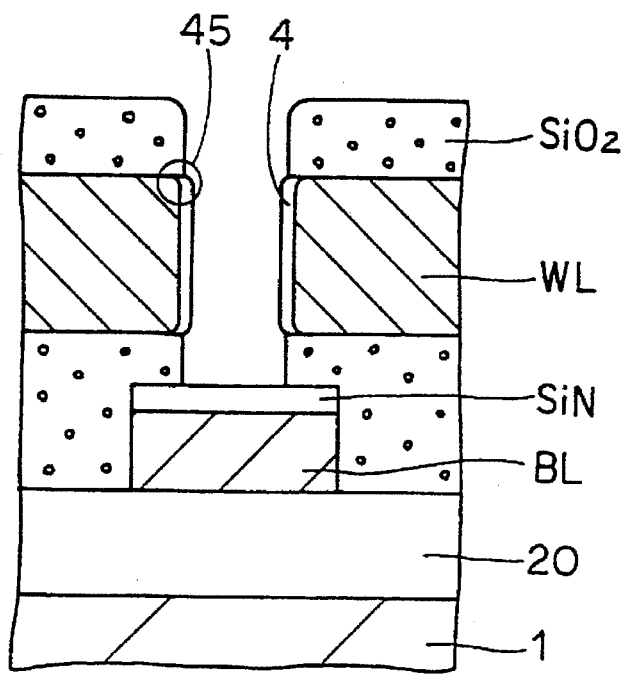

Referring to FIGS. 58 and 59, gate insulating film 4 is formed by a dry O$_2$ oxidation method at 1100° C., whereby word line (WL) can have a round edge 45. The round shape of edge 45 of word line (WL) can suppress concentration of electric field at edge 45, and thus can improve the voltage resistance of the gate.

Embodiment 20

This embodiment is likewise aimed at improvement of the voltage resistance of the gate of VΦT.

Figure 60:
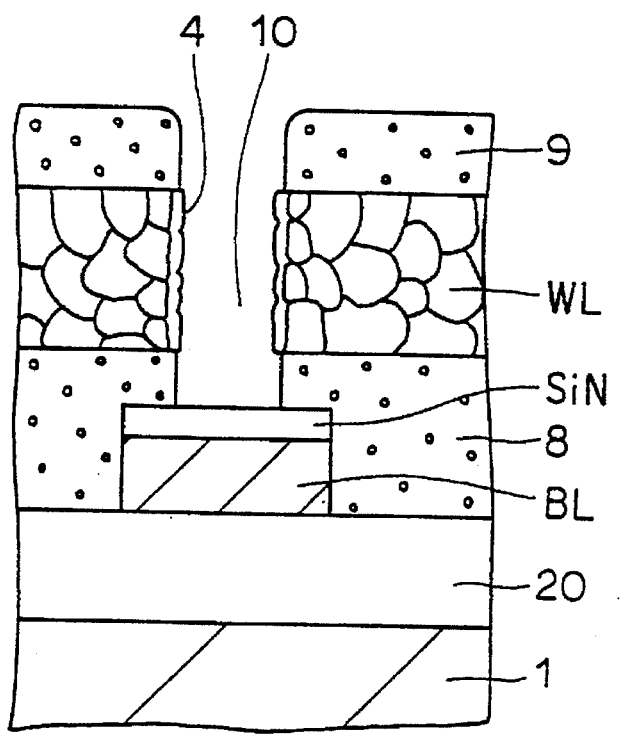
FIG. 60 is a cross section of a semiconductor device of an embodiment 20.
Figure 61:
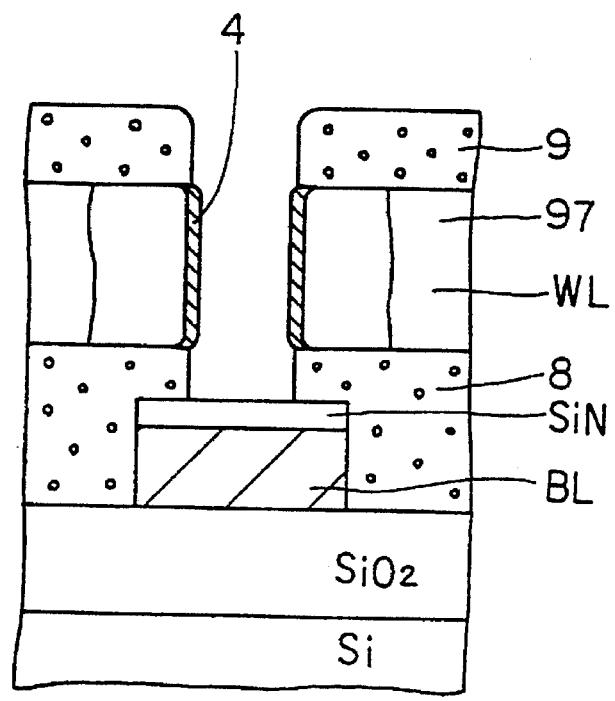
FIG. 61 is a cross section of a semiconductor device of an embodiment 21.

FIG. 60 shows this embodiment. Bit line (BL) is formed on buried SiO₂ layer 20. The silicon nitride film (SIN) is formed on bit line (BL). First interlayer insulating film (SiO₂) 8 is formed on buried SiO₂ layer 20 to cover bit line (BL). Word line (WL) made of doped polysilicon is disposed on first interlayer insulating film 8. Second interlayer insulating film 9 is formed on first interlayer insulating film 8 to cover word line (WL). Contact hole 10 penetrates second interlayer insulating film 9, word line (WL) and first interlayer insulating film 8. Side surfaces of word line (WL) made of doped polysilicon are oxidized to form gate insulating film 4. Referring to FIG. 60, if the doped polysilicon is made of fine or small grains, irregularities are formed on the surface of gate insulating film 4 in accordance with the face orientation of grains of doped polysilicon, resulting in reduction of the voltage resistance of gate. Accordingly, as shown in FIG. 61, doped amorphous silicon is deposited for depositing the film of word line (WL). Then, anneal is effected at about 600° to grow this doped amorphous polysilicon by solid phase growth into polysilicon formed of grains of a large diameter. Thereby, as shown in FIG. 61, gate insulating film 4 having a high voltage resistance can be formed without irregularities.

Embodiment 21

Similarly to embodiment 20, a film for the word line is deposited in the form of doped amorphous silicon. Then, the contact hole of VΦT is formed while maintaining the form of amorphous silicon. Thereafter, solid phase growth of the amorphous silicon is performed simultaneously with oxidation of gate insulating film. The device including the gate insulating film which is formed in this manner can achieve an effect similarly to embodiment 20, and has the same structure as that shown in FIG. 61.

Embodiments 22 to 25 are aimed at further improvement of the voltage resistance against punch-through of VΦT for achieving a VΦT-DRAM which is further resistive to the disturb refresh.

Embodiment 22

Figure 62:
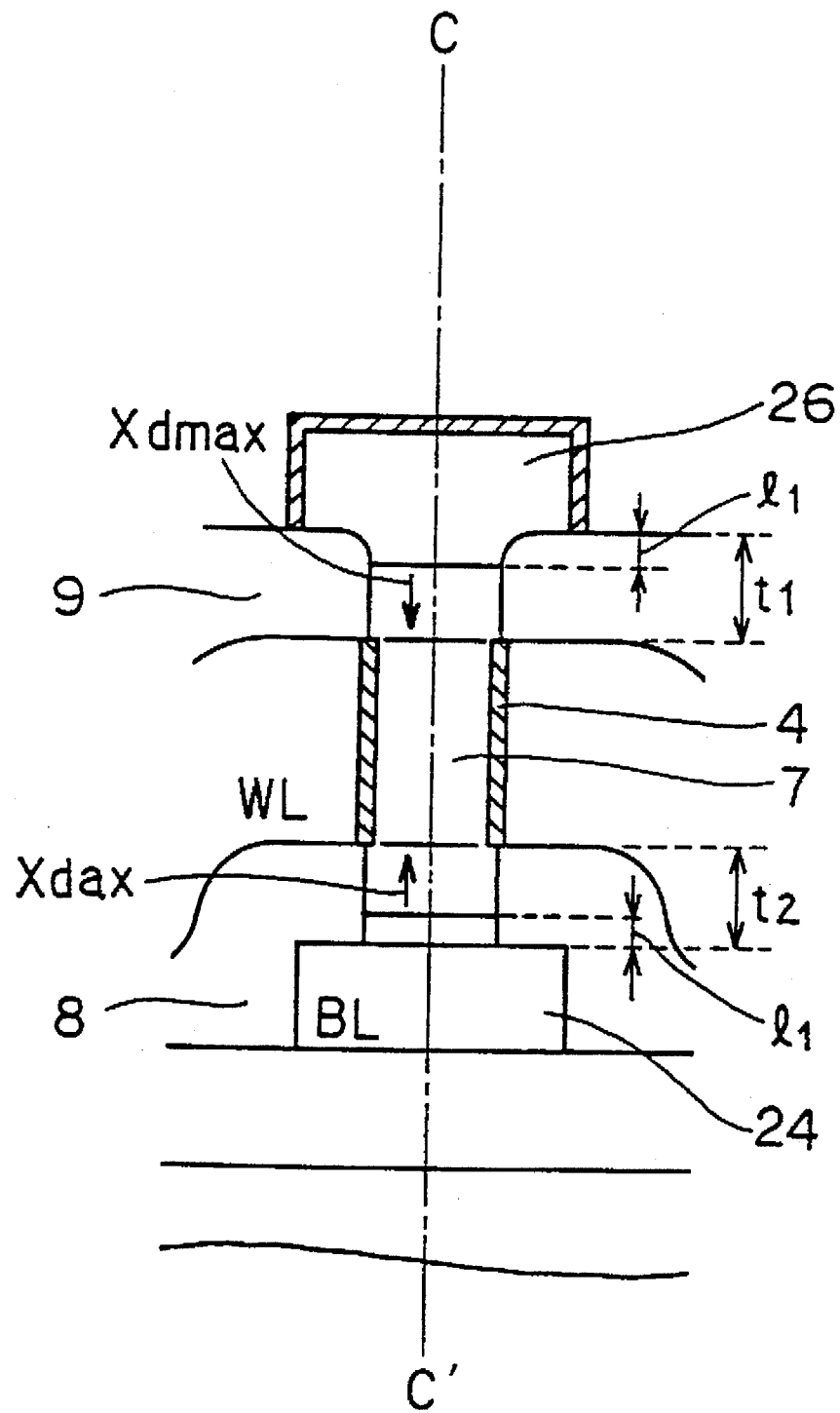
FIG. 62 is a cross section of a VΦT-DRAM of an embodiment 22.

FIG. 62 is a cross section of a VΦT-DRAM of embodiment 22. If a voltage has been applied to bit line 24 or storage node 26 has stored electric charges, a depletion layer extends from the source or drain of VΦT. The state where the depletion layer connects the source and drain together is the punch-through state. Assuming that a voltage $V_R$ is applied to the drain and the impurity concentration of channel is $N_A$, the extension $X_{dmax}$ of the depletion layer can be expressed by the following formula.

$$X_{dmax} = (2 \cdot K_S \cdot \epsilon_0 (V_R + 2\phi_{FP})/q \cdot N_A)^{1/2}$$

where $K_S$ represents a relative dielectric constant of silicon, $\epsilon_0$ represents a dielectric constant of vacuum, and q represents an elementary quantity of charges. $\phi_{FP}$ represents quasi Fermi level which is represented by the following formula.

$$\phi_{FP} = (kT/q) \cdot \ln(N_A/n_i)$$

where k represents a Boltzmann's constant, T represents an absolute temperature, and $n_i$ represents a true carrier concentration.

In order to improve the voltage resistance against punch-through, thicknesses ($t_1$ and $t_2$) of the interlayer insulating films located above and below the gate of VΦT are changed in accordance with extension $X_{dmax}$ of the depletion layer. More specifically, the film thicknesses of first and second interlayer insulating films can be determined to satisfy the following formula.

Thicknesses ($t_1$ and $t_2$) of interlayer insulating films= $X_{dmax}$+impurity diffusion lengths ($l_1$ and $l_2$)

For example, if the power supply voltage is 1.5 V ($V_R$=1.5 V) and $N_A$ is 1×10¹⁸/cm³, $X_{dmax}$ goes to 700 Å.

If $N_A$ is 1×10¹⁷/cm³, $X_{dmax}$ goes to 2200 Å.

Assuming that each of the diffusion lengths ($l_1$ and $l_2$) of impurity is 300 Å, the interlayer insulating films in the above case have the film thicknesses of 1000 Å and 2500 Å, respectively.

By determining the film thicknesses of interlayer insulating film as described above, it is possible to weaken the electric field at the regions (i.e., offset regions) surrounded by the first and second interlayer insulating films in the channel of VΦT, so that punch-through is suppressed and thus the structure becomes resistive to the disturb refresh.

Interlayer insulating films (8 and 9) may be deposited by an appropriate method such as CVD, in which case the offset region can be formed with significantly good controllability.

Embodiment 23

Figure 63:
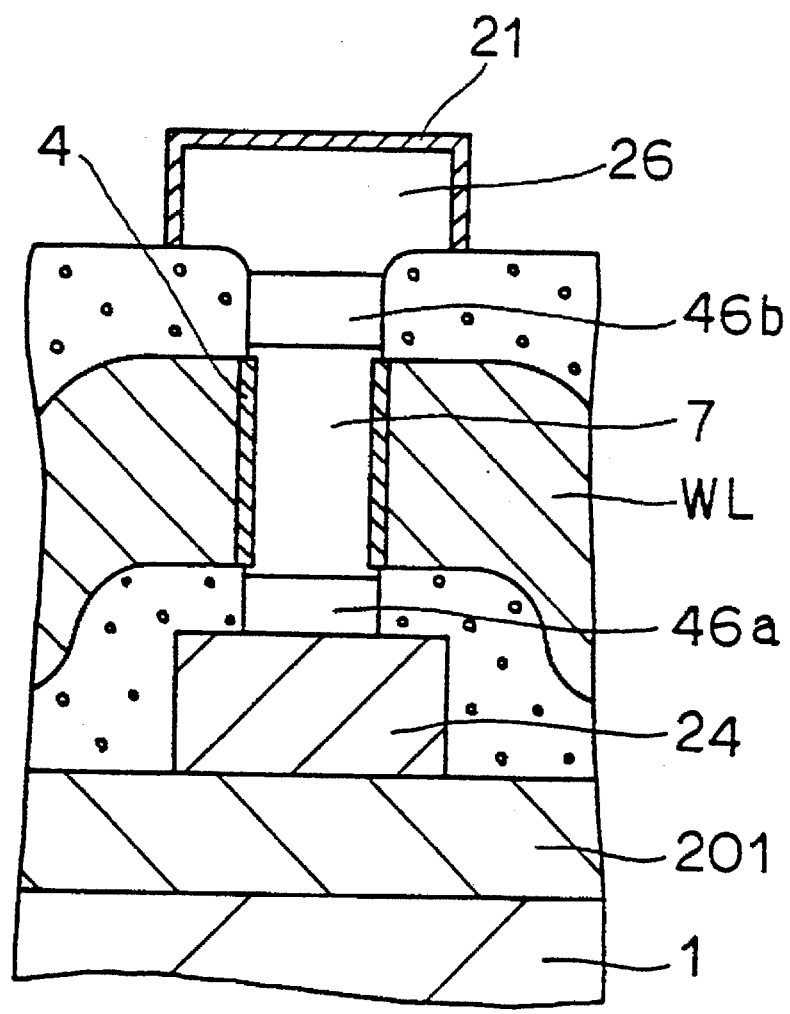
FIG. 63 is a cross section of a VΦT-DRAM of an embodiment 23.

FIG. 63 is a cross section of a VΦT-DRAM of embodiment 23. The DRAM shown in FIG. 63 is the same as the DRAM shown in FIG. 2 except for the following point. Therefore, the same or corresponding portions bear the same reference numbers and will not be described below.

The device shown in FIG. 63 is provided with LDD portions 46a and 46b instead of offsets in FIG. 62. The LDDs can improve the voltage resistance against punch-through similarly to the offsets. The LDDs are formed as disclosed in the Japanese Patent Application No. 5-345126 (1993), and more specifically, by implanting impurity ions into bit line 24, LDD portion 46a, channel region 7, LDD portion 46b and storage node 26 with various implantation voltages and implantation doses.

They may be formed also by implanting impurity into the LDD portions during the epitaxial growth.

Embodiment 24

This embodiment relates to a method of forming the LDDs utilizing abnormal diffusion of phosphorus.

Figure 64:
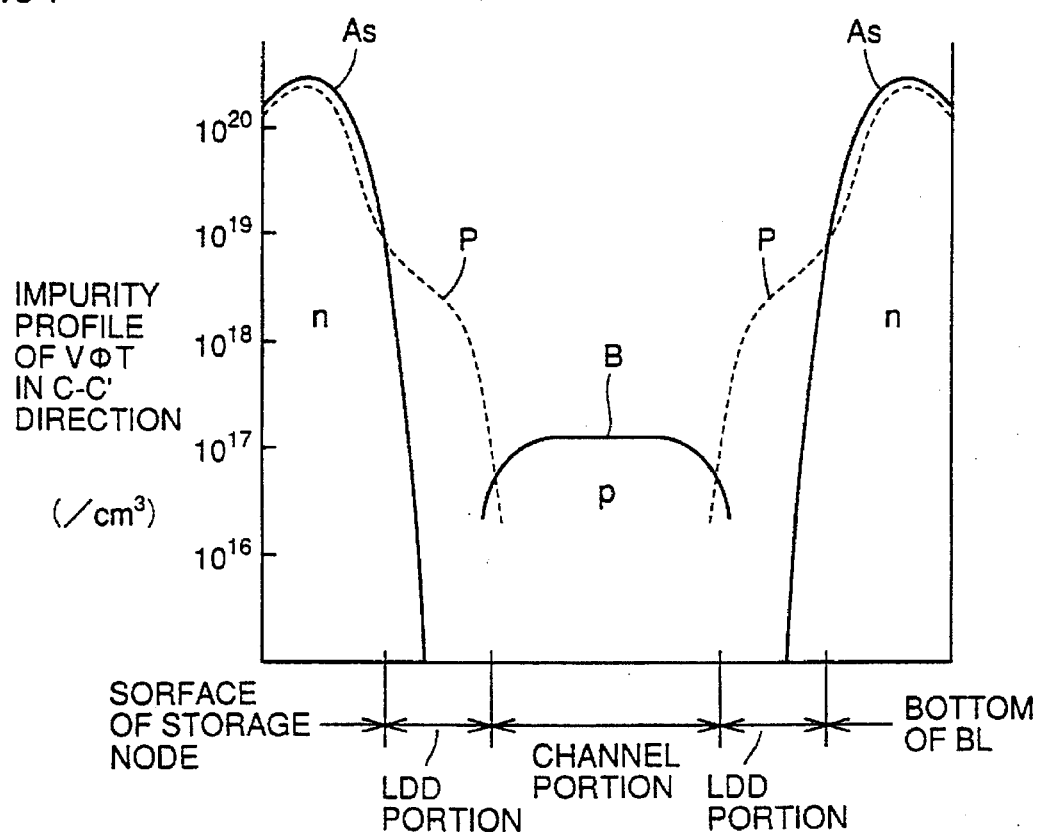
FIG. 64 shows a profile of impurity in a VΦT channel plug taken along line C–C' in FIG. 62.

FIG. 64 is an impurity profile in the VΦT channel plug taken along line C–C' in FIG. 62.

In the case of N-channel, arsenic (As) or phosphorus (P) is generally used as impurity in source and drain, and its distribution forms Gaussian distribution. In contrast to arsenic, phosphorus forms the distribution curve having an extended tail at a low concentration region as shown in the figure. By applying this phenomenon to VΦT, the LDD structure is automatically completed. Thereby, the voltage resistance against punch-through is improved.

The offsets and LDDs in embodiments 22–24 already described weaken the electric field between the channel and drain, so that they can prevent the parasitic bipolar effect.

Embodiment 25

Embodiment 25 relates to a structure in which impurity profile of the channel is changed to improve the voltage resistance against punch-through.

Figure 65:
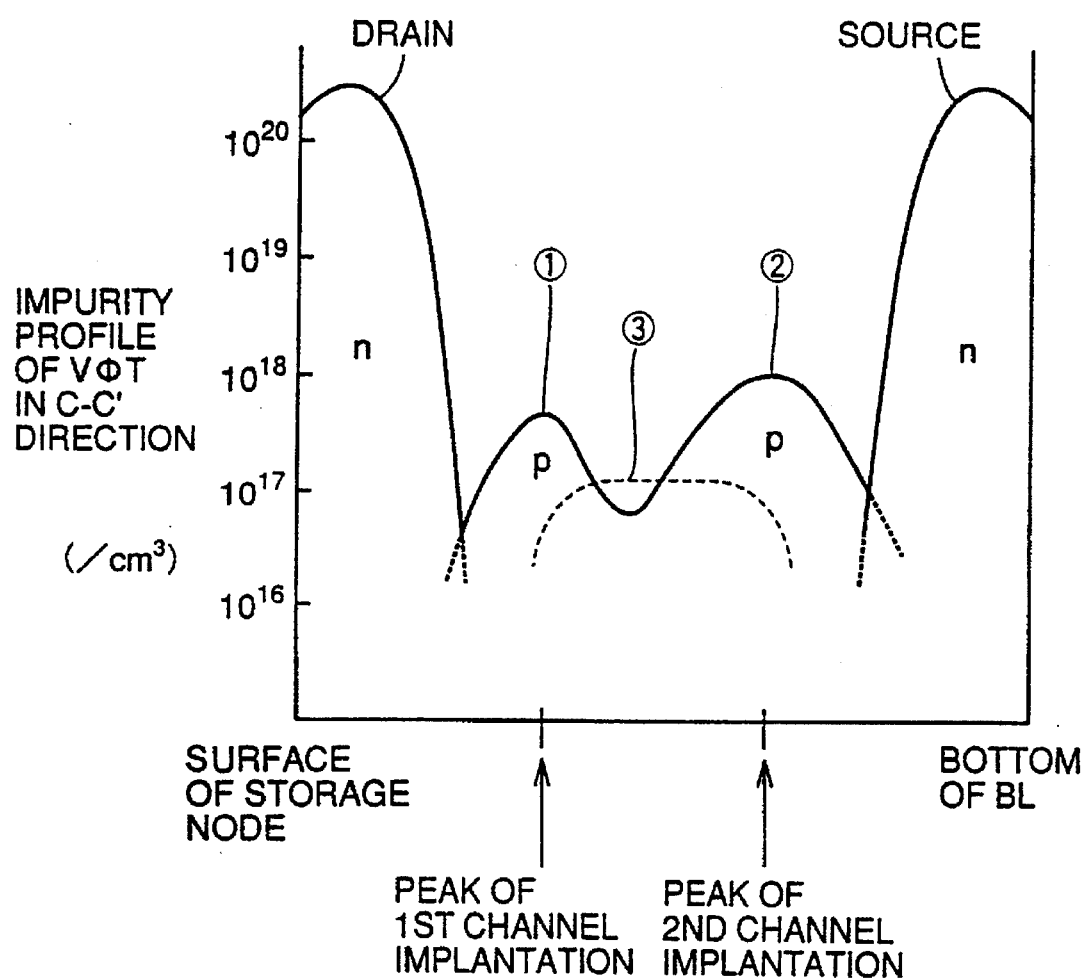
FIG. 65 shows a profile of impurity of a channel taken along line C–C' in FIG. 62.

FIG. 65 shows an impurity profile of the channel taken along line C–C' in FIG. 62. As shown in FIG. 65, the channel profile having peaks at opposite ends of the channel is formed by two channel implanting operations (1) and (2) with different implanting depths.

Extension of the depletion layers from the source and drain can be suppressed at the peaks formed at opposite ends. Since the entire channel of VΦT is depleted or inverted at a region of a low concentration between the peaks, an ideal S-factor is obtained and also a high current drive power is obtained.

Thereby, the voltage resistance against punch-through can be improved without impairing the advantage of VΦT. In the figure, dotted line (3) shows the curve for comparison which is obtained by only one channel implanting operation.

Embodiment 26

Embodiment 26 is aimed at suppression of the parasitic bipolar effect. In contrast to an ordinary MOS transistor of which channel potential is fixed at a well potential, the channel potential of VΦT is electrically floated. Therefore, a large number of carriers are accelerated at a high electric field portion between the channel and drain, and impinge against the lattice of silicon. A small number of carriers generated by this impingement are confined in the channel. This is referred to as an impact ionization phenomenon. For example, in the case of VΦT of N-channel, impact ionization caused by acceleration of electrons generates holes, and they are confined in the channel, so that the potential of channel lowers. This induces implantation of new electrons from the source, resulting in increase of the drain current. The drain current thus increased causes further impact ionization and thus positive feedback takes place, so that the electric field between the channel and drain increases. This results in a phenomenon that the drain current increases discontinuously. This is similar to the operation of bipolar transistor, and thus is referred to as a parasitic bipolar effect. The phenomenon that the drain current increases discontinuously makes the operation of VΦT-DRAM unstable. This can be avoided or suppressed, e.g., by weakening the electric field between the channel and drain, or by forming the offsets or LDDs as described in connection with embodiments 22–24.

Figure 66:
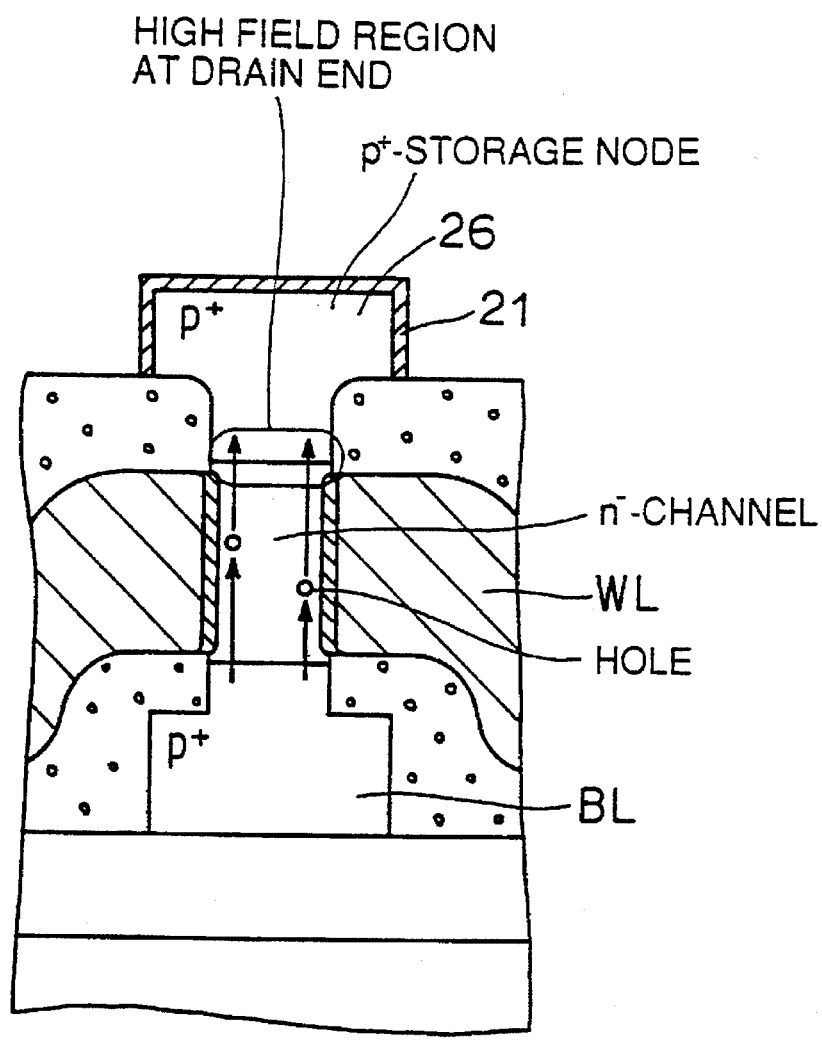
FIG. 66 is a cross section of a semiconductor device of an embodiment 26.

As shown in FIG. 66, VΦT of P-channel may be used in the memory cell of VΦT-DRAM. In this structure, since the impact ionization efficiency of holes is smaller than that of electrons, the parasitic bipolar effect can be suppressed.

Embodiment 27

Embodiments 27 and 28 are aimed at increase of the capacitor capacitance of VΦT-DRAM.

Figure 67:
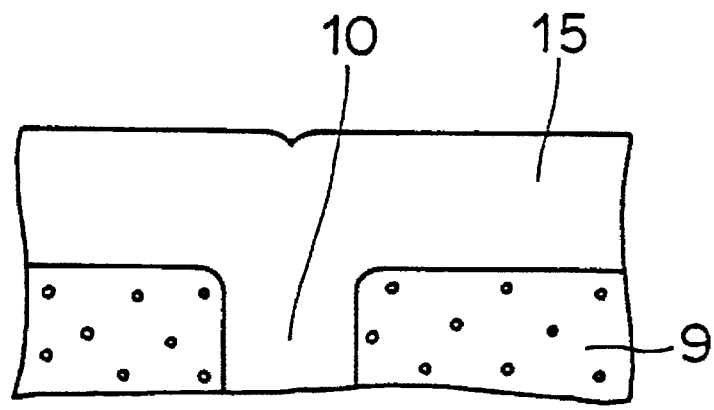
FIGS. 67 to 69 are cross sections of a semiconductor device at 1st to 3rd steps in a process of manufacturing the semiconductor device of an embodiment 27, respectively.

FIG. 67 shows an upper portion of the contact hole of VΦT filled with amorphous silicon. FIG. 67 does not show components of the VΦT-DRAM other than the capacitor. Contact hole 10 of VΦT is formed in second interlayer insulating film 9. Contact hole 10 is filled with amorphous silicon 15. Amorphous silicon 15 is monocrystallized by epitaxial growth.

Figure 68:
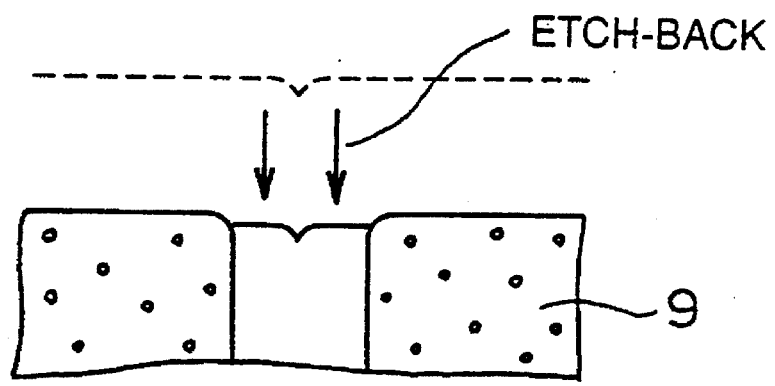

Referring to FIGS. 67 and 68, after monocrystallization of the channel portion of VΦT, the monocrystal is etched back to expose the surface of second interlayer insulating film 9.

Figure 69:
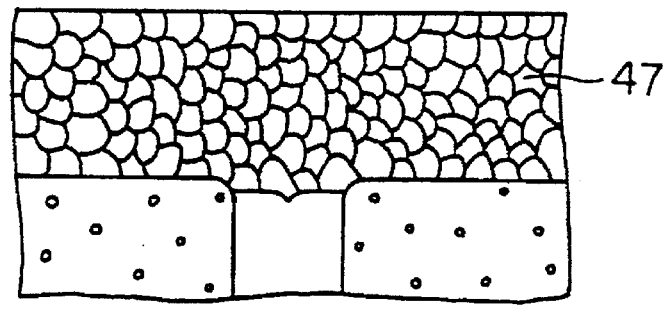

Referring to FIGS. 68 and 69, polysilicon 47 made of grains of a minute diameter is deposited on second interlayer insulating film 9.

Figure 70:
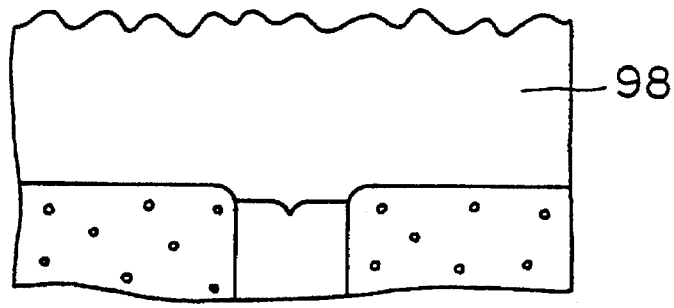
FIGS. 70 and 71 are cross sections of a conventional semiconductor device.
Figure 71:
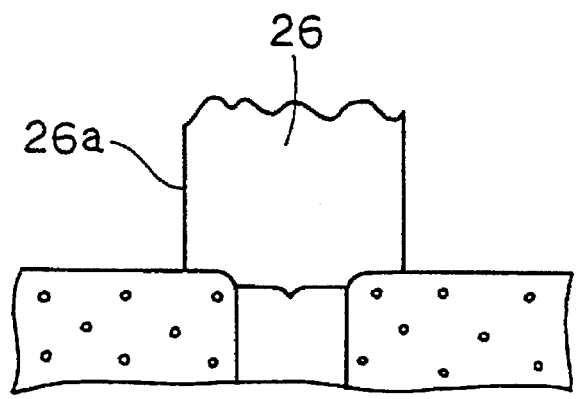

As a method for increasing a capacitor capacitance, there has been such a method that polysilicon having a significantly irregular surface is used at a storage node for increasing a surface area thereof so as to increase the capacitor capacitance. For example, instead of the polysilicon made of grains of a minute diameter shown in FIG. 69, polysilicon having a significantly irregular surface may be deposited as shown in FIG. 70 and may be processed into a storage node form as shown in FIG. 71. Storage node 26 thus formed has an irregular upper surface, so that the capacitance of capacitor increases. This method, however, cannot increase the surface area of a side surface 26a because the side surface 26a exposed by the etching is flat.

Figure 72:
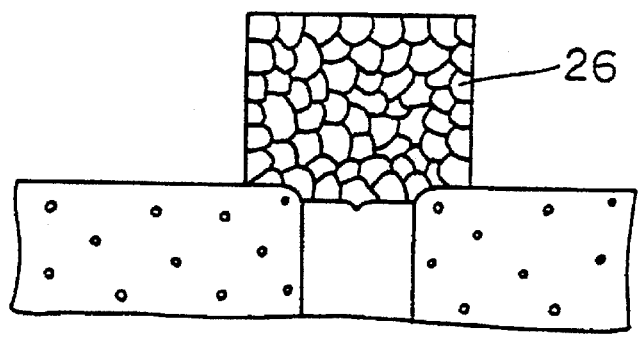
FIGS. 72 to 74 are cross sections of the semiconductor device at 4th to 6th steps in a process of manufacturing the semiconductor device of embodiment 27, respectively.
Figure 73:
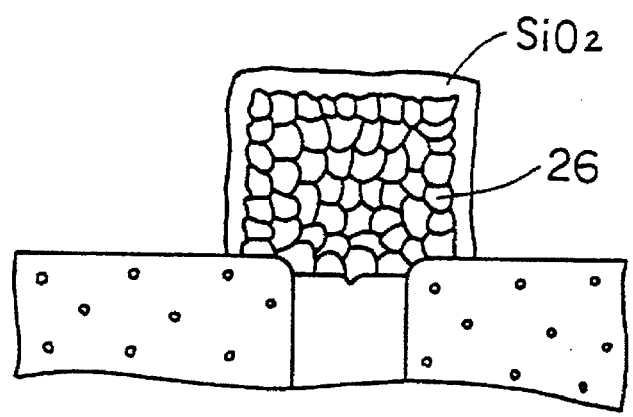

In this embodiment, therefore, storage node 26 is formed by patterning polysilicon 47 as shown in FIGS. 69 and 72. Referring to FIGS. 72 and 73, the surface of storage node 26 is oxidized. Grain boundaries of polysilicon is oxidized at a higher speed than the gains, so that the gain boundaries of polysilicon are oxidized more rapidly than the others. As a result, irregularities corresponding to the sizes of grains are formed at the upper and side surfaces of storage node 26.

Figure 74:
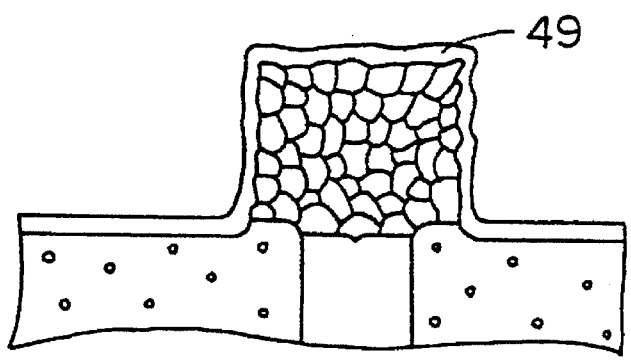

An SiO$_2$ film 99 formed at the surface of storage node 26 can be used as the capacitor insulating film as it is. Alternatively, as shown in FIG. 74, the SiO$_2$ film may be removed, and then film 49 having a high dielectric constant such as double layer of SiN and SiO$_2$ may be formed.

Since the above method can provide the irregularities also at the side surfaces of storage node 26, the capacitance of capacitor can be sufficiently increased. The storage node described above may be applied to DRAMs other than the VΦT-DRAM.

Embodiment 28

Figure 75:
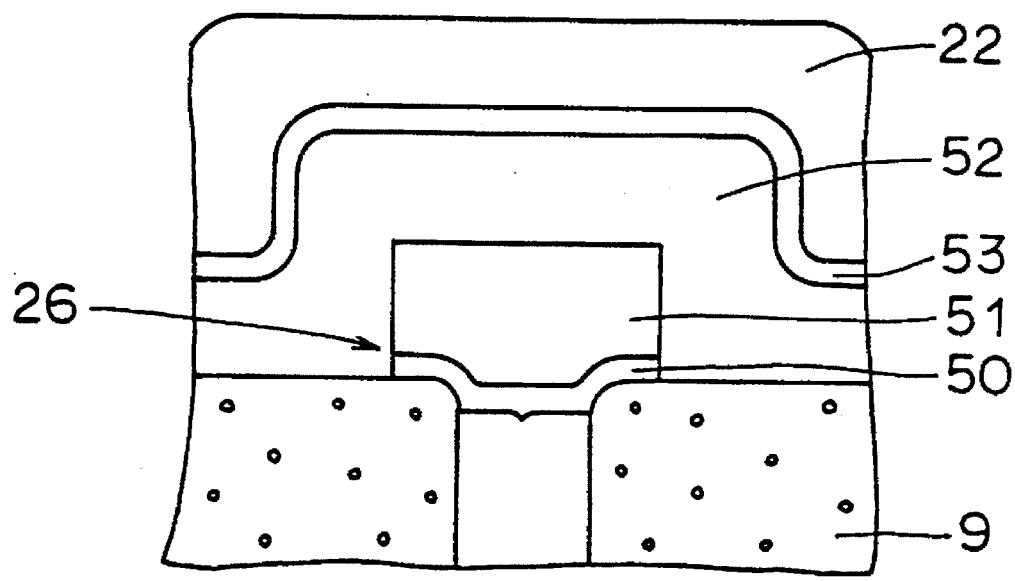
FIG. 75 is a cross section of a semiconductor device of an embodiment 28.

This embodiment relates to a structure in which highly dielectric material is used for increasing the capacitor capacitance. Referring to FIGS. 68 and 75, a titanium nitride film 50 is deposited after the etch-back of amorphous silicon, and a first platinum film 51 is deposited thereon. Then, these films are processed into a form of storage node 26. Then, a highly dielectric film (Ba, Sr) TiO$_3$ film 52 is deposited on second interlayer insulating film 9. A second platinum film 53 is deposited on (Ba, Sr) TiO$_3$ film 52. Cell plate 22 of polysilicon is formed on second platinum film 53.

In the DRAM cell of 4F$^2$, since the capacitor requires only a very small area, it is effective to use the highly dielectric film such as (Ba, Sr) TiO$_3$ film for increasing the capacitor capacitance. This embodiment has been described in connection with an example using (Ba, Sr) TiO$_3$ film as the highly dielectric film, the invention is not restricted to this, and other highly dielectric films may be used.

Embodiment 29

This embodiment relates to increase of the degree of integration above 4F$^2$ or 4r$^2$.

Figure 76:
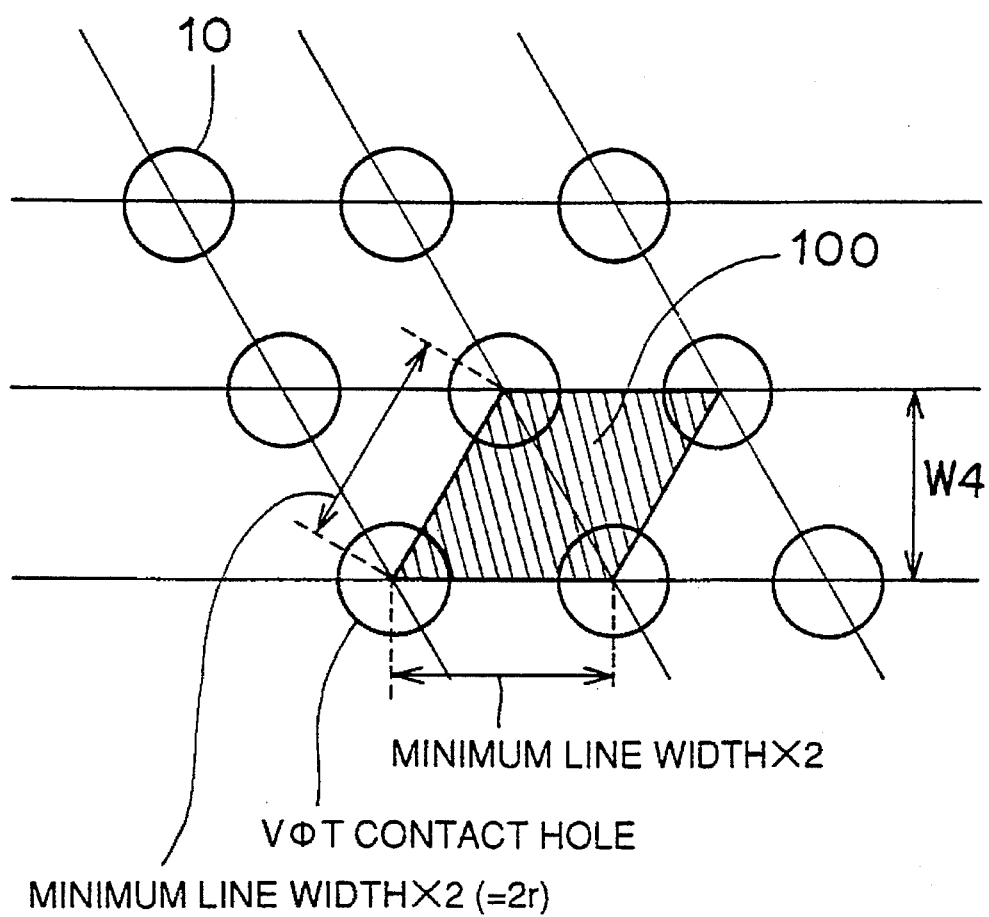
FIG. 76 shows a layout of contact holes of VΦTs of an embodiment 29.

Referring to FIG. 76, contact holes 10 of VΦTs are disposed at apexes of triangles with sides, each of which has a length equal to twice the minimum line width. This disposition attains the highest disposition density of contact holes 10 of VΦTs. An area 100 of one cell in this structure is equal to $2(3)^{1/2}r^2$, i.e., nearly 3.5r$^2$, so that the degree of integration of cells are much higher than 4r$^2$ in embodiments 17 and 18.

In the DRAM cell array formed of the above cells, adjacent cells must be connected by word lines (WL) and bit lines (BL). A width W4 of $(3)^{1/2}$r, i.e., nearly 1.73r can be used for forming word line (WL) and bit line (BL).

For forming bit line (BL), a minimum required width is generally 2r which is a sum of the width (r) of bit line and a width (r) between the bit lines, and thus 1.73r is insufficient. Likewise, for forming word line (WL), a minimum required width is generally 2r which is a sum of the width (r) of word line and a width (r) between the word lines, and thus 1.73r is insufficient.

Figure 77:
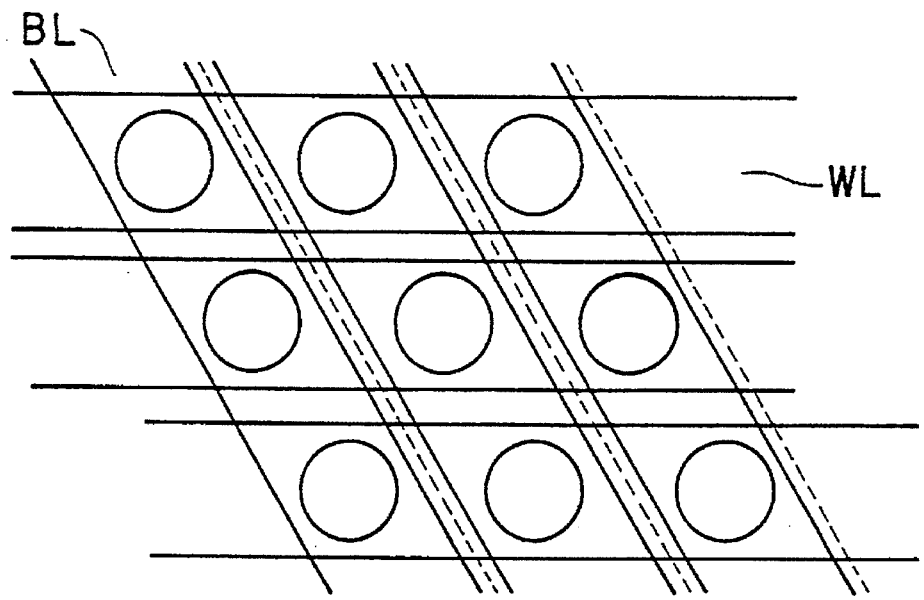
FIG. 77 shows a layout of bit lines and word lines of an embodiment 29.

Therefore, the cell of 3.5r² cannot be obtained. However, if the word lines and bit lines are pattered with a mask which is provided with phase shifters enabling shift of the phase by 180° with a space of 1.73r, the bit lines and word lines can be formed as shown in FIG. 77, and thus the cell of 3.5r² can be obtained.

Embodiment 30

Embodiments 30 and 31 relate to a layout of a peripheral circuitry.

Figure 78:
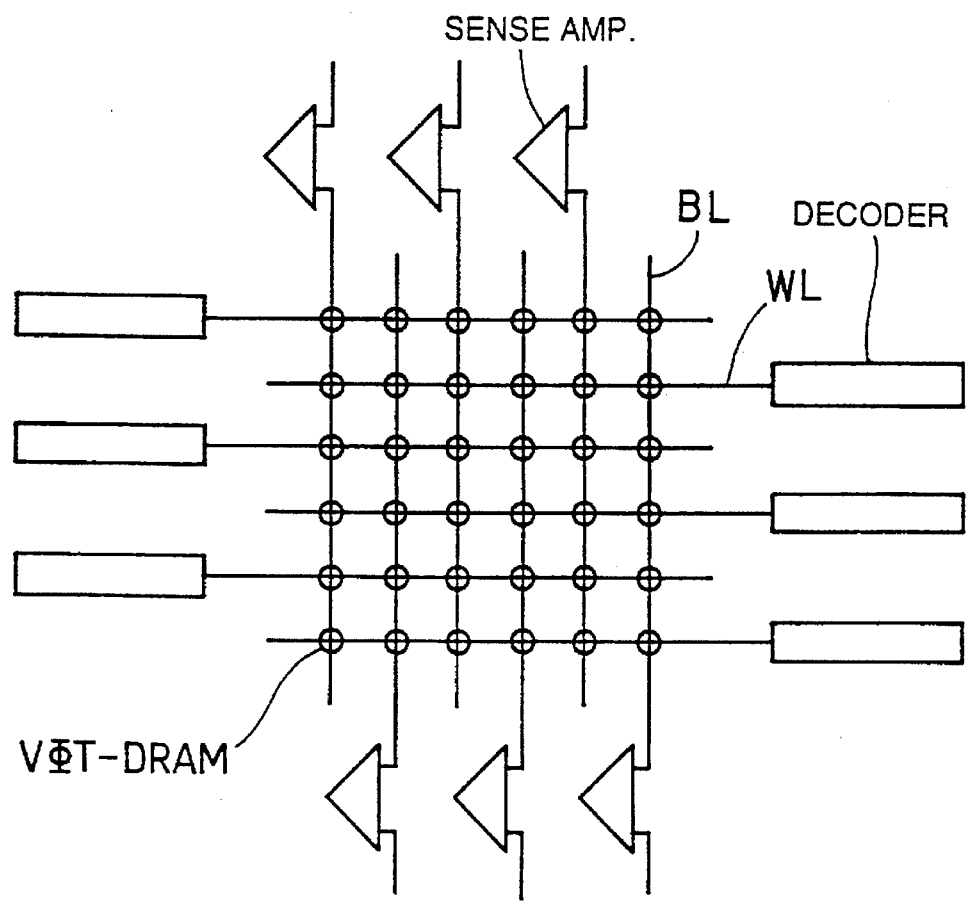
FIG. 78 shows a layout of a peripheral circuitry in semiconductor device of an embodiment 30.

The cell array of 4F² can generally provide only a small space for a peripheral circuitry. As shown in FIG. 78, sense amplifiers may be disposed at vertically opposite sides of the memory cells such that the sense amplifiers disposed at the same side (i.e., upper or lower side) are connected to alternate bit lines BL. Also, decoders may be disposed at laterally opposite sides of the memory cells such that the decoders disposed at the same side (i.e., right or left side) are connected to alternate word lines WL. This disposition increases the space for the peripheral circuitry. The above manner of disposition may be applied only to the sense amplifiers or the decoders.

Embodiment 31

This embodiment relates to a manner of connection in the case where contact must be made at a very deep position between adjacent VΦTs in the DRAM cell array or peripheral circuitry.

Figure 79:
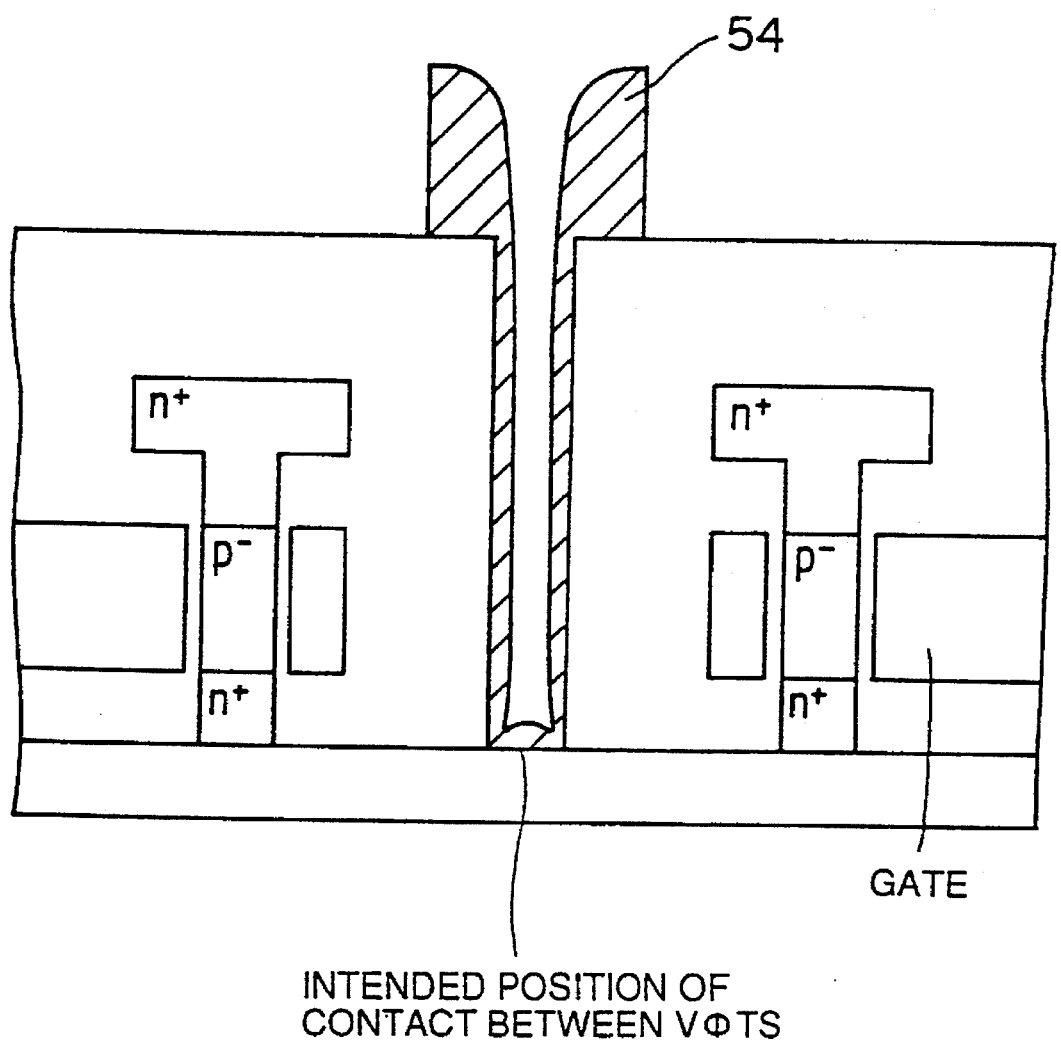
FIG. 79 shows a purpose of an embodiment 31.

Referring to FIG. 79, in the case where contact is to be made at a very deep position between the adjacent VΦTs, it is very difficult to make direct contact with an aluminum interconnection 54, and also aluminum interconnection may break.

Figure 80:
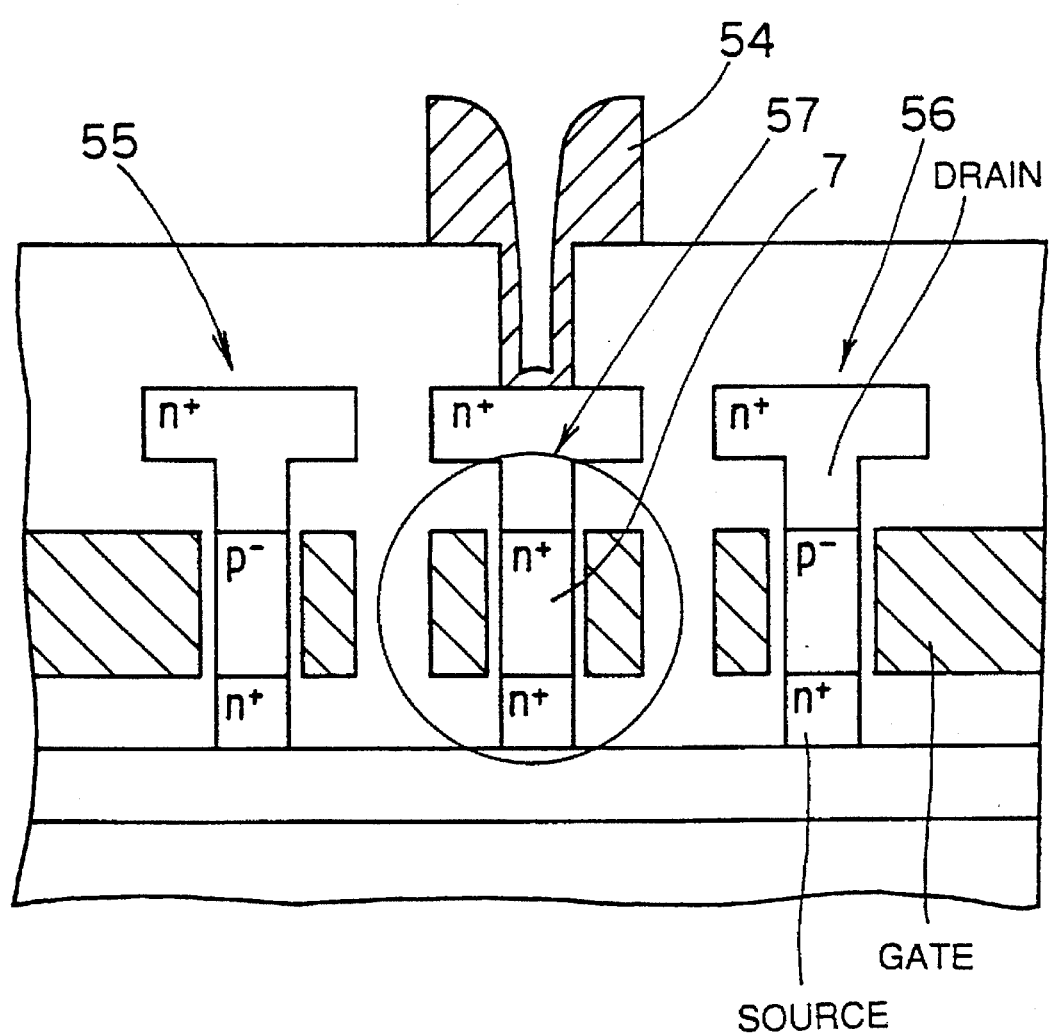
FIG. 80 is a cross section of a semiconductor device of an embodiment 31.

Accordingly, as shown in FIG. 80, a dummy VΦT 57 is disposed between a first VΦT 55 and a second VΦT 56, so that the contact of aluminum interconnection 54 can be made easily.

However, channel portion 7 of the dummy VΦT must contain impurity of the same conductivity type as the source and drain at a high concentration as shown in FIG. 80.

Embodiment 32

Embodiment 32 relates to a process of producing the peripheral circuitry of VΦT-DRAM formed of SOI transistors.

Figure 81:
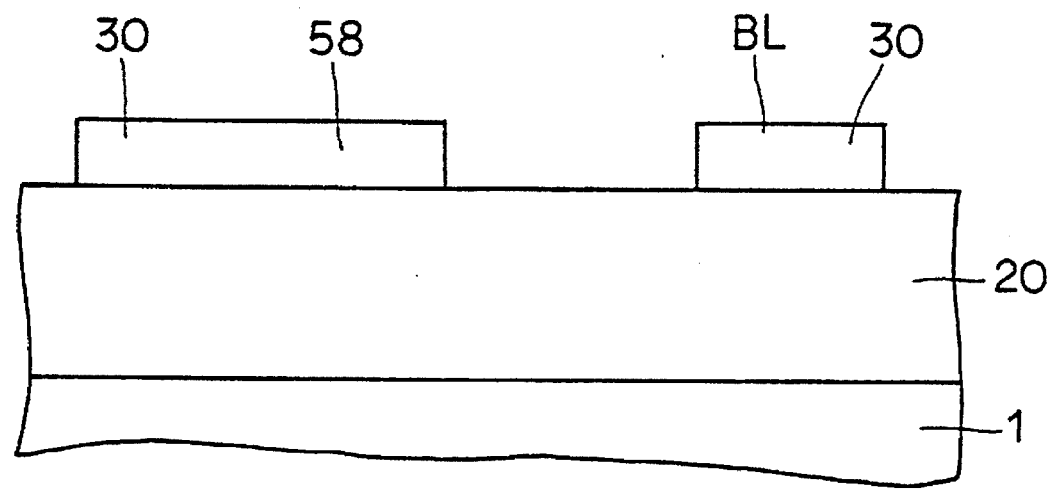
FIGS. 81 to 84 are cross sections of a semiconductor device at 1st to 4th steps in a process of manufacturing the semiconductor device of an embodiment 32.

Referring to FIG. 81, one prepares a substrate including buried SiO₂ layer 20 and SOI layers 30 formed on silicon substrate 1. SOI layer 30 is patterned to form simultaneously an active region 58 of SOI transistor and bit line BL of the cell array of VΦT-DRAM. In this embodiment, dry etching is effected to pattern SOI layer 30 for isolating active region 58 and bit line BL from each other. However, they may be isolated by an LOCOS oxide film as is done in embodiment 16.

Simultaneous patterning of active region 58 of SOI transistor and the bit line of VΦT-DRAM simplifies the steps.

Figure 82:
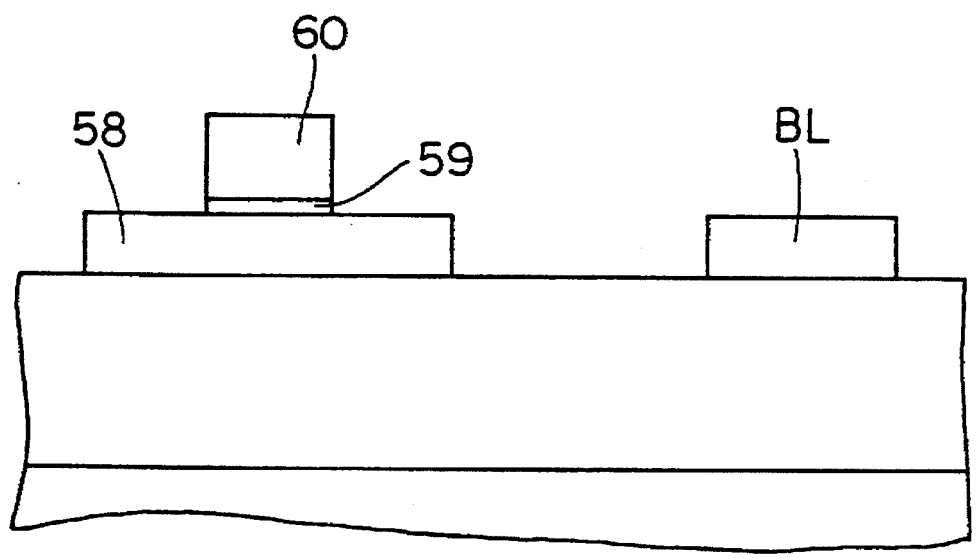
Figure 83:
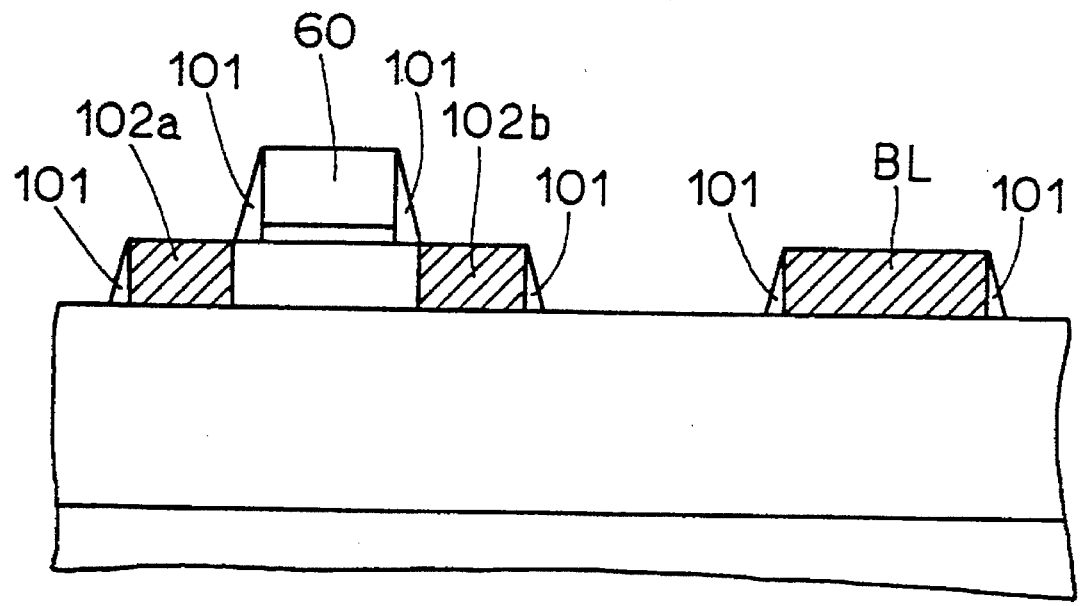

Referring to FIG. 82, a gate insulating film 59 and a gate electrode 60 of SOI transistor are formed. Referring to FIG. 83, side wall spacers 101 are formed at respective side walls of active region 58, gate electrode 60 and bit line BL. Ions are implanted into source/drain regions 102a and 102b of SOI transistor, and simultaneously, ions are implanted into bit line BL. This simultaneous implantation also simplifies the steps.

Figure 84:
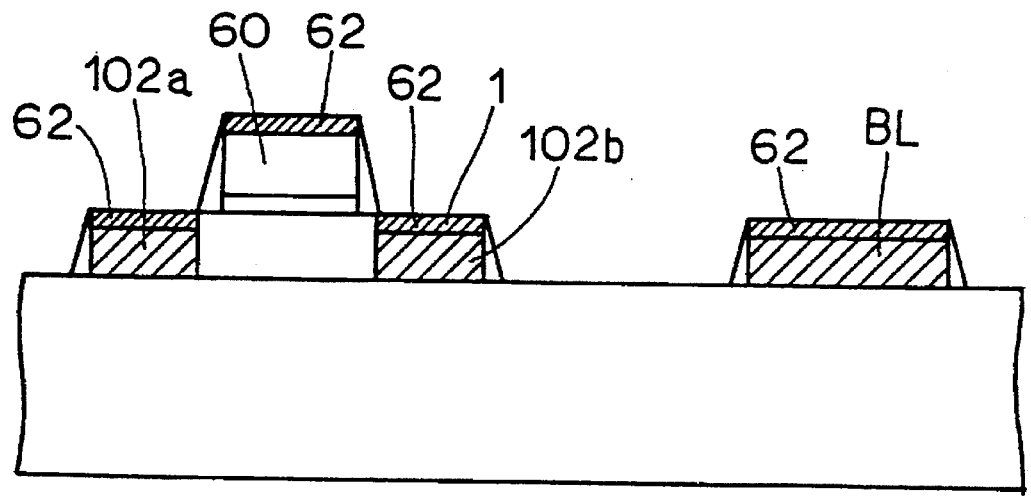

Referring to FIG. 84, silicidation is simultaneously effected on the surfaces of source 102a, gate electrode 60 and drain 102b of SOI transistor as well as the surface of bit line BL to form silicide films 62 on the respective surfaces. Simultaneous silicidation of the respective surfaces simplifies the steps. Thereafter, the VΦT-DRAM is formed on bit line BL.

Then, another process of producing the peripheral circuitry of VΦT-DRAM formed of SOI transistors will be described below.

Figure 128:
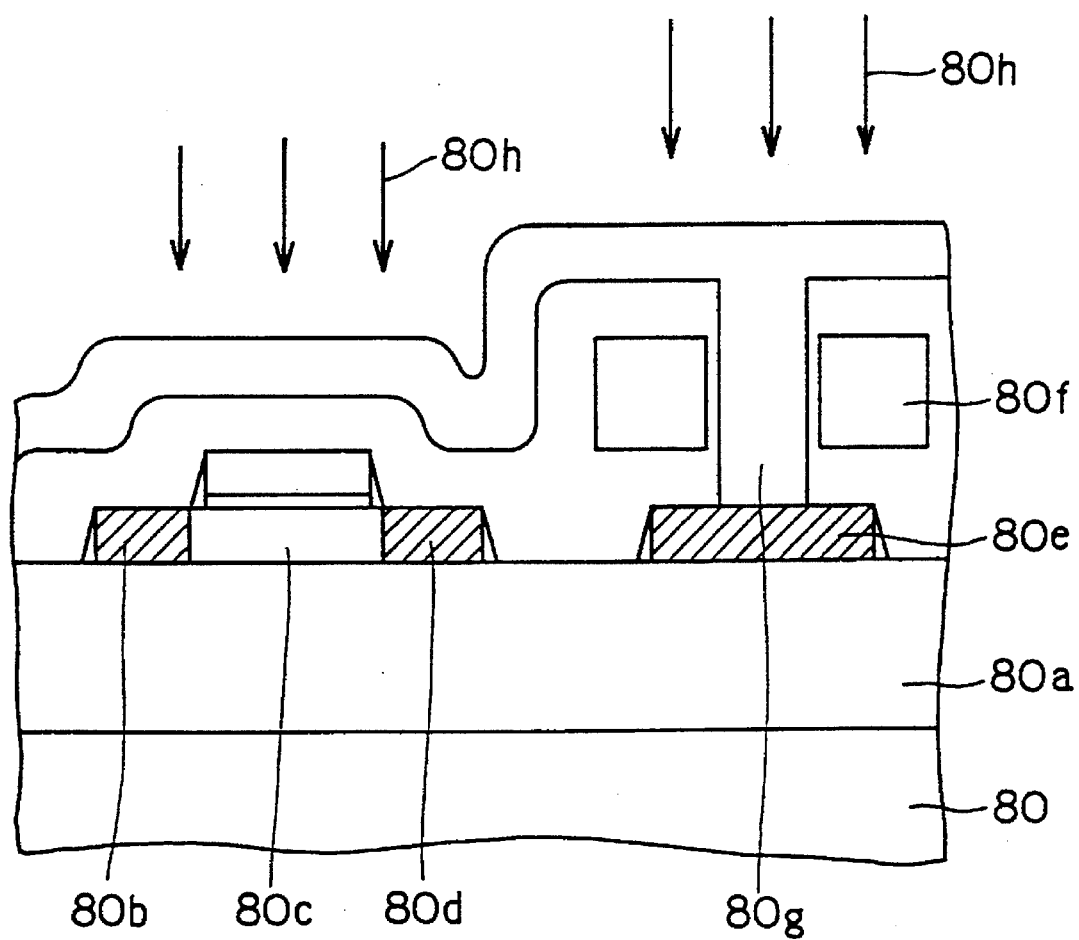
FIG. 128 is a cross section of a semiconductor device for showing a problem in another process of manufacturing the semiconductor device including a peripheral circuitry formed of SOI transistors.

Referring to FIG. 128, a buried SiO₂ film 80a is disposed on a substrate 80. A source 80b, a channel 80c and a drain 80d of an SOI transistor as well as a source 80e of VΦT are disposed on buried SiO₂ film 80a. A gate 80f of VΦT is disposed on source 80e of VΦT. There is also provided a channel 80g of VΦT penetrating gate 80f of VΦT.

Channel 80g of VΦT is formed by crystallization of filled amorphous silicon. Then, channel implantation 80h for VΦT is performed. If channel implantation 80h for VΦT were performed on the whole surface, impurity used in channel implantation for VΦT would be introduced even into channel 80c of SOI transistor, resulting erroneous change of the threshold of SOI transistor. This may be avoided by performing the channel implantation for VΦT with a photoresist covering the SOI transistor portion. However, this requires an additional mask, resulting in increase of the manufacturing cost.

Figure 129:
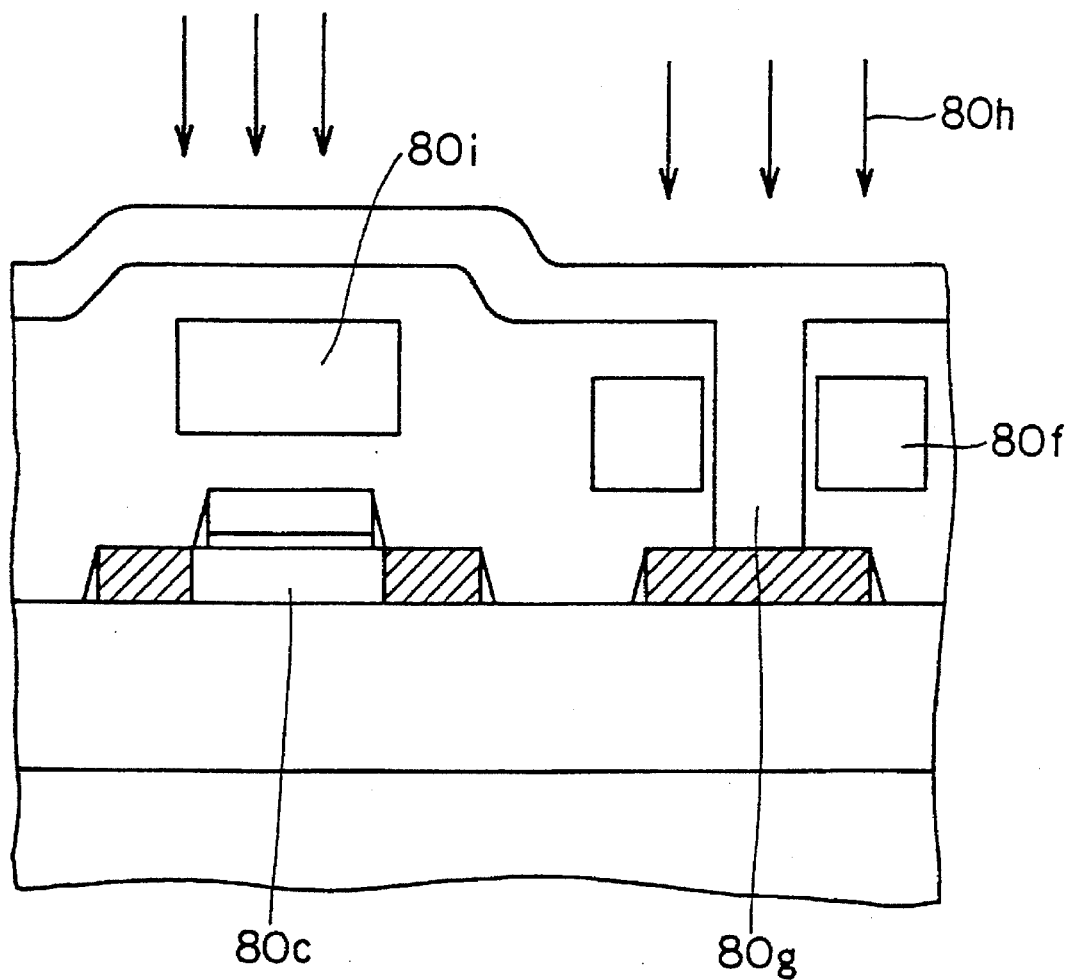
FIG. 129 is a cross section of a semiconductor device showing another improved process of manufacturing the semiconductor device including a peripheral circuitry formed of SOI transistors.

In order to avoid the above problem, a dummy pattern 80i of the gate of VΦT is disposed above channel 80c of SOI transistor as shown in FIG. 129. Owing to dummy pattern 80i of the gate of VΦT, the impurity is not introduced into channel 80c of SOI transistor even if channel implantation for VΦT is effected on the whole surface. Since this method does not use a mask, the manufacturing cost does not increase.

Embodiment b 33

Figure 85:
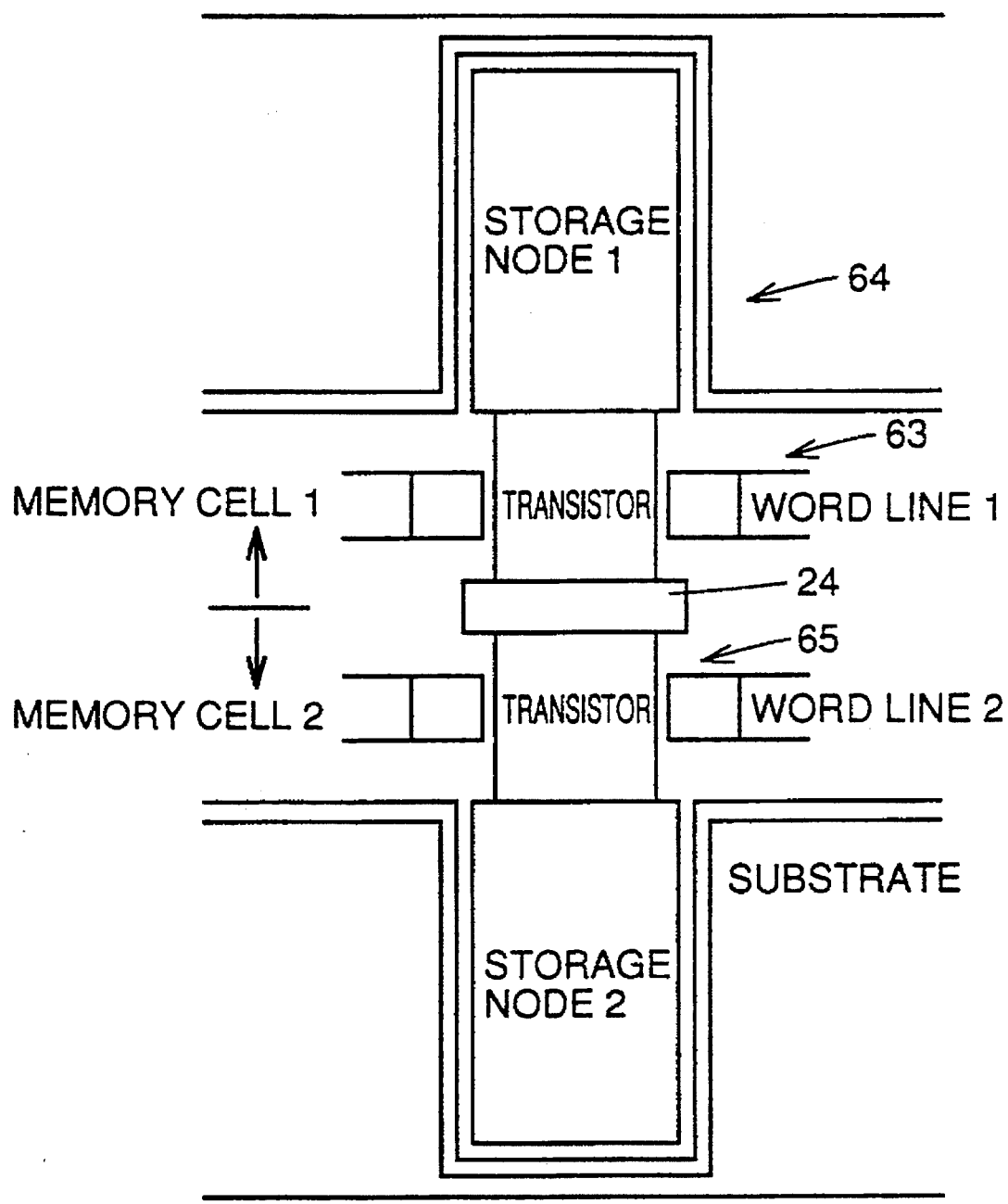
FIG. 85 is a cross section of a semiconductor device of an embodiment 33.

This embodiment relates to a layer structure in which upper and lower VΦT-DRAMs commonly use the bit lines. FIG. 85 is a cross section of the VΦT-DRAMs of embodiment 33. A first VΦT 63 is formed above bit line 24, and a capacitor 64 of a trench type is connected to the upper side of the first VΦT. A second VΦT 65 is connected to the lower side of bit line 24. A second capacitor 65 of the trench type is connected to the second VΦT. This layer structure is formed by laminating memory cells 1 and 2 to each other. The structure of VΦT is the same as that shown in FIGS. 1 and 2.

In this embodiment, only one step is required for forming the bit line. Therefore, the number of steps is reduced, and thus the cost is reduced. Since the thickness is reduced by a size corresponding to one layer of bit line, the height of memory cell portion can be small, and thus a difference in height between the memory cell portion and the peripheral circuitry can be small. This facilitates manufacturing of the semiconductor device. Further, the capacitance coupling between interconnections can be reduced, and thus high-speed operation and high performance can be achieved. In the case where the laminating manner is employed, the channel can be monocrystallized.

Embodiment 34

Figure 86:
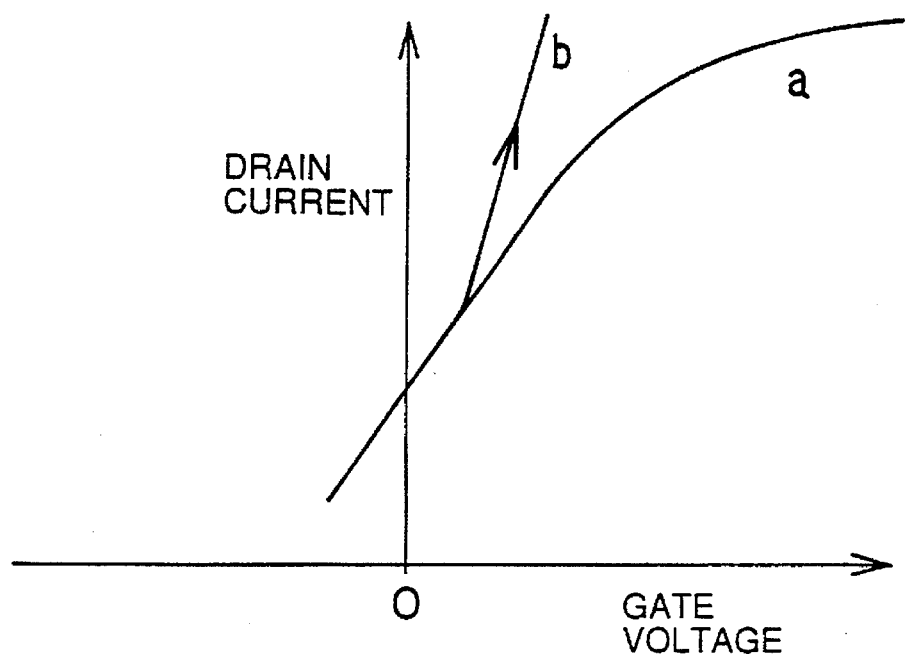
FIG. 86 shows a problem of a transistor of a conventional SOI structure.

In a transistor of the conventional SOI structure, it is difficult to fix an electrode of a body. This results in the following problem, which is referred to as "latch". In FIG. 86, a curve (a) represents electrical characteristics of an ordinary bulk Si transistor. A curve (b) represents electrical characteristics of a transistor of the SOI structure. In the transistor of SOI transistor, a drain current rapidly increases after a gate voltage increases to and above a certain value, which is different from the characteristics (a) of the ordinary bulk Si transistor. This phenomenon is probably caused by the following reason.

Figure 87:
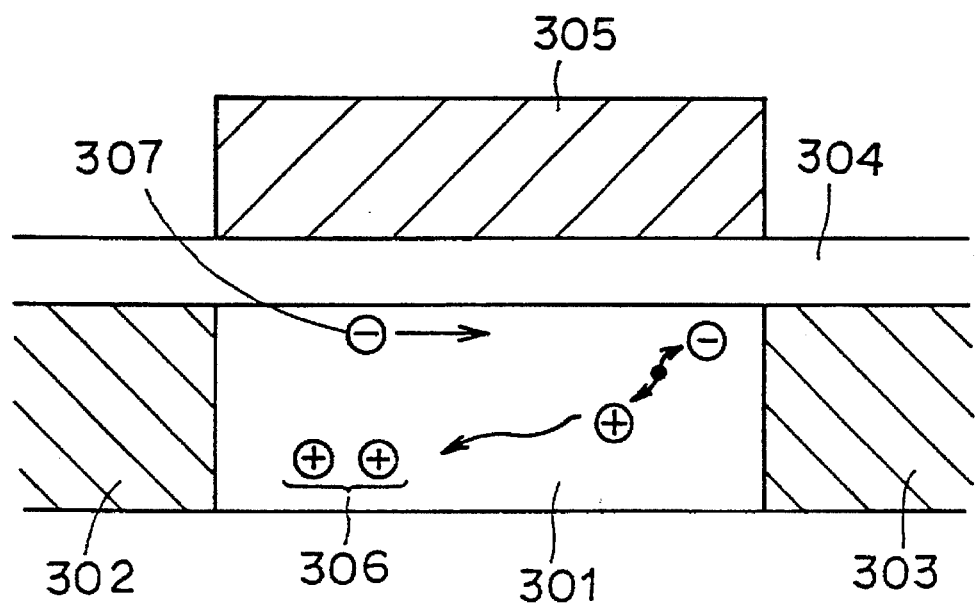
FIG. 87 shows a problem arising in the transistor of the conventional SOI structure.

Referring to FIG. 87, when a positive voltage is applied to a gate electrode 305, electrons 307 flow along the surface of a body 301 from a source 302 to a drain 303. At the vicinity of drain 303, where the electric field is strong, accelerated electrons impinge against the crystal lattice of silicon, so that electron/hole pairs generate, and in other words, a phenomenon referred to as "impact ionization" occurs. Although electrons thus generated are absorbed by drain 303, holes 306 are stored in body 301 to raise the potential of body 301. As the potential of body 301 rises, further electrons are implanted from source 302, so that the above phenomenon acts in the manner of positive feedback, and the drain current excessively flows. This problem is caused by the fact that body 301 is floating.

Embodiment 34 has been developed to overcome the above problem.

Figure 88:
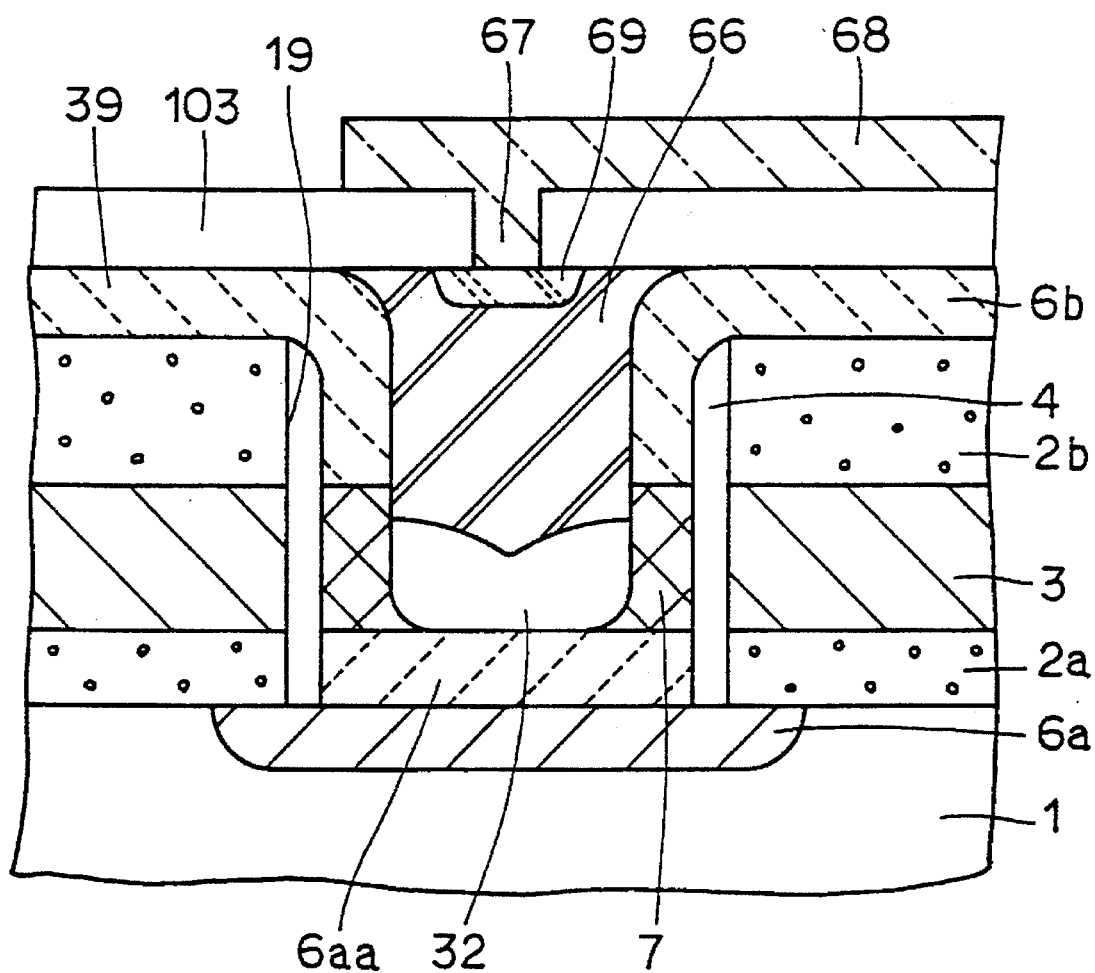
FIG. 88 is a cross section of a semiconductor device of an embodiment 34.

FIG. 88 is a cross section of VΦT of embodiment 34. Substrate 1 is provided at its main surface with first impurity diffusion layer 6a forming one of source/drain regions. First interlayer insulating film 2a is disposed on substrate 1. Gate electrode 3 is disposed on first interlayer insulating film 2a. Second interlayer insulating film 2b covering gate electrode 3 is disposed on first interlayer insulating film 2a. There is provided contact hole 19, which penetrates first interlayer insulating film 2a, gate electrode 3 and second interlayer insulating film 2b, and exposes a portion of the surface of first impurity diffusion layer 6a. Gate insulating film 4 covers the side wall of contact hole 19. The device is provided with a silicon thin film 39 which is contact with first impurity diffusion layer 6a. Silicon thin film 39 continuously covers the side wall of contact hole 19 with the gate insulating film therebetween and has a concave portion at contact hole portion 19. Silicon thin film 39 is divided into three regions, i.e., cylindrical channel region 7 surrounded by gate electrode 3 as well as source region 6aa and drain region 6b, which are located above and below channel region 7, respectively. A silicon oxide film 32 fills a portion of the concavity of silicon thin film 39 lower than the upper end of channel region 7. Body polysilicon 66 fills a portion of the concavity of silicon thin film 39 located above silicon oxide film 32. Body polysilicon 66 is in contact with channel region 7. By using body silicon 66 as a lead electrode, the potential of channel region 7 is fixed. Body polysilicon 66 is in contact with an aluminum electrode 68 via a body contact 67 disposed in a silicon oxide film 103. A P$^+$-layer 69 is formed at the surface of body polysilicon 66. Ohmic connection is made between aluminum electrode 68 and body polysilicon 66 via P$^+$-layer 69.

The device shown in FIG. 88 is manufactured as follows.

Figure 89:
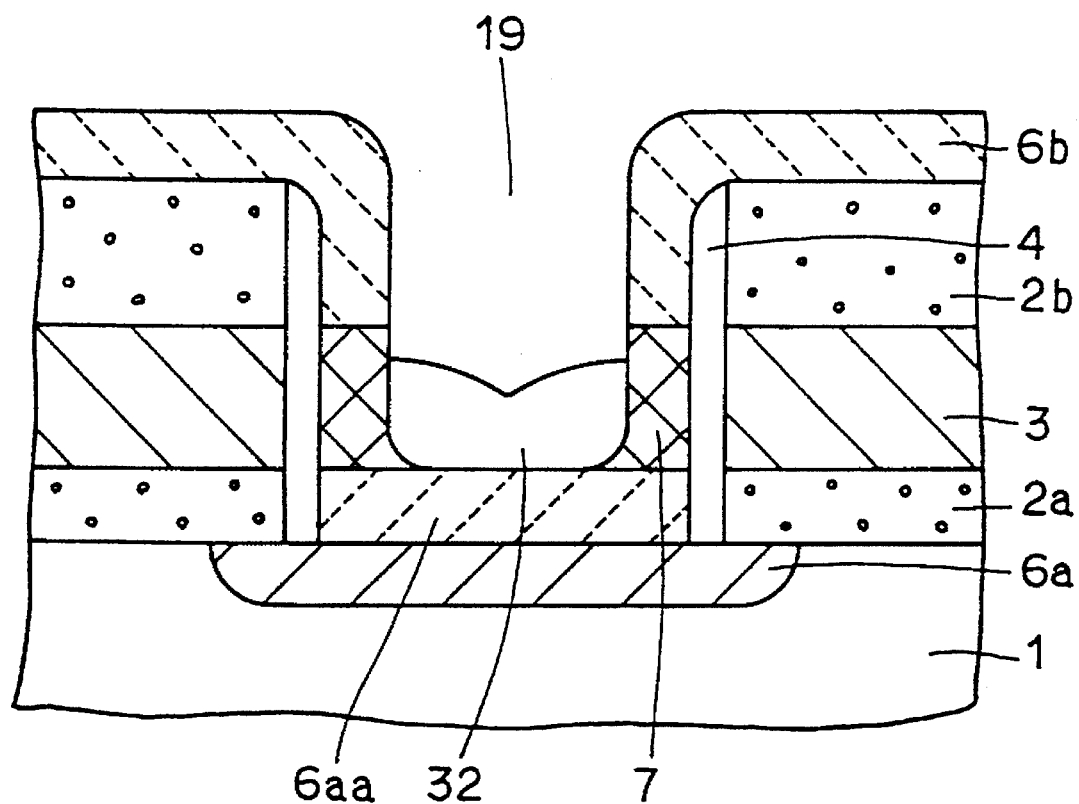
FIGS. 89 and 90 are cross sections of a semiconductor device at 1st and 2nd steps in a process of manufacturing the semiconductor device of an embodiment 34, respectively.
Figure 90:
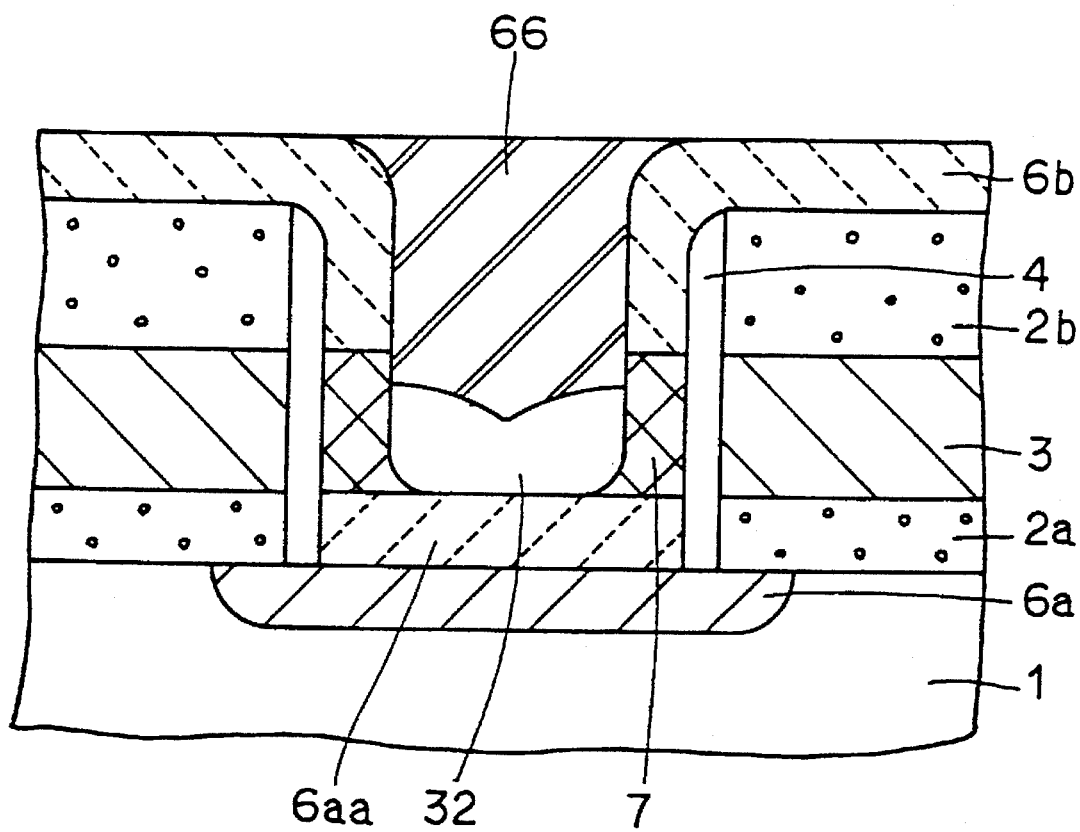

Referring to FIG. 89, the interior of contact portion 19 is filled with silicon oxide film 32, and the surface of silicon oxide film 32 is shaved off by etching to expose the top end of channel region 7. Referring to FIGS. 89 and 90, body polysilicon 66 to which P-type impurity is added is deposited on the entire surface by the LPCVD method. Body polysilicon 66 has at least such a film thickness that it completely fills contact hole 19. Body polysilicon 66 is etched to an extent that exposes drain region 6b. Thereby, body polysilicon 66 is correctly located in contact hole 19. Referring to FIG. 88 again, silicon oxide film 103 is deposited, and body contact 67 is opened. Arsenic is implanted into the opening to form P$^+$-layer 69 on the surface of body contact in a self-alignment manner. Aluminum electrode 68 is connected to P$^+$-layer 69.

The above embodiment has been described in connection with the structure in which aluminum electrode 68 is in contact with body polysilicon 66. However, the present invention is not restricted to this structure. Polysilicon may be used instead of aluminum.

From only FIG. 90, it seems difficult to detect an end point when etching body polysilicon 66. In practice, however, drain region 6b is patterned, and second interlayer insulating film 2b is exposed at almost entire region. Therefore, the end point can be determined when second interlayer insulating film 2b is exposed, and thus any practical problem does not arise.

Embodiment 35

Figure 91:
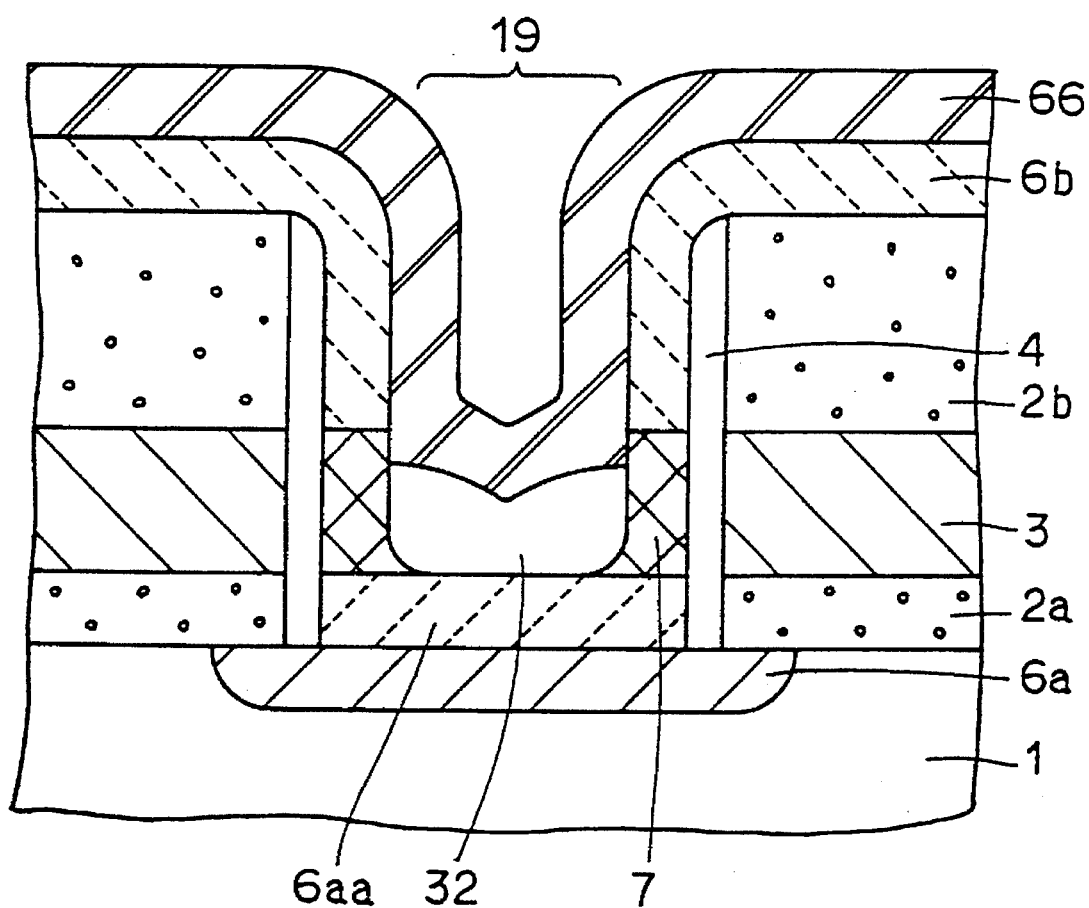
FIG. 91 is a cross section of a semiconductor device of an embodiment 35.

FIG. 91 is a cross section of VΦT of embodiment 35. This embodiment differs from embodiment 34 in that polysilicon 66 does not completely fill contact hole 19. Even this structure can fix the potential of channel region 7. In this embodiment, however, connection between the aluminum electrode and body polysilicon 66 cannot be made above the transistor, and thus connection of aluminum must be made at a position other than the transistor. In embodiment 34, deposited body polysilicon must be thick. Meanwhile, embodiment 35 has an advantage that it can be thin.

In embodiments 34 and 35 already described, the drain region is formed above the channel region, and the source region is formed under the channel region. However, they may be located in the opposite manner. If the drain is located at the upper side, a junction area between the drain and the body polysilicon increases, so that the leak current from the drain may increase and the voltage resistance of the drain may decrease. Accordingly, the source is preferably located at the upper side in the structure of the embodiment.

According to the embodiments 34 and 35, the body potential of channel region is fixed by the body polysilicon, so that it is possible to prevent latch, which may be caused by parasitic bipolar effect, and thus to suppress generation of an abnormal drain current.

Embodiment 36

In VΦT disclosed in Japanese Patent Application No. 5-345126, the diameter of cylindrical or columnar body of VΦT directly depends on the inner diameter of contact hole. Therefore, VΦT cannot have the body of a diameter smaller than the minimum hole diameter attainable by the lithography technique. If the diameter of body is large, the drain end has a large junction area, so that a large leak current flows in proportion to the junction area. If the body is thick, it is difficult to achieve complete depletion of the same, so that the drain current cannot be increased sufficiently.

This embodiment has been developed to overcome the above problem.

Figure 92:
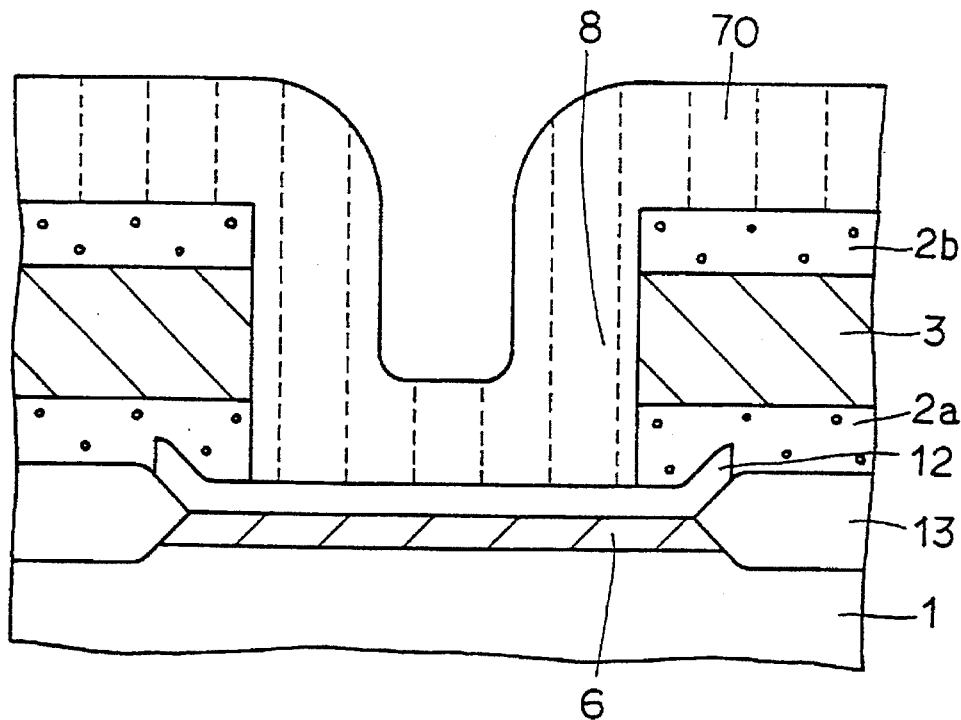
FIGS. 92 to 95 are cross sections of a semiconductor device at 1st to 4th steps in a process of manufacturing the semiconductor device of an embodiment 36, respectively.

Referring to FIG. 92, silicon nitride film 12 of 500 Å in thickness is deposited on n$^-$-type substrate 1. Silicon nitride film 12 is patterned into a predetermined configuration. Portions not covered with silicon nitride film 12 are oxidized to form isolating oxide film 13 at the main surface of substrate 1. Impurity is implanted into the main surface of substrate 1 through silicon nitride film 12 to form source/drain region 6. First interlayer insulating film 2a of 200 Å in thickness is formed on substrate 1 to cover silicon nitride film 12 and isolating oxide film 13. Polysilicon of 500 Å in thickness is deposited on first interlayer insulating film 2a and is patterned to form gate electrode 3. Second interlayer insulating film 2b of 2000 Å in thickness is deposited on substrate 1 to cover gate electrode 3. Contact hole 8, which penetrates first interlayer insulating film 2a, gate electrode 3 and second interlayer insulating film 2b, is formed for exposing surface 9a of silicon nitride film 12. Polysilicon 70 containing n-type impurity added thereto and having a thickness of 200 nm is deposited by the LP-CVD method.

Figure 93:
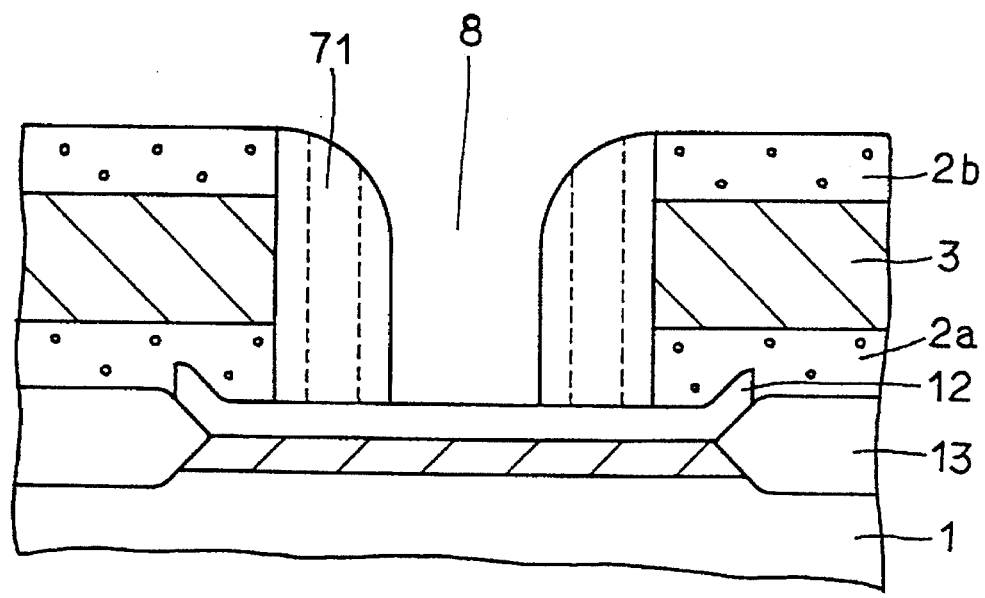

Referring to FIGS. 92 and 93, the entire surface of polysilicon 70 is etched by the anisotropic dry etching method, so that a side wall 71 of polysilicon having a thickness of 200 nm is formed on the inner wall of contact hole 8. Assuming that the inner diameter of contact hole 8 is 600 nm, a space remaining in the contact hole has the inner diameter of 200 nm.

Figure 94:
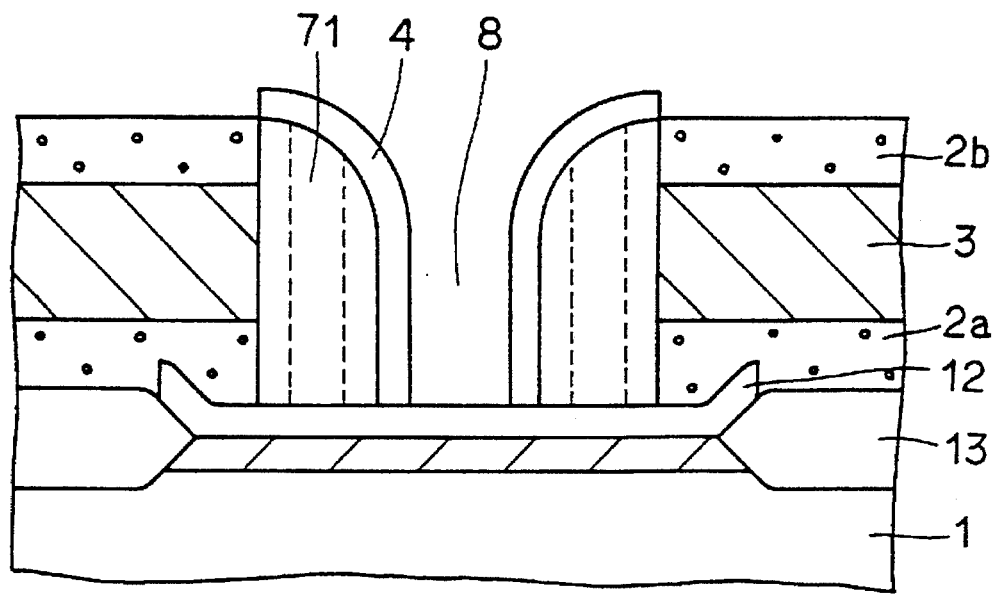
Figure 95:
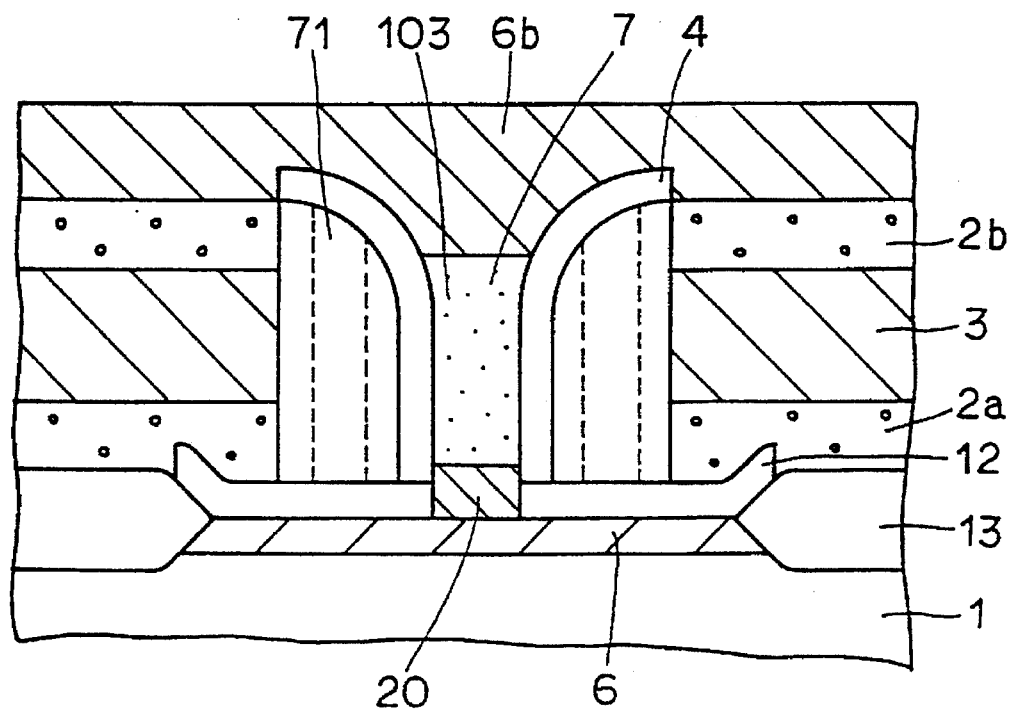

Referring to FIG. 94, the surface of side wall spacer 71 is oxidized by the thermal oxidation method at 800° C. to 1000° C., so that gate insulating film 4 made of a silicon oxide film is formed. At this step, the surface of silicon substrate 1 at the bottom of contact hole 8 is not covered with silicon nitride film 12, and thus is not oxidized. Referring to FIGS. 94 and 95, silicon nitride film 12 exposed at the bottom of contact hole is removed with phosphoric acid solution.

At this step, etching progresses also in the lateral direction. Therefore, excessive etching may remove silicon nitride film 12 located under side wall spacer 71, so that the side wall spacer 71 will be in contact with channel polysilicon which will be deposited in a later step. Therefore, it is important not to perform the excessive etching with phosphoric acid. If any problem may arise, it is preferable to employ the anisotropic dry etching. In this case, however, gate insulating film 4 is also etched, so that this etching must be performed under the conditions that the etching select ratio of silicon oxide film and silicon nitride film is large and damage is suppressed.

Referring to FIG. 95, silicon 103 which will form the body of transistor is deposited by the LP-CVD method to fill contact hole 8. Thereafter, silicon 103 is crystallized by solid-phase growth method (anneal at 600° C.). Thereafter, impurity is introduced into the surface of silicon to form drain region 6b. In the case of P-channel, P-type impurity such as boron is implanted with the implantation energy of 8 keV and concentration of $5 \times 10^{15}/cm^3$. The heat treatment is effected at 850° C. for 30 seconds, so that impurity diffuses from source region 6 into silicon 103, and also diffuses from drain region 6b into silicon 103. In this manner, VΦT is completed. In this embodiment, since side wall spacer 71 of polysilicon is formed at the inner wall of contact hole 8, the diameter of cylindrical or columnar channel 7 is smaller than the inner diameter of contact hole 8 by twice the sum of the thickness of side wall spacer 71 and the thickness of gate insulating film 4. Since side wall spacer 71 of polysilicon is in contact with gate electrode 3, it is side wall spacer 71 that functions as the gate of transistor, and no problem arises in connection with the operation.

Embodiment 37

Figure 96:
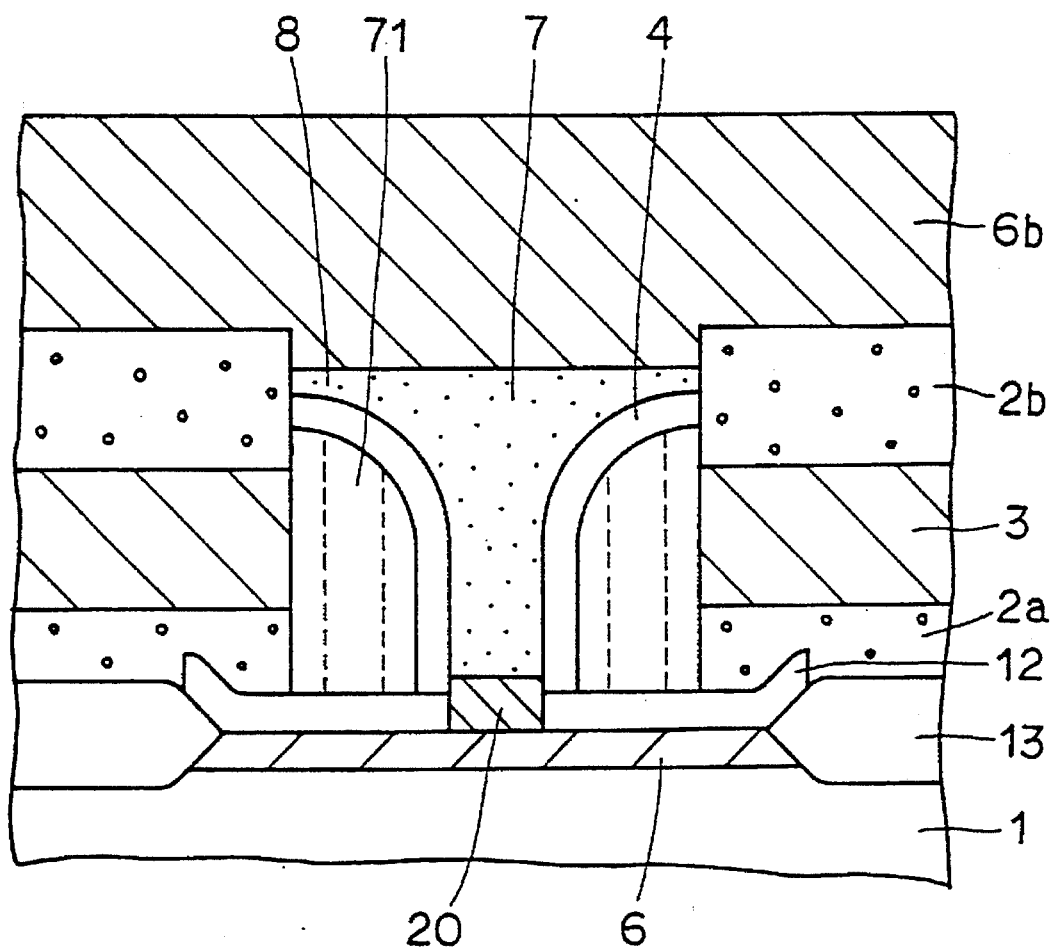
FIG. 96 is a cross section of a semiconductor device of an embodiment 37.

FIG. 96 is a cross section of VΦT of embodiment 37.

In VΦT shown in FIG. 95, side wall spacer 71 has an upper end at the same level as the upper surface of second interlayer insulating film 2b. In this structure, drain portion 6b and the gate (side wall spacer 71) overlap each other through a large area, so that capacitance increases and thus such problems may arise that the operation speed of circuit decreases and that the leak current induced by the drain voltage increases. This embodiment has been developed to over come these problems.

Referring to FIG. 96, the upper end of side wall spacer 71, i.e., second gate is positioned at the level lower than the upper surface of second interlayer insulating film 2b. This structure eliminates the overlapping of drain portion 6b and gate (side wall spacer 71), so that the above problems are overcome. However, the junction area of drain 6b and channel 7 directly depends on the inner diameter of contact hole 8 and thus increases as described previously.

Embodiments 36 and 37 have been described in connection with the examples in which the upper portion forms the drain and the lower portion forms the source. However, the opposite relationship may be employed. Particularly, embodiment 37 may employ the drain located at the lower position, in which case the junction area of the drain end can be small and thus the leak current can be reduced. If this structure employs thick silicon nitride film 12, an electrostatic capacitance of drain 6b and gate (71) can be small. Since the thickness of silicon nitride film 12 must be at least twice the thickness of the silicon oxide film which is gate insulating film 4, because the dielectric constant of silicon nitride film is twice as large as that of silicon oxide film (capacitance=dielectric constant/film thickness).

In this embodiment, since the side wall spacer of silicon is formed at the inner wall of contact hole and is used as the gate electrode, the diameter of the channel portion of body can be small. As a result, the leak current can be reduced, and the drain current in the on-state can be large.

Embodiment 38

This embodiment relates to a 2-input OR circuit using VΦT.

Figure 97:
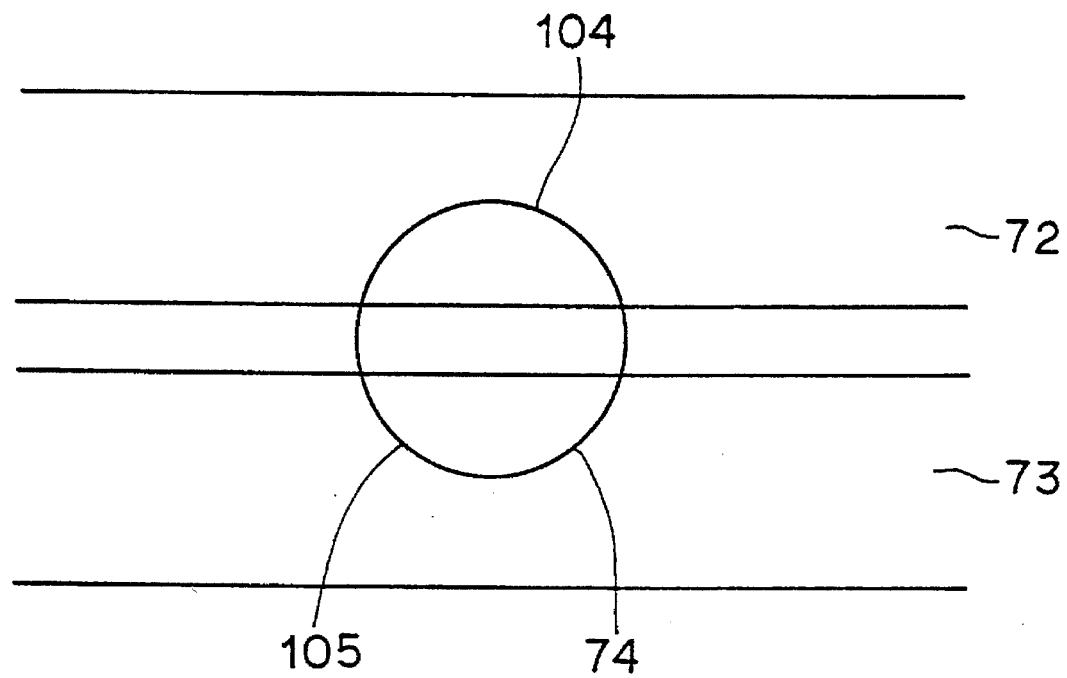
FIG. 97 is a plan of a 2-input OR circuit using VΦTs of an embodiment 38.
Figure 98:
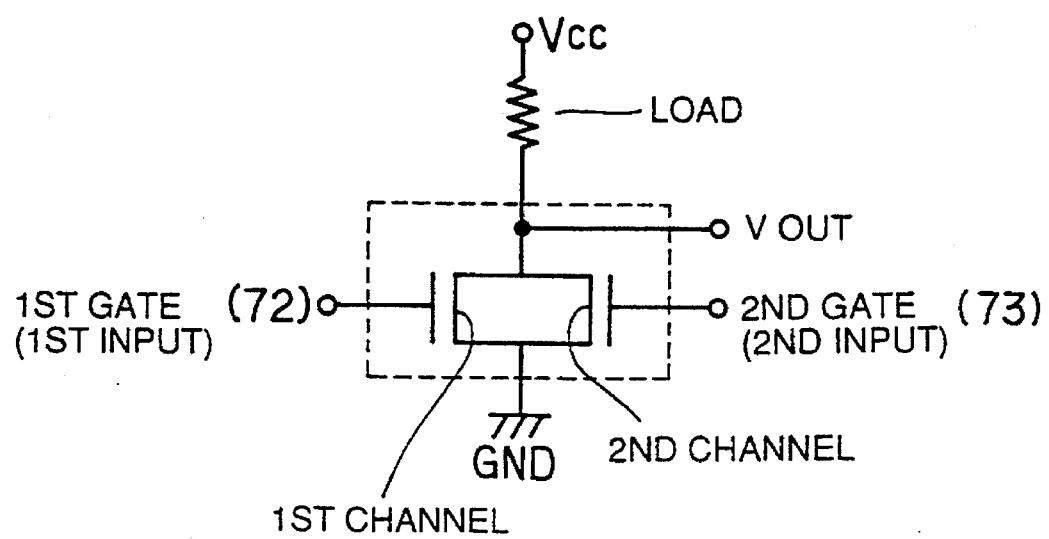
FIG. 98 is a circuit diagram of the semiconductor device shown in FIG. 97.

Referring to FIG. 97, if a contact hole of VΦT is formed over two gates, i.e., first and second gates 72 and 73, a circuit surrounded by dotted line in FIG. 98 can be formed within a very small area. As shown in FIG. 98, by adding a load such as a resistance to this circuit, the 2-input OR circuit can be completed easily. This OR circuit is remarkably affected by a mask. For example, if a contact hole 97 of VΦT shifts upward in FIG. 97, a first channel 104 becomes wide, and a second channel 105 becomes narrow. If it shifts oppositely, first channel 104 becomes narrow, and second channel 105 becomes wide.

In FIG. 98, an amount of shift or displacement of the mask can be electrically determined by comparison between values of current which flow between $V_{CC}$ and GND when only first gate 72 is turned on and when only second gate 73 is turned on. If the circuit is used for detecting the shift of mask, the load is not required in FIG. 98. If the contact hole of VΦT has another shape, the channel width changes in a different manner in accordance with the change of shift, so that the sensitivity can be changed.

Figure 99:
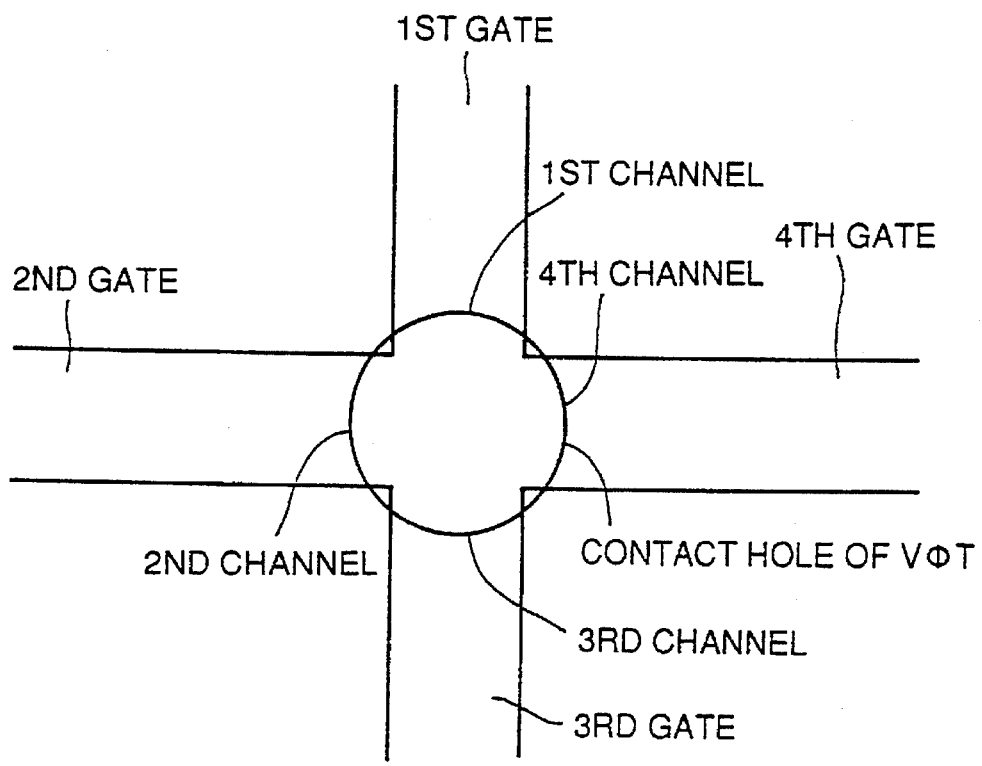
FIG. 99 is a plan of another semiconductor device of embodiment 38.
Figure 100:
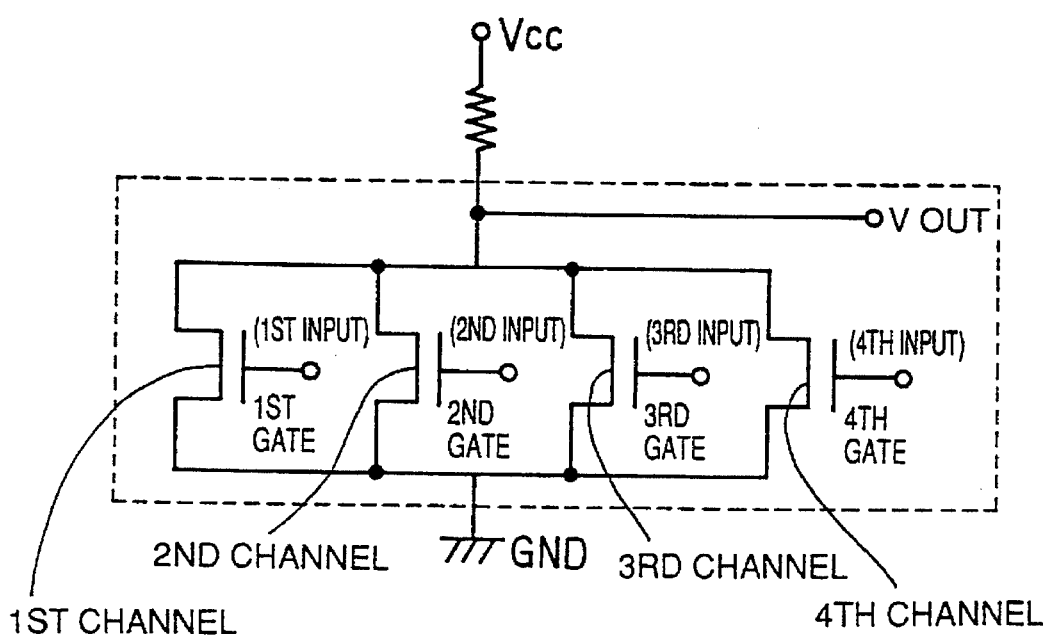
FIG. 100 is a circuit diagram of a semiconductor device shown in FIG. 99.

Similarly to the above embodiment, the contact hole of VΦT is disposed at the crossing of gates which are patterned into a cross shape as shown in FIG. 99. Thereby, a 4-input OR circuit is completed as shown in FIG. 100. The contact hole of VΦT may have another shape to form an OR circuit having more inputs.

Embodiment 39

This embodiment relates to formation of a 2-input AND circuit using VΦT.

Figure 101:
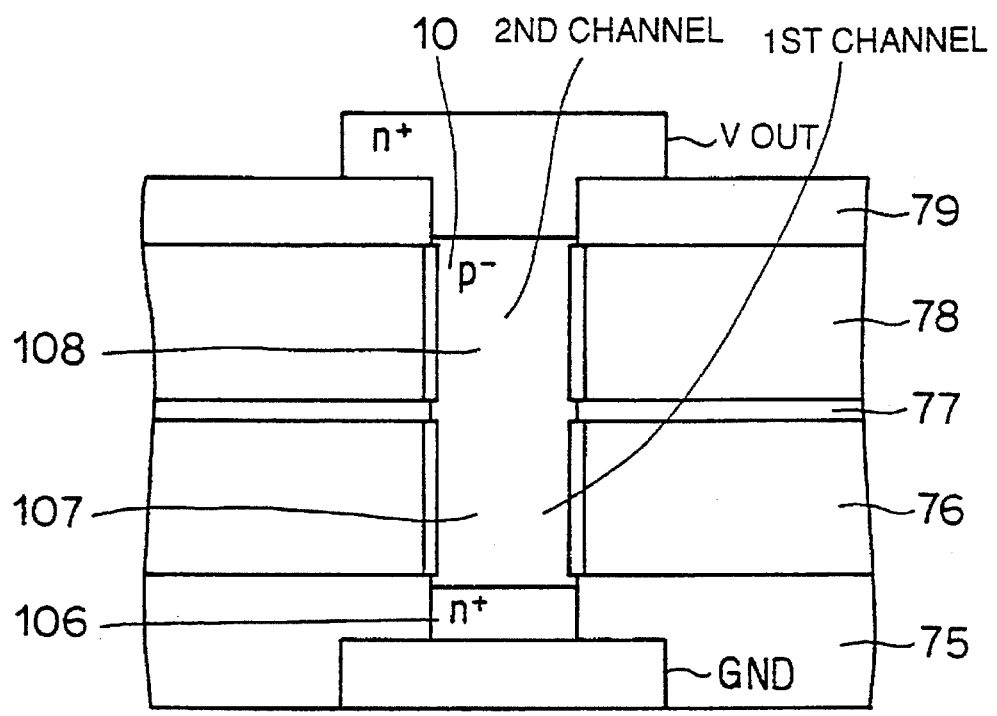
FIG. 101 is a cross section of a semiconductor device of an embodiment 39.

FIG. 101 is a cross section of an AND circuit using VΦT of embodiment 39. There is provided a first $SiO_2$ film 75 covering GND. A first gate 76 is disposed on first $SiO_2$ film 75. A second $SiO_2$ film 77 covering first gate 76 is disposed on first $SiO_2$ film 75. A second gate electrode 78 is disposed on second $SiO_2$ film 77. A third $SiO_2$ film 79 covering second gate electrode 78 is disposed on second $SiO_2$ film 77. Contact hole 10, which penetrates third $SiO_2$ film 79, second gate electrode 78, second $SiO_2$ film 77, first gate electrode 76 and first $SiO_2$ film 75, is provided for exposing the surface of GND. An $N^+$-semiconductor layer 106, an $N^-$-semiconductor layer 107 and an $N^+$-semiconductor layer 108 are formed successively in contact hole 10. A $p^-$-semiconductor layer surrounded by first gate electrode 76 is a first channel, and a $p^-$-semiconductor layer surrounded by second gate electrode 78 is a second channel.

Figure 103:
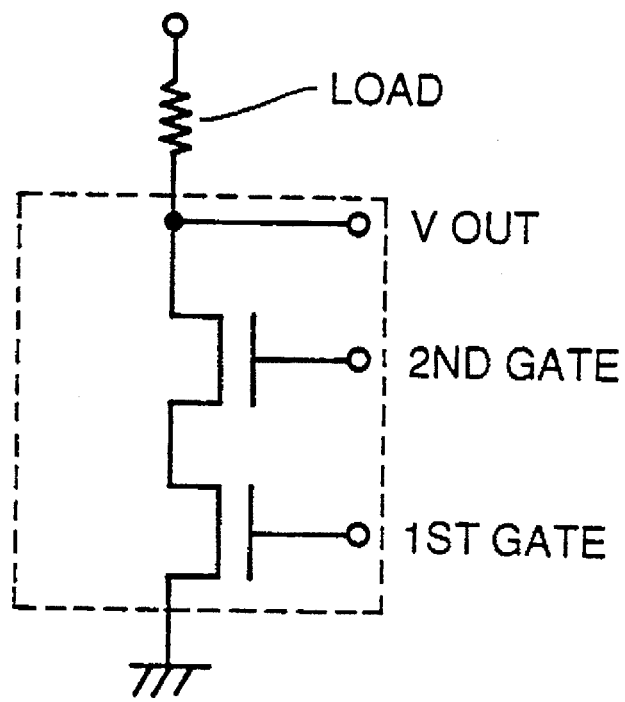
FIG. 103 is a circuit diagram of an AND circuit shown in FIG. 101.

By providing the contact hole of VΦT penetrating two gates 76 and 78 as described above, the 2-input AND circuit is formed as shown in FIG. 103. An additional gate(s) which the contact hole of VΦT penetrates may be overlaid, so that the number of inputs can be increased.

Figure 102:
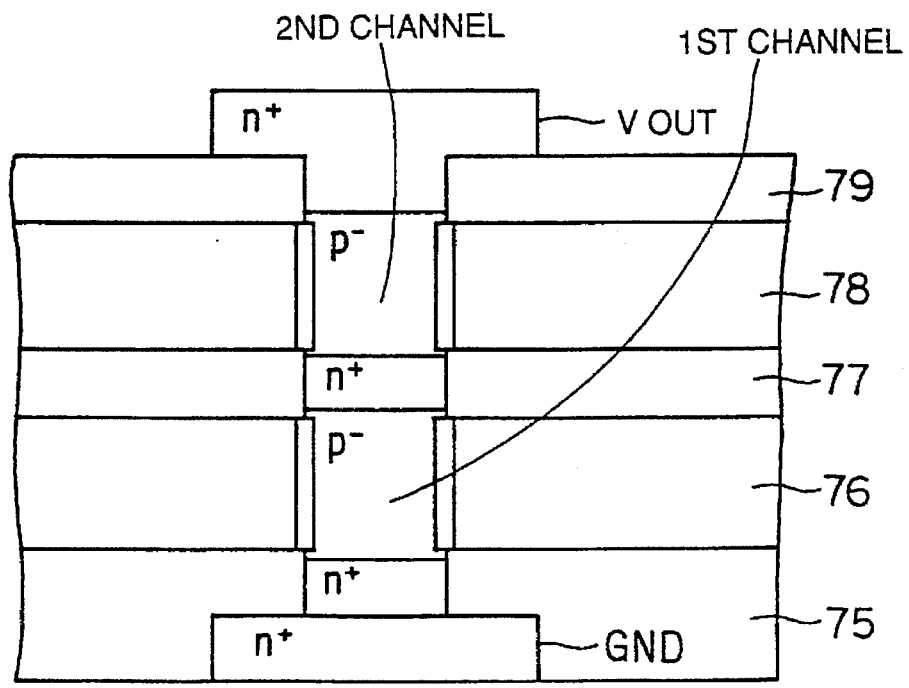
FIG. 102 is a cross section of another semiconductor device of embodiment 39.

If the interlayer film (second $SiO_2$ film 77) between two gates is thin as shown in FIG. 101, it is not necessary to introduce impurity of the same conductivity type as the source/drain into a portion between channels of VΦTs with a high concentration. If second $SiO_2$ film 77 is thick as shown in FIG. 102, it is necessary to introduce impurity of the same conductivity type as the source/drain into the portion between two channels. The impurity may be introduced by ion implantation or epitaxial growth.

Figure 104:
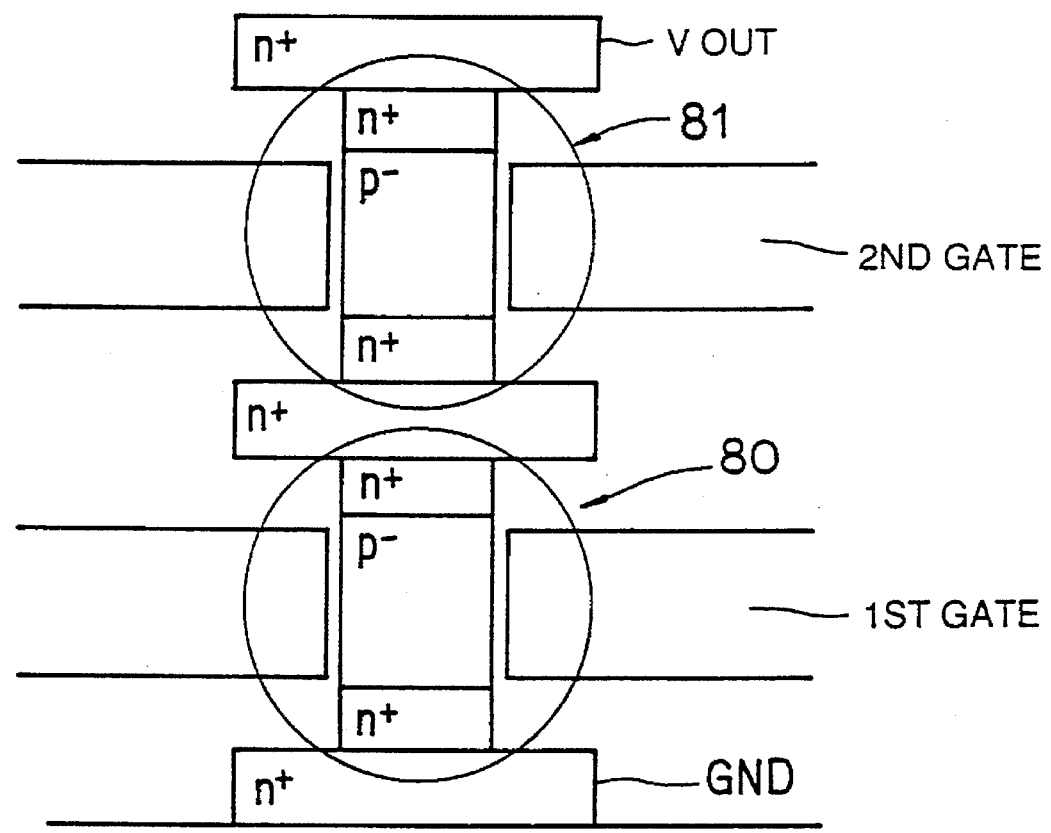
FIG. 104 is a cross section of still another semiconductor device of embodiment 39.

As shown in FIG. 104, a second VΦT 81 may be formed on a first VΦT 80.

In the circuits in embodiments 38 and 39, P-type and N-type may be replaced with each other.

Embodiment 40

Figure 105:
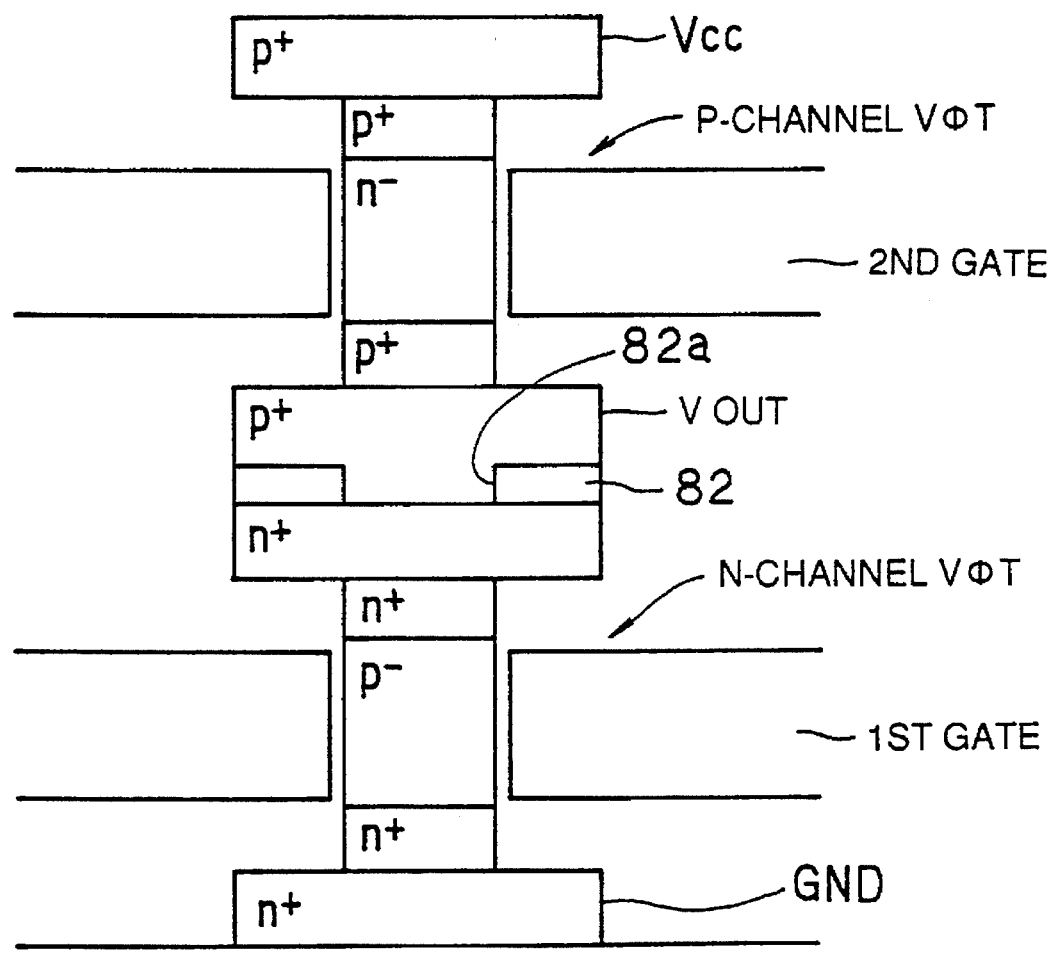
FIG. 105 is a cross section of a semiconductor device of an embodiment 40.

FIG. 105 is a cross section of a semiconductor device of embodiment 40, in which a VΦT of P-channel and a VΦT of N-channel are vertically aligned to form an inverter circuit. In order to eliminate P-N junction formed between these VΦT, silicide 82 is interposed between them.

In order to monocrystallize the channel of P-channel VΦT, an opening 82a is formed at a portion of silicide 82. However, if it is not necessary to monocrystallize the channel of P-channel VΦT, it is not necessary to provide opening 82a at silicide 82.

Embodiment 41

Figure 106:
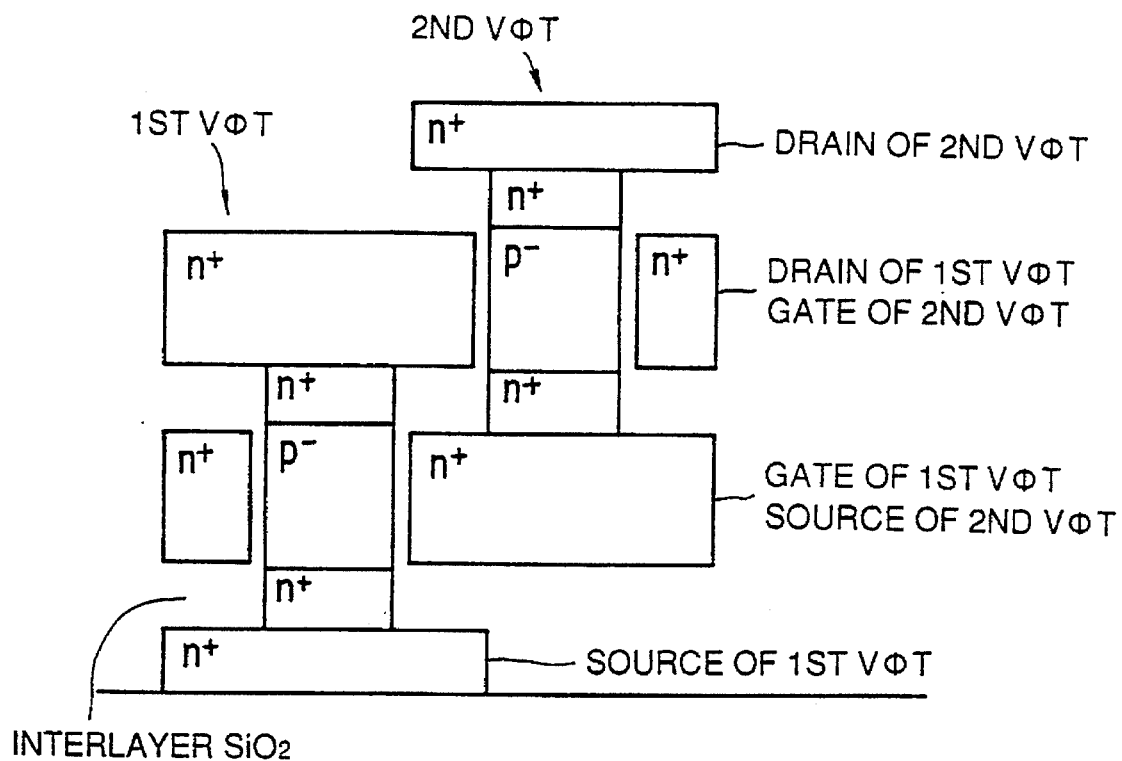
FIG. 106 is a cross section of a semiconductor device of an embodiment 41.
Figure 107:
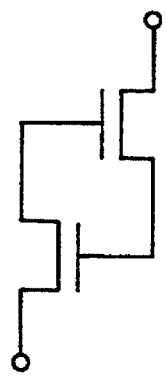
FIG. 107 is a circuit diagram of the semiconductor device of embodiment 41.
Figure 108:
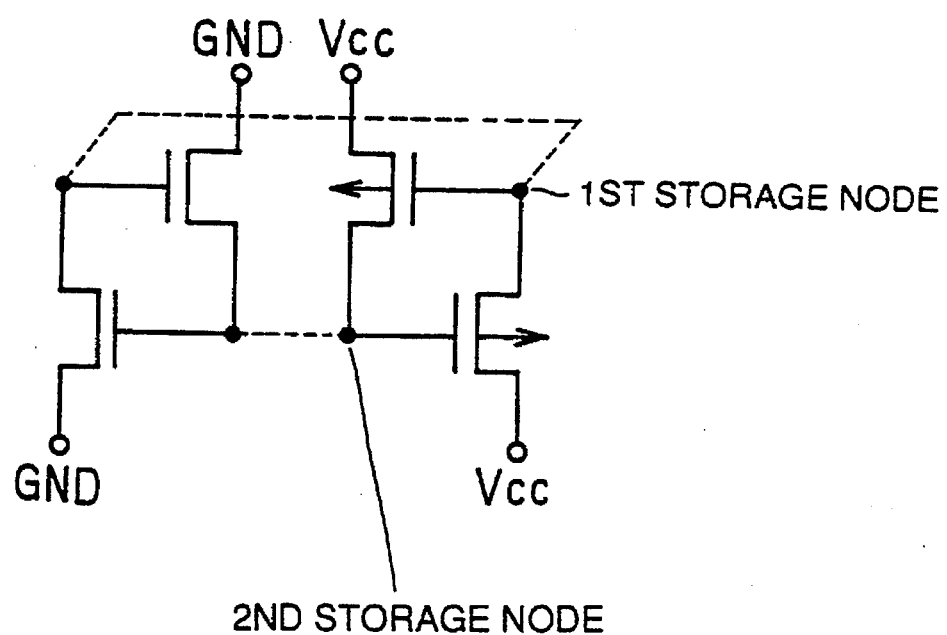
FIG. 108 is a circuit diagram of a flip-flop circuit of embodiment 41.

FIG. 106 is a cross section of a semiconductor device of embodiment 41. Referring to FIG. 106, two VΦT has such a structure that a gate of a first VΦT is commonly used as a source of a second VΦT, and that a drain of the first VΦT is commonly used as a gate of the second VΦT. Thereby, a circuit shown in FIG. 107 is completed. A flip-flop can be formed, if the above structure is formed of a P-channel VΦTs and an N-channel VΦTs in this manner and is connected as shown in FIG. 108.

In FIG. 106, the gate of first VΦT must be made of monocrystal in order to provide the channel of second VΦT made of monocrystal. The gate of first VΦT made of monocrystal is laminated to the $SiO_2$ film from the layer on the source of first VΦT, so that the gate of first VΦT made of monocrystal is obtained.

Embodiment 42

This embodiment relates to a gain cell using VΦT.

Figure 109:
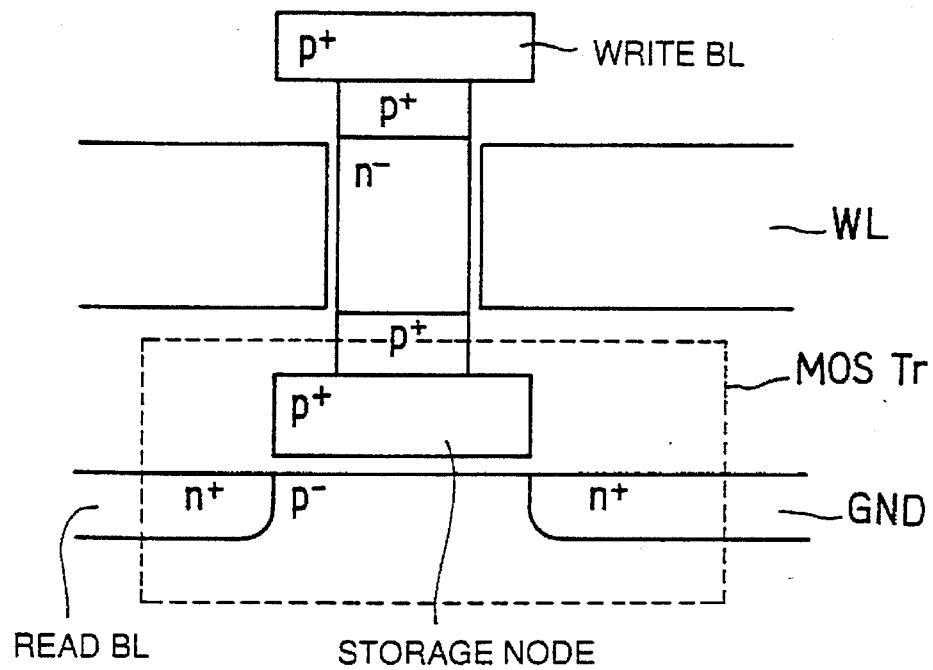
FIG. 109 is a cross section of a gain cell of an embodiment 42.
Figure 110:
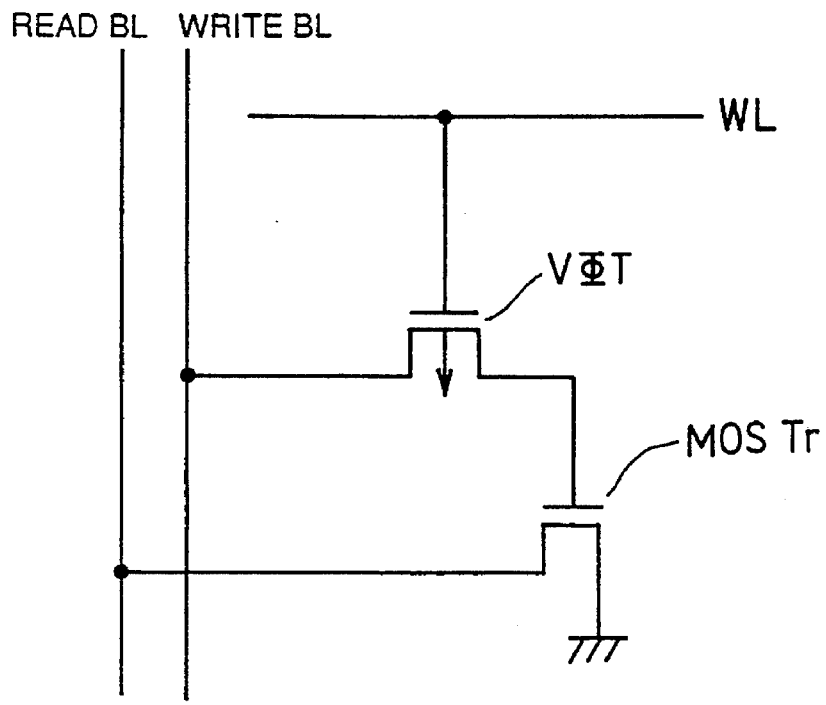
FIG. 110 is a circuit diagram of a circuit using the gain cell of embodiment 42.

Referring to FIG. 109, a VΦT is formed on a gate electrode of an MOS transistor of bulk, so that a circuit shown in FIG. 110 is formed to complete a gain cell, in which electric charges stored in the storage node can be amplified for reading out. The write operation is performed with the word line and the write bit line similarly to a DRAM.

Figure 111:
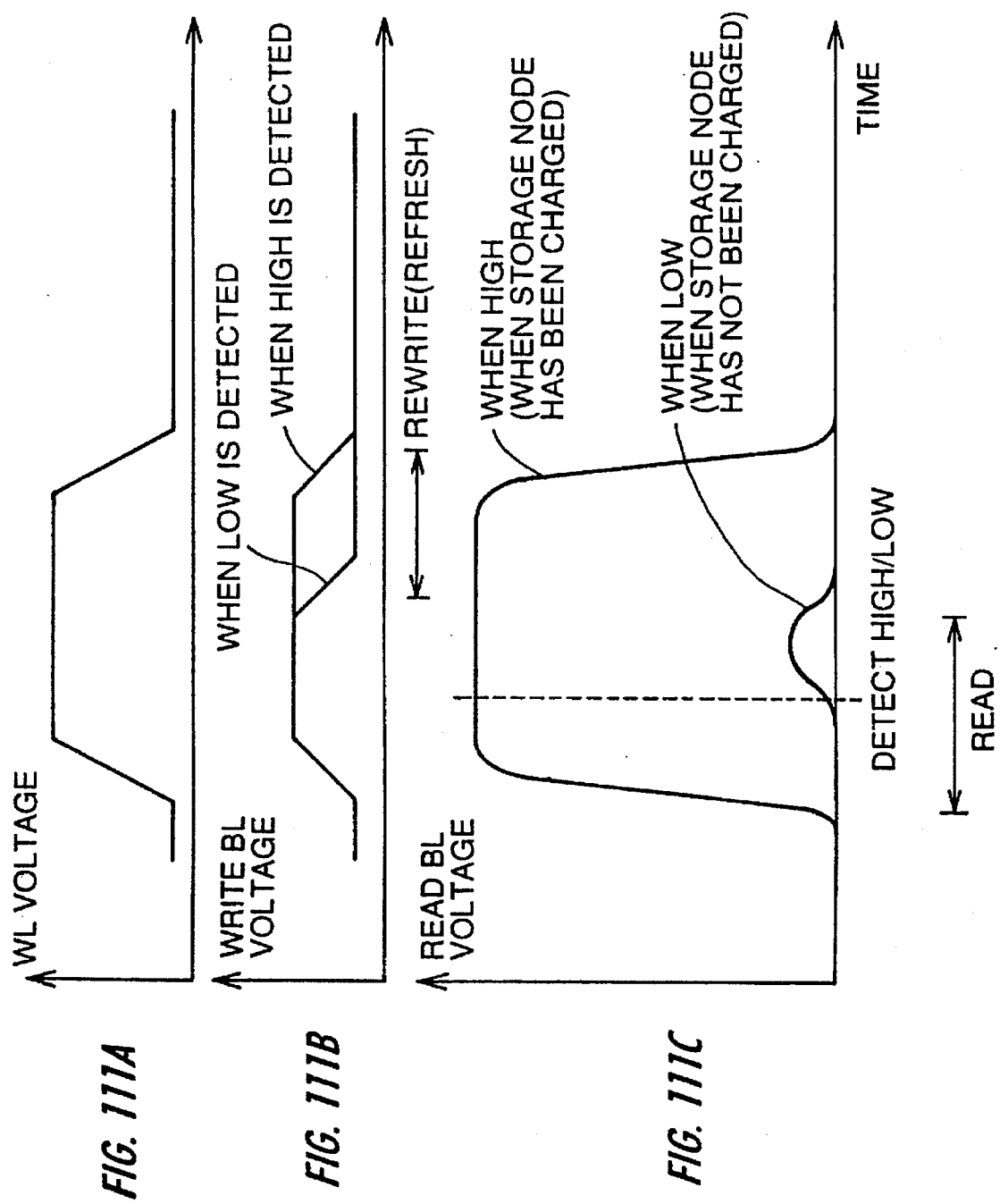
FIG. 111 shows the operation of the semiconductor device of embodiment 42.

When electric charges stored in the storage node are to be read out, a word line voltage and a write bit line voltage are changed as shown in FIG. 111. If the storage node has been charged, the MOS transistor is immediately turned on, and a current immediately flows to the read bit line. However, if the storage node has not stored electric charges, it is necessary to supply electric charges enough for turning on the MOS transistor from the write bit line, so that the current does not immediately flow through the read bit line. The threshold voltage $V_{th}$ of MOS transistor is set at a high value in order to prevent flow of leak current through the MOS transistor when the cell is not accessed. In the MOS transistor, the current is significantly amplified and changed even if the quantity of electric charges in gate changes slightly, so that the detection sensitivity to the quantity of gate electric charges is very high.

When the electric charges in gate are detected, the write bit line voltage is changed for performing the rewrite operation.

Similarly to the DRAM, the gain cell must periodically repeat the read operation for refreshing data because the leak current of VΦT causes leak of charges from the storage node. This circuit operation may be performed by a circuit shown in FIG. 101 or other structures equivalent to the same.

The MOS transistor may use an SOI transistor.

Figure 112:
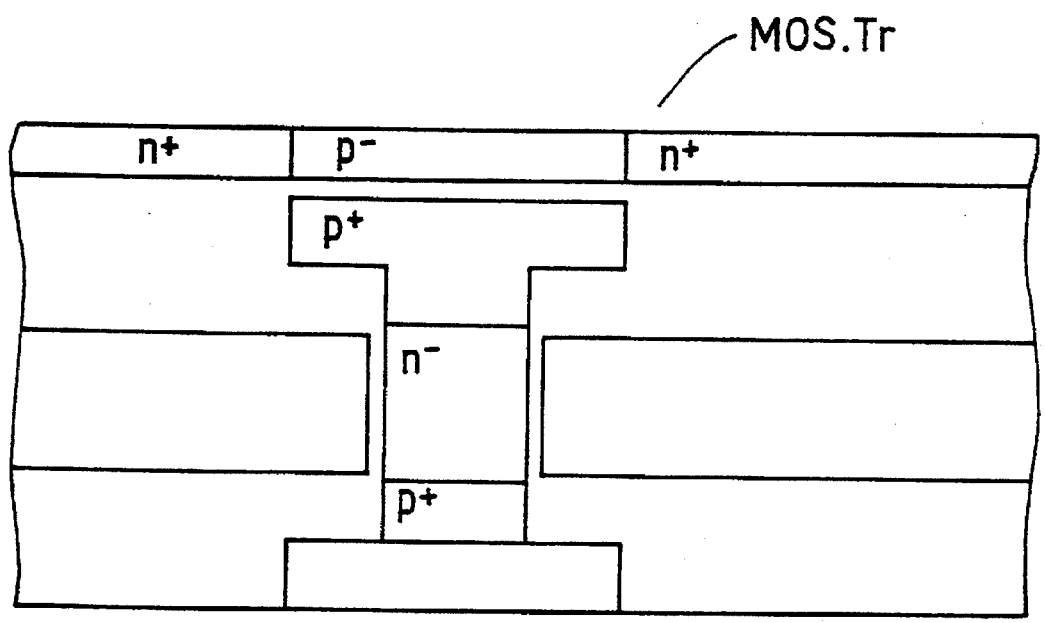
FIG. 112 is a cross section of another semiconductor device of embodiment 40.

As shown in FIG. 112, a structure, which is upside-down with respect to that in FIG. 109, may be employed.

In the device shown in FIG. 109, since the contact of VΦT is located above the doped polysilicon of MOS transistor, the channel of VΦT cannot be monocrystallized by epitaxial growth. In the device shown in FIG. 112, however, the channel of VΦT can be monocrystallized by epitaxial growth. In this case, the MOS transistor at the upper position may be a polysilicon TFT.

Embodiment 43

Figure 113:
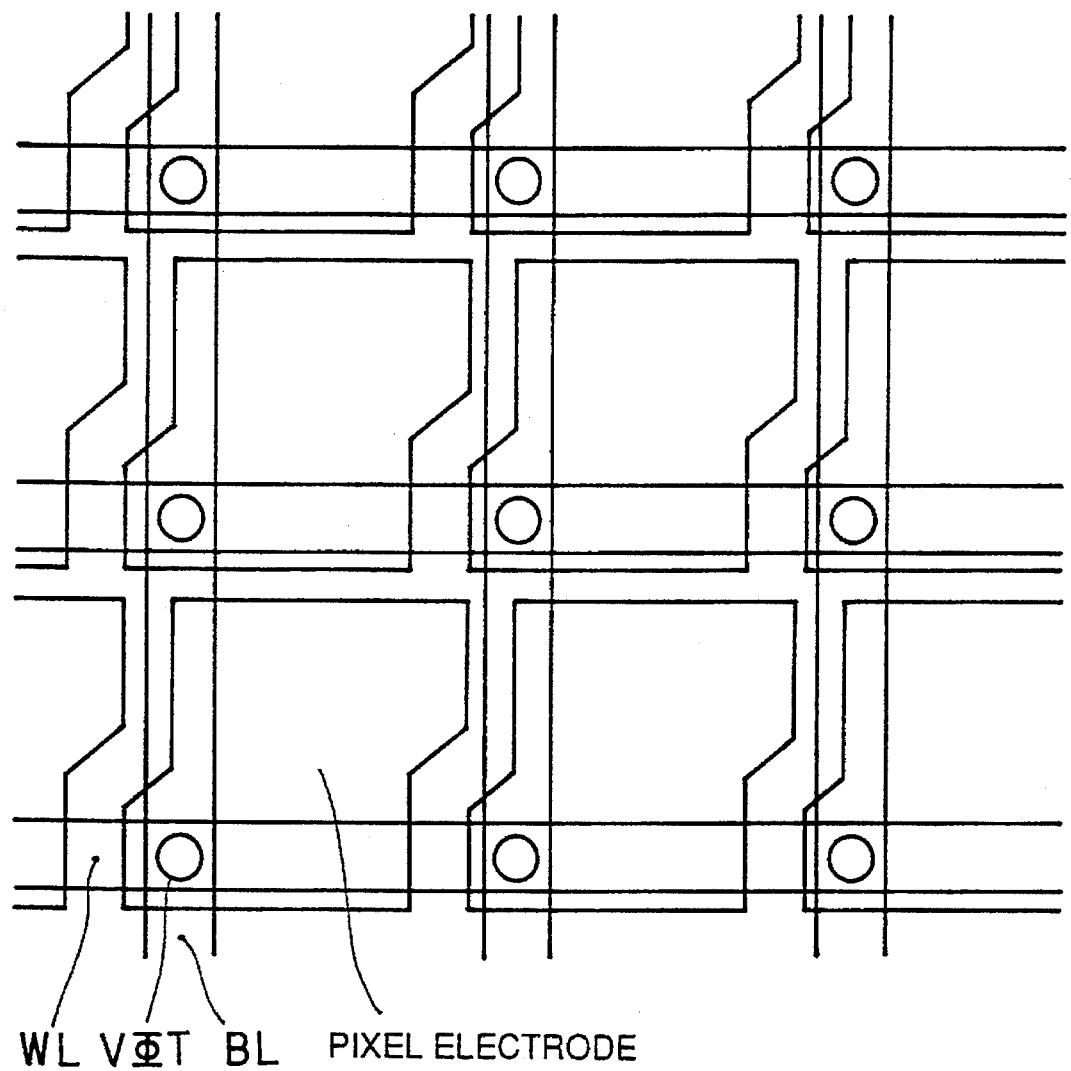
FIG. 113 is a plan of a matrix of a liquid crystal display of an embodiment 43.
Figure 114B:
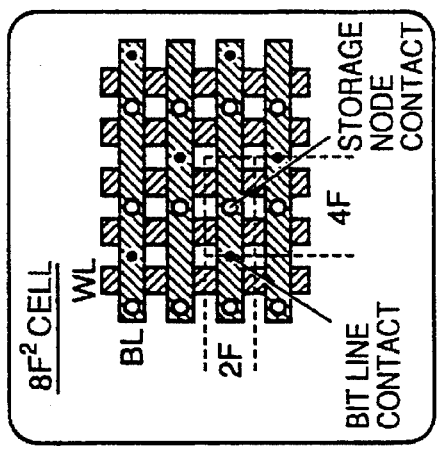
FIG. 114 shows trend of DRAM cell sizes.
Figure 114C:
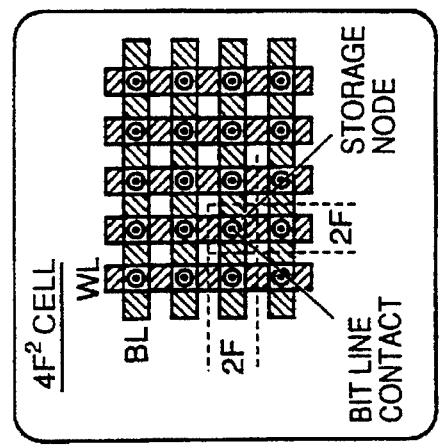
Figure 114A:
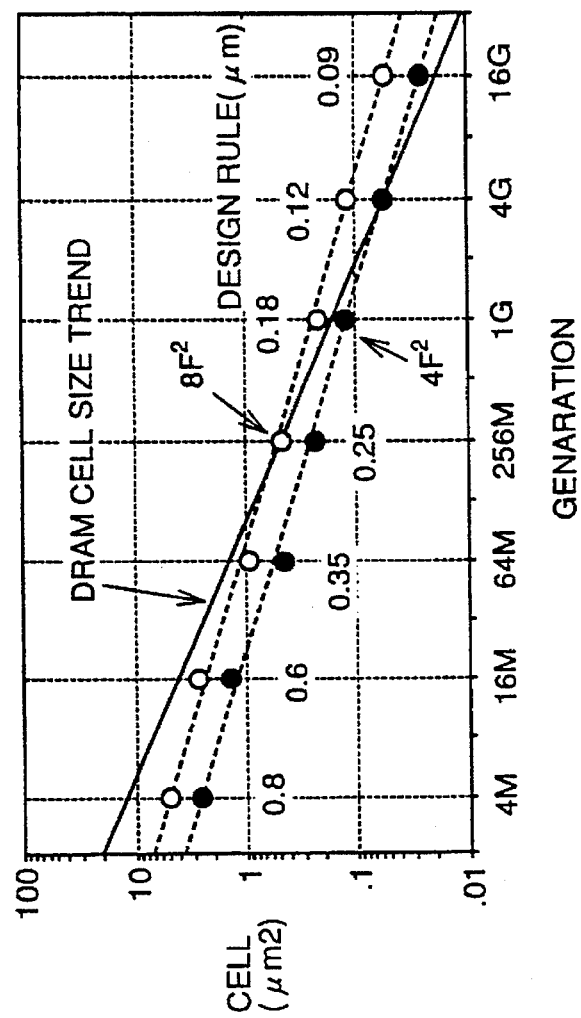
Figure 115:
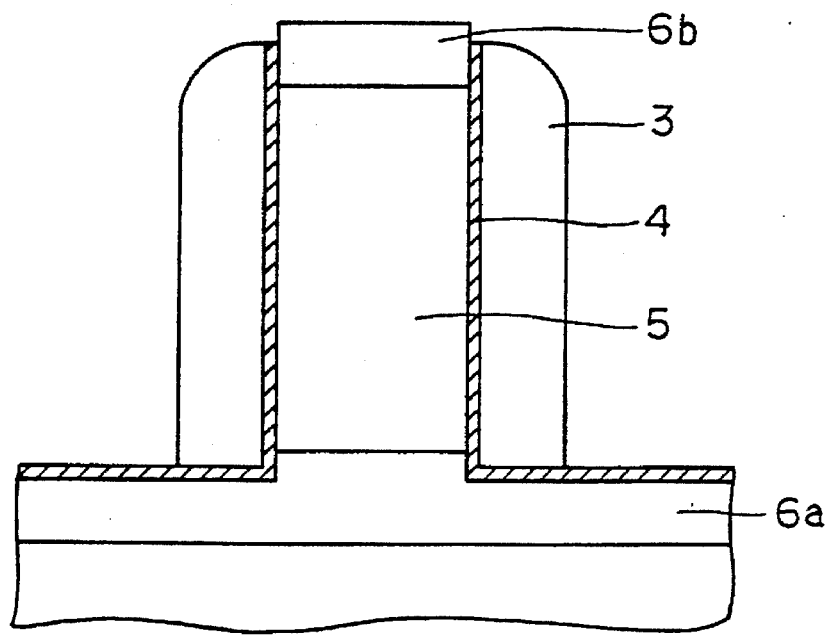
FIG. 115 is a cross section of a vertical surround gate transistor in the prior art.
Figure 116:
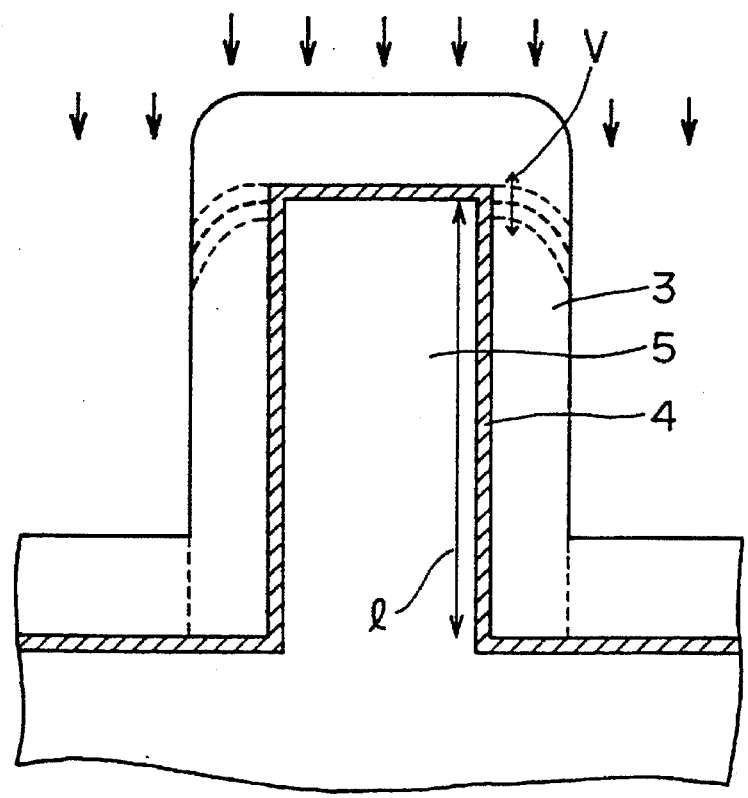
FIG. 116 is a cross section showing a process of manufacturing a semiconductor device shown in FIG. 115.
Figure 117:
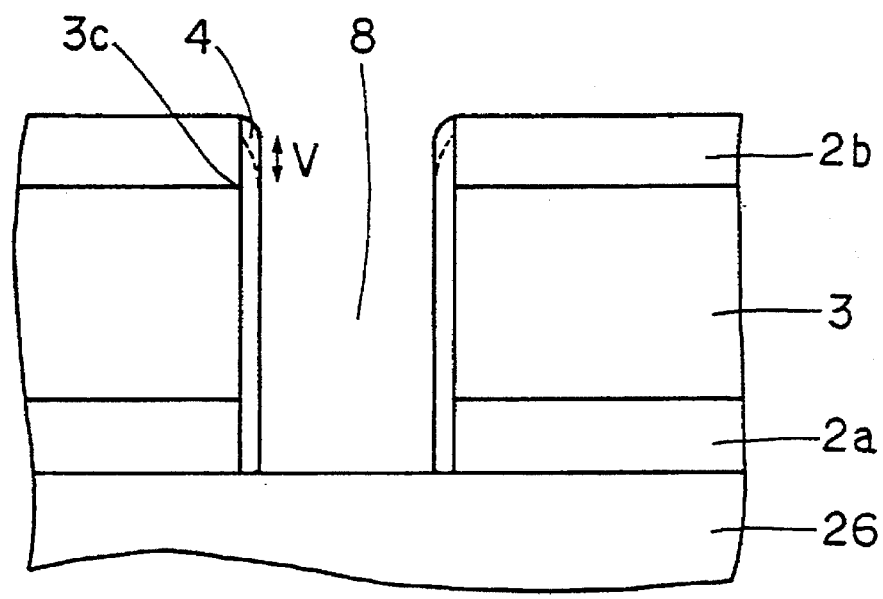
FIGS. 117 and 118 are cross sections of a semiconductor device at 1st and 2nd steps in a process of manufacturing the vertical surround gate transistor in the prior art, respectively.
Figure 118:
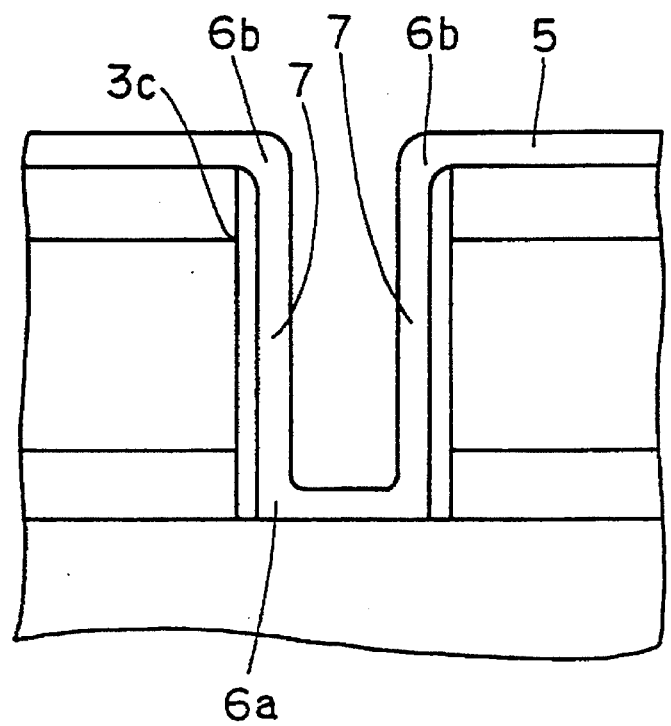
Figure 119:
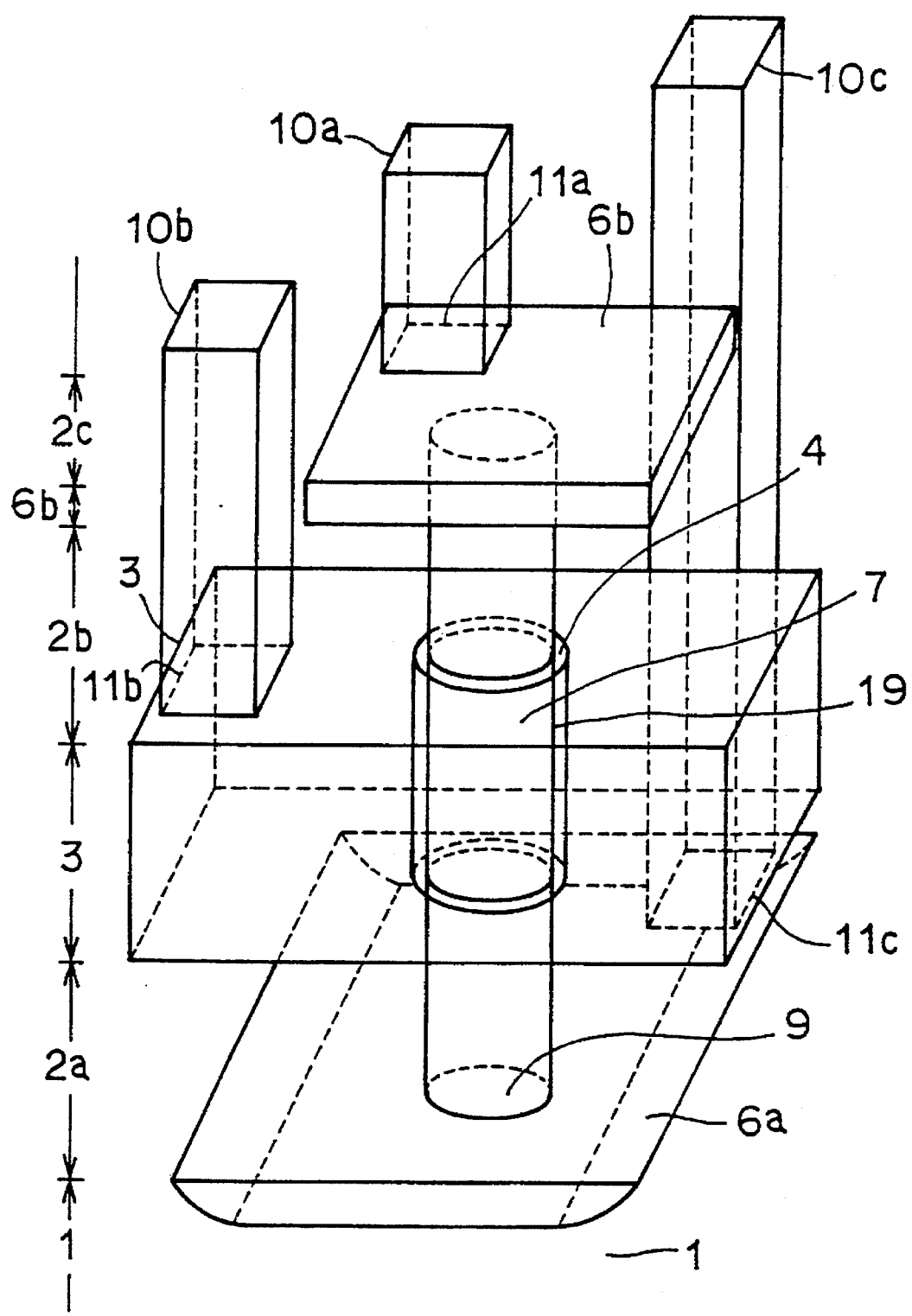
FIG. 119 is a perspective view of a vertical Φ-shaped transistor already proposed by the inventors.
Figure 120:
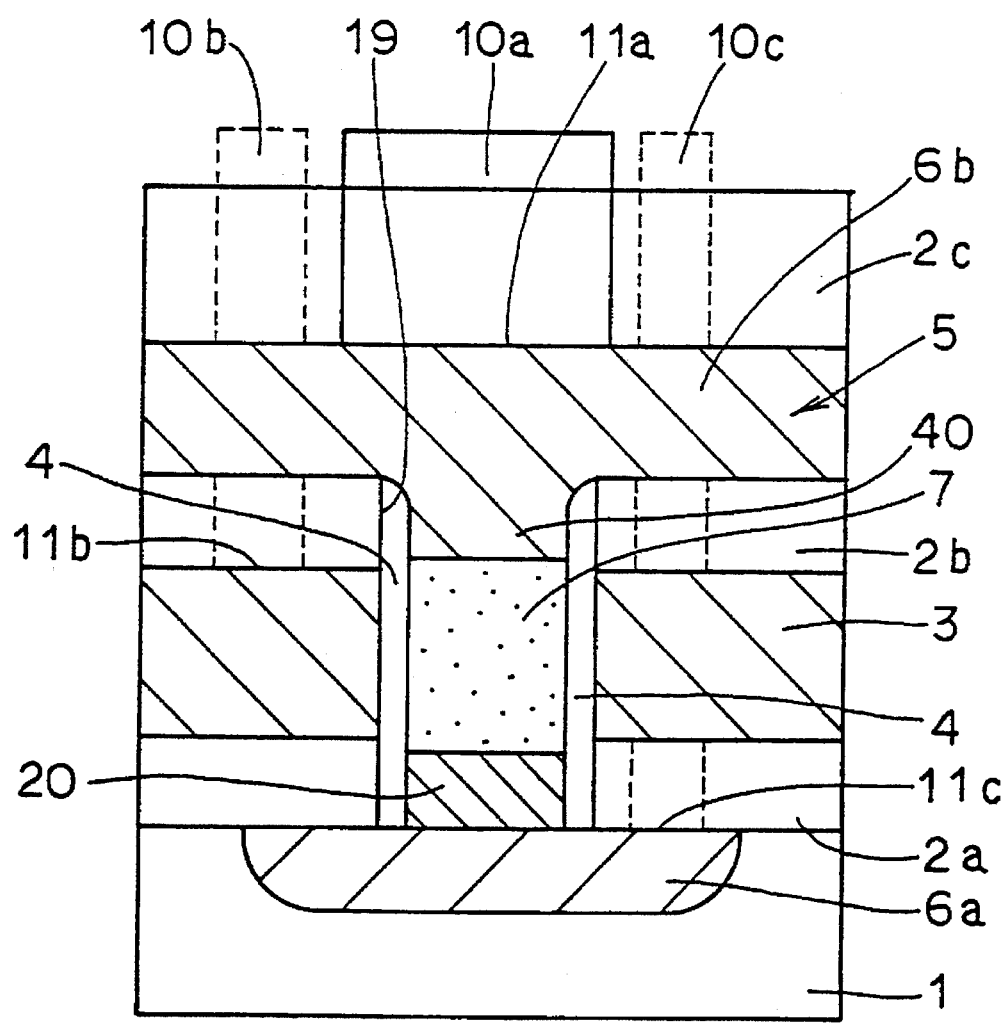
FIG. 120 is a cross section of a semiconductor device shown in FIG. 119.

FIG. 113 conceptively shows a device of embodiment 43. As shown in FIG. 113, VΦTs may be applied to matrix of a liquid crystal display.

More specifically, the storage node portions in the DRAM cell array shown in FIG. 3 are replaced with pixel electrodes, whereby the structure shown in FIG. 113 is obtained.

According to the semiconductor device of the first aspect of the invention, since the semiconductor layer formed on the dielectric layer is used as the bit line, the dynamic random access memory can have the bit lines of a small capacitance and can operate at a high speed.

According to the semiconductor device of the second aspect of the invention, since the dummy VΦT is used, the contact of the aluminum interconnection can be made easily.

According to the semiconductor device of the third aspect of the invention, since the bit line is commonly used by the upper and lower VΦTs, the bit lines can be formed only by one step. This reduces the number of steps and thus can reduce the cost.

According to the semiconductor device of the fourth aspect of the invention, there is provided the polysilicon which fills the concave portion of the silicon thin film and is in contact with the channel portion, and this polysilicon is used as the lead electrode. Therefore, the potential of channel portion can be fixed.

According to the semiconductor device of the fifth aspect of the invention, since there is provide the conductive member covering the side wall of contact hole, it is possible to manufacture the VΦT having the body of which diameter is smaller than the minimum hole diameter attainable by the lithography technique. Consequently, the body can be depleted completely.

According to the semiconductor device including the OR circuit of the sixth aspect of the invention, since the contact hole of VΦT is formed over two gates, the circuit can be formed in a very small area.

According to the semiconductor device including the AND circuit of the seventh aspect of the invention, since the AND circuit is formed of the VΦT, the occupied area can be small.

According to the semiconductor device including the inverter of the eighth aspect of the invention, since the VΦT is used, the occupied area can be small.

According to the semiconductor device including the flip-flop circuit of the ninth aspect of the invention, since the VΦT is used, the occupied area can be small.

According to the semiconductor device including the gain cell of the tenth aspect of the invention, since the VΦT is used, the occupied area can be small.

According to the semiconductor device including the matrix of the liquid crystal display of the eleventh aspect of the invention, since the VΦT is used, the occupied area can be small.

According to the method of manufacturing the semiconductor device of the twelfth aspect of the, invention since the semiconductor layer formed on the dielectric member is used as the bit line, the capacitance of the bit line can be small.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a substrate on which a buried dielectric layer and a semiconductor layer are formed successively;
   a first impurity diffusion layer of a first conductivity type in said semiconductor layer forming a source/drain region and a bit line;
   a first interlayer insulating film disposed on said substrate covering said first impurity diffusion layer;
   a gate electrode, having upper and lower surfaces, disposed on said first interlayer insulating film and forming a word line;
   a second interlayer insulating film disposed on said first interlayer insulating film and covering said gate electrode;
   a contact hole penetrating said first interlayer insulating film, said gate electrode and said second interlayer insulating film exposing but not extending below a portion of a surface of said first impurity diffusion layer;
   a gate insulating film covering a side wall of said contact hole;
   a first semiconductor column of the first conductivity type formed in said contact hole and in contact with said first impurity diffusion layer, thereby serving as one of said source/drain regions;
   a channel semiconductor column of the second conductivity type disposed in said contact hole in contact with said first semiconductor layer;
   a second semiconductor column of the first conductivity type disposed on said channel semiconductor column in contact with a source/drain region and a storage node;
   a capacitor insulating film disposed on said second semiconductor layer; and
   a cell plate electrode disposed on said storage node with said capacitor insulating film therebetween.

2. The semiconductor device according to claim 1, wherein said semiconductor layer is made of a silicon layer.

3. The semiconductor device according to claim 1, wherein said semiconductor layer is made of a polysilicon layer.

4. The semiconductor device according to claim 2, wherein an upper surface of said bit line is partially silicided, and said first semiconductor column, said channel semiconductor column and said second conductive column are made of monocrystal.

5. A semiconductor device comprising:
   a substrate;
   a dielectric layer on the substrate;
   a first semiconductor layer on the dielectric layer and forming a bit line;
   a first interlayer insulating film on said substrate covering said first semiconductor layer;
   a gate electrode on said first interlayer insulating film forming a word line;
   a second interlayer insulating film on said first interlayer insulating film covering said gate electrode;
   a contact hole penetrating said first interlayer insulating film, said gate electrode and said second interlayer insulating film exposing but not extending below a surface of said first semiconductor layer;
   a gate insulating film covering a sidewall of said contact hole;
   a second semiconductor layer of the first conductivity type formed in said contact hole in contact with said bit line, said second semiconductor layer forming a first source/drain region;
   a channel semiconductor layer of the second conductivity type in said contact hole in contact with second semiconductor layer;
   a third semiconductor layer of the first conductivity type on said channel semiconductor layer forming a second source/drain region and a storage node of a capacitor;
   a capacitor insulating film on said third semiconductor layer; and
   a cell plate electrode on said capacitor insulating film.

6. A DRAM semiconductor device comprising:
   a substrate;
   a dielectric layer on the substrate;

first and second vertical surround transistors on, and electrically insulated from each other, by said dielectric layer, wherein:

each vertical surround transistor comprises:
- a first source/drain region of a first conductivity type on a bit line;
- a channel semiconductor column of a second conductivity type extending in a vertical direction on the first source/drain region;
- a gate electrode around the channel semiconductor column with an insulating layer therebetween;
- a second source/drain region of the first conductivity type on the channel region, wherein the second source/drain region serves as a storage node of a capacitor; and the semiconductor device comprises:
- the bit line on the dielectric layer;
- a capacitor insulating film over each of the second source/drain regions; and
- a cell plate on the capacitor insulating film.

7. The DRAM semiconductor device according to claim 6, wherein: each of the first and second vertical surround transistors is formed on first and second bit lines, respectively; the first and second bit lines are formed on the dielectric layer; and the first bit line is separated from the second bit line by an insulating region.

8. The DRAM semiconductor device according to claim 7, wherein the insulating region comprises a field oxide region.

* * * * *